United States Patent
Tanaka et al.

(10) Patent No.: US 7,459,406 B2
(45) Date of Patent: Dec. 2, 2008

(54) LASER PROCESSING UNIT, LASER PROCESSING METHOD, AND METHOD FOR MANUFACTURING SEMICONDUCTOR DEVICE

(75) Inventors: Koichiro Tanaka, Kanagawa (JP); Yoshiaki Yamamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 472 days.

(21) Appl. No.: 11/212,927

(22) Filed: Aug. 29, 2005

(65) Prior Publication Data

US 2006/0079040 A1  Apr. 13, 2006

(30) Foreign Application Priority Data

Sep. 10, 2004  (JP) .............................. 2004-253925

(51) Int. Cl.
H01L 21/26 (2006.01)
H01L 21/42 (2006.01)
H01L 21/324 (2006.01)
H01L 21/477 (2006.01)

(52) U.S. Cl. .................. 438/795; 438/796; 438/797; 257/527; 257/616

(58) Field of Classification Search .................. 438/795, 438/796, 797, 798, 799; 257/527, 616, 627, 257/628
See application file for complete search history.

(56) References Cited

U.S. PATENT DOCUMENTS

| | | | |
|---|---|---|---|
| 5,854,803 A | 12/1998 | Yamazaki et al. | |
| 5,932,302 A | 8/1999 | Yamazaki et al. | |
| 6,171,674 B1 | 1/2001 | Yamazaki et al. | |
| 6,183,816 B1 | 2/2001 | Yamazaki et al. | |
| 6,210,996 B1 | 4/2001 | Yamazaki et al. | |
| 6,242,291 B1 | 6/2001 | Kusumoto et al. | |
| 6,468,617 B1 | 10/2002 | Yamazaki et al. | |
| 6,468,842 B2 | 10/2002 | Yamazaki et al. | |
| 6,528,359 B2 | 3/2003 | Kusumoto et al. | |
| 6,706,570 B2 | 3/2004 | Yamazaki et al. | |
| 6,784,030 B2 | 8/2004 | Yamazaki et al. | |
| 6,835,523 B1 | 12/2004 | Yamazaki et al. | |
| 6,882,012 B2 * | 4/2005 | Yamazaki et al. | 257/359 |
| 7,196,400 B2 * | 3/2007 | Yamazaki et al. | 257/627 |
| 7,271,042 B2 | 9/2007 | Kusumoto et al. | |

(Continued)

FOREIGN PATENT DOCUMENTS

| | | |
|---|---|---|
| JP | 8-30968 | 2/1996 |
| JP | 08-195357 | 7/1996 |
| JP | 10-172911 | 6/1998 |
| JP | 2001-15435 | 1/2001 |

*Primary Examiner*—Phuc T Dang
(74) *Attorney, Agent, or Firm*—Fish & Richardson P.C.

(57) ABSTRACT

Objects of the present invention is to reduce a number of scanning a linear laser, to shorten the amount of time for laser annealing, and to reduce a manufacturing process, a manufacturing time, and manufacturing cost of a semiconductor device. In this invention, a gas at high temperature is locally blown so as to overlap at an irradiation surface of linear laser light. The linear laser light can be obtained by injecting laser light radiated from a laser oscillator into a lens. The gas at high temperature can be obtained by heating a gas which is compressed using a gas compressor, by a nozzle type heater. The heated has is sprayed so as to overlap with the irradiation surface of the linear laser light.

15 Claims, 29 Drawing Sheets

U.S. PATENT DOCUMENTS

| | | |
|---|---|---|
| 7,351,646 B2 | 4/2008 | Kusumoto et al. |
| 2001/0019861 A1 | 9/2001 | Yamazaki et al. |
| 2003/0003610 A1 | 1/2003 | Yamazaki et al. |
| 2003/0203518 A1 | 10/2003 | Yamazaki et al. |
| 2005/0023255 A1 | 2/2005 | Yamazaki et al. |
| 2005/0089648 A1 | 4/2005 | Yamazaki et al. |

* cited by examiner

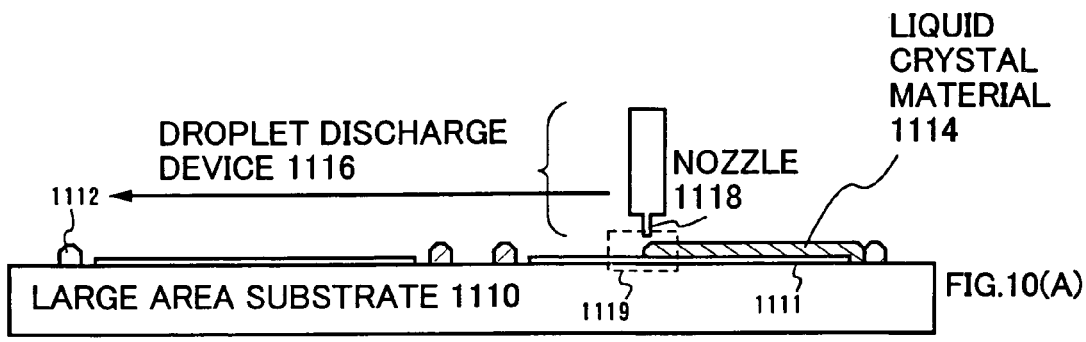
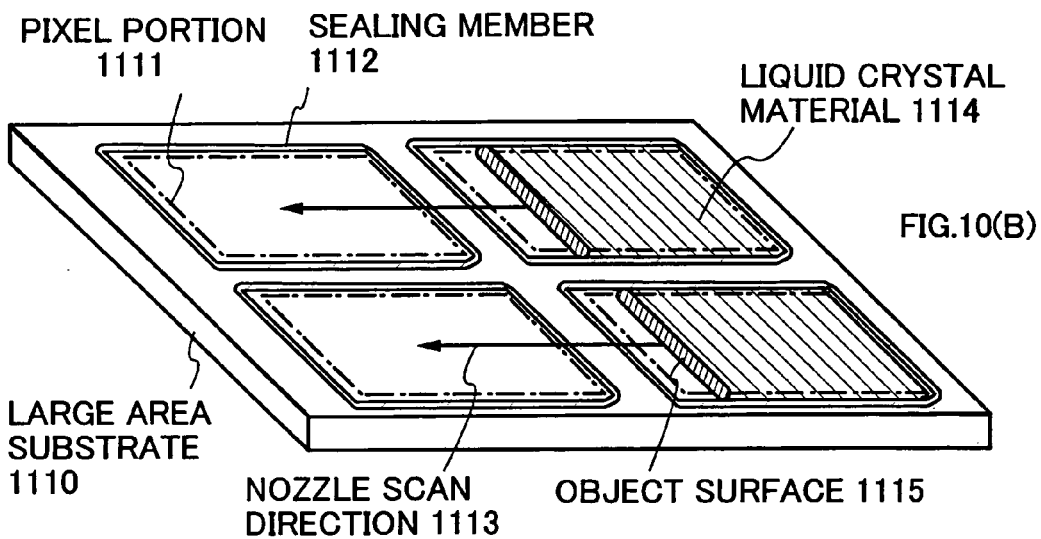
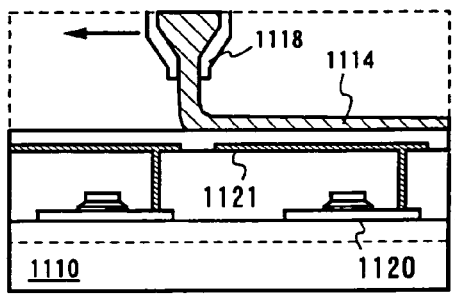
FIG.10(C) CASE OF CONTINUOUS DISCHARGE
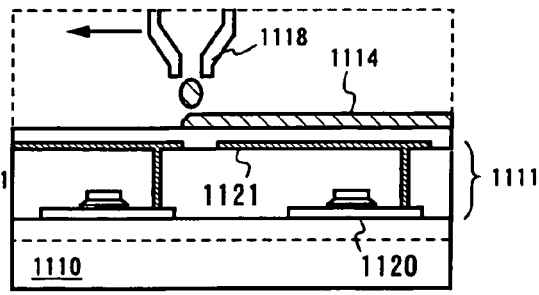
FIG.10(D) CASE OF DOT DISCHARGE

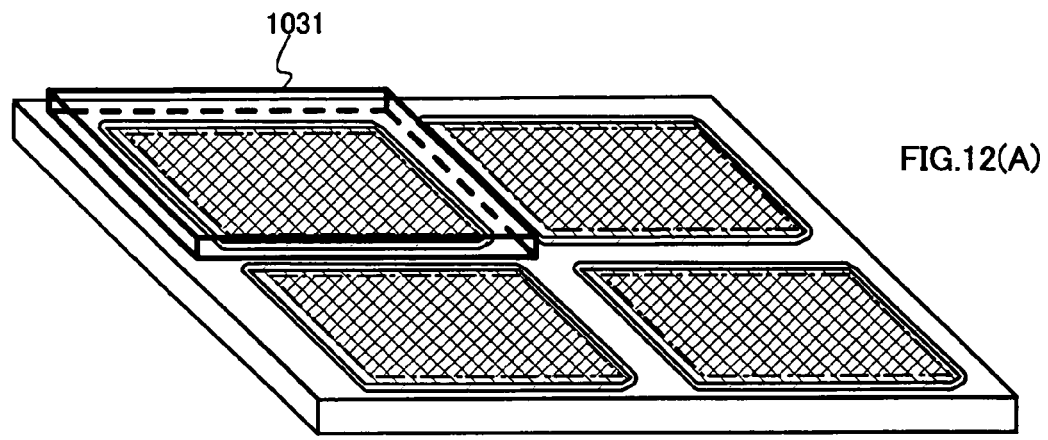
FIG.12(A)
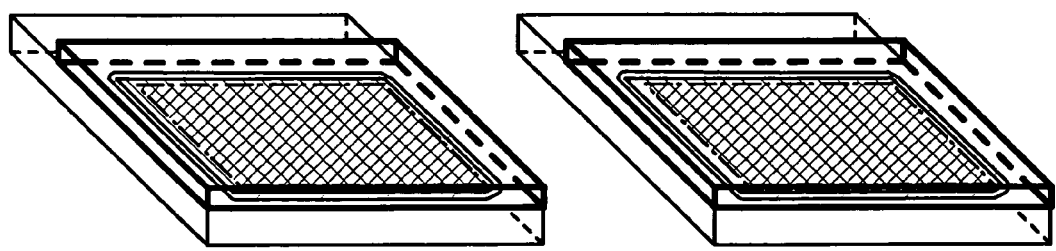
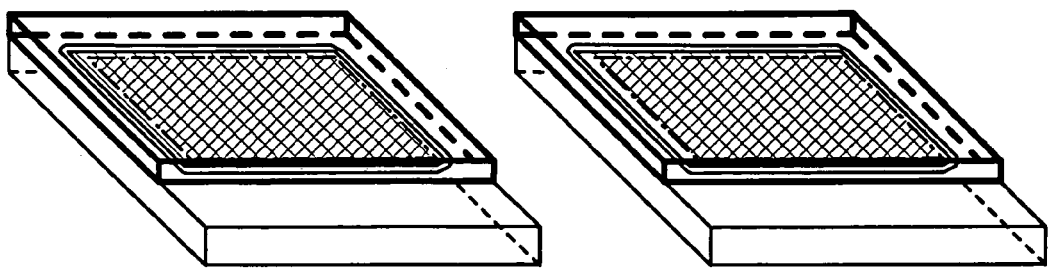
FIG.12(B)

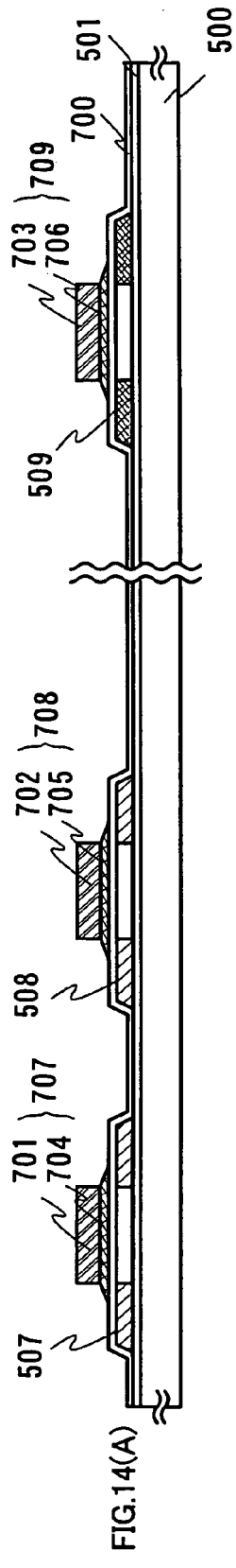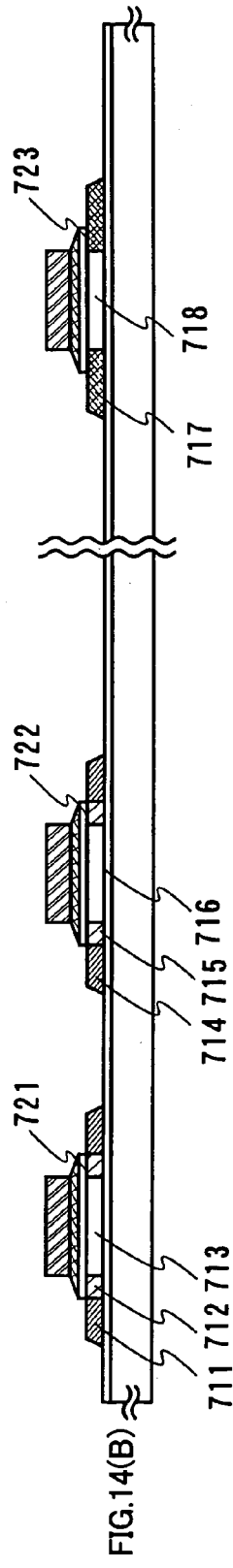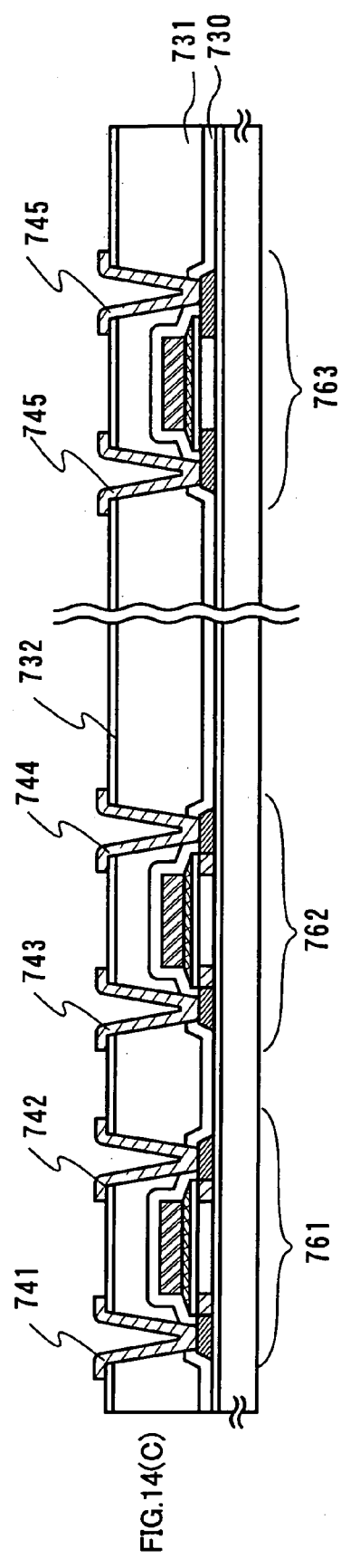

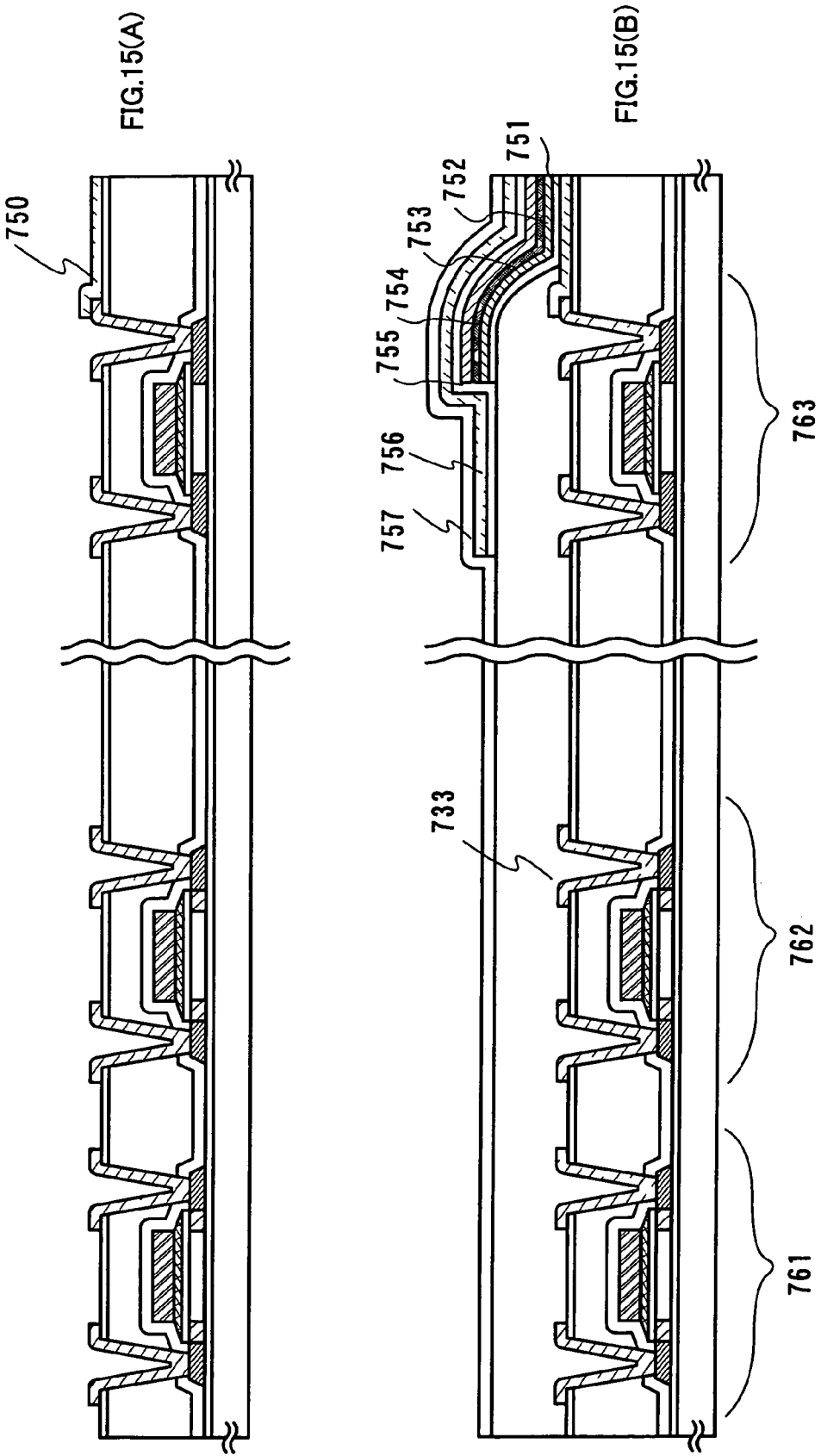

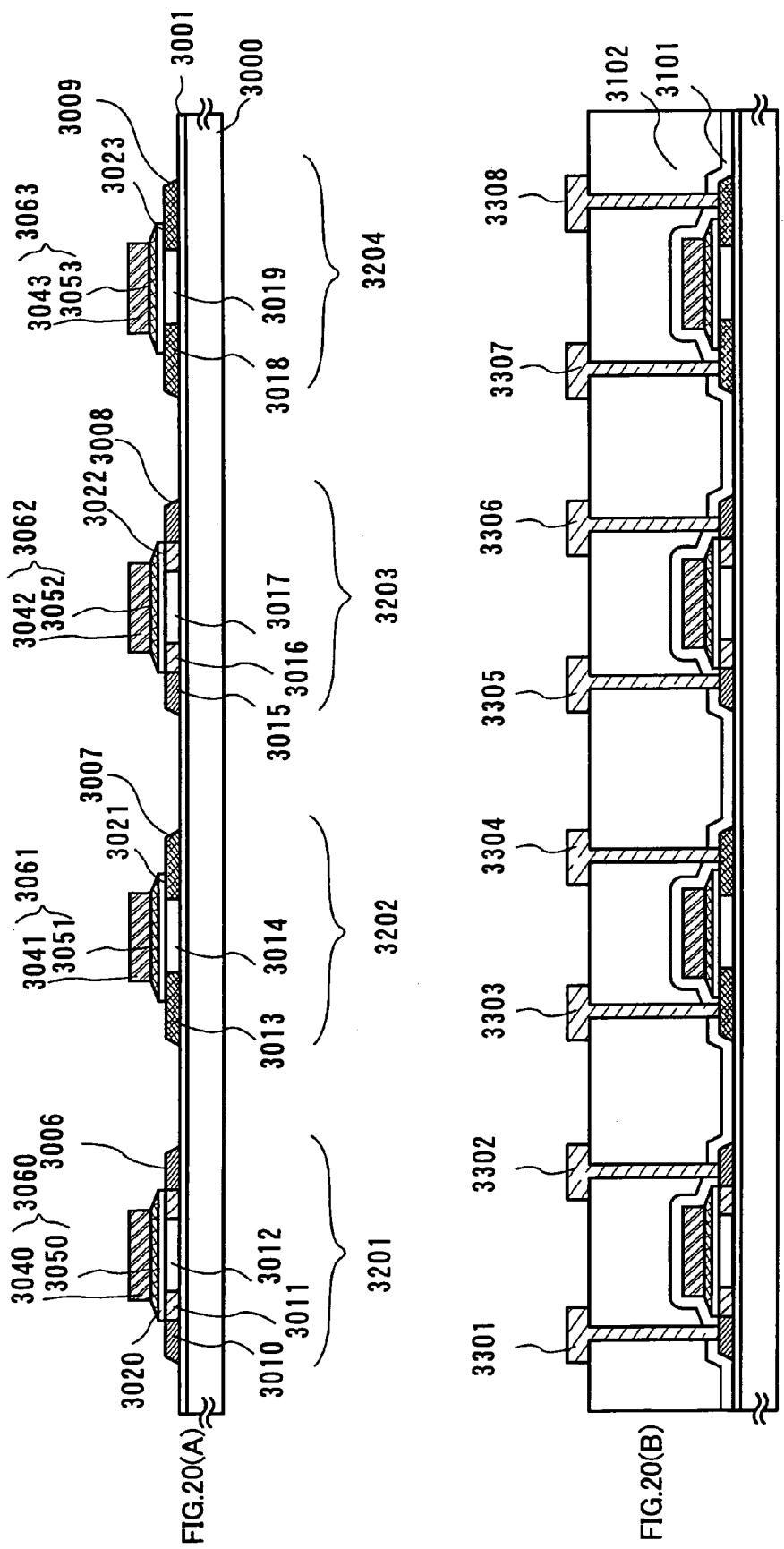

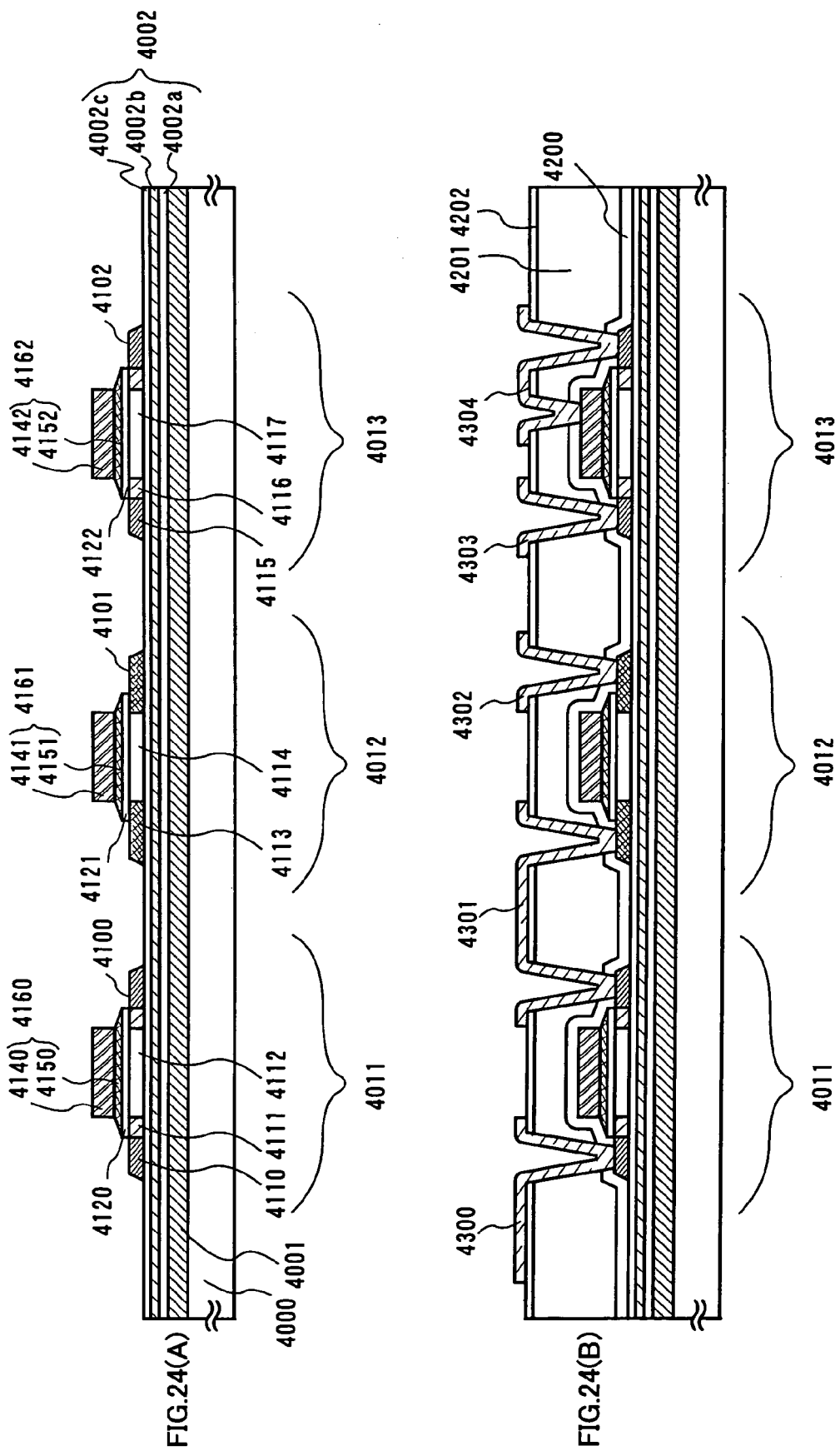

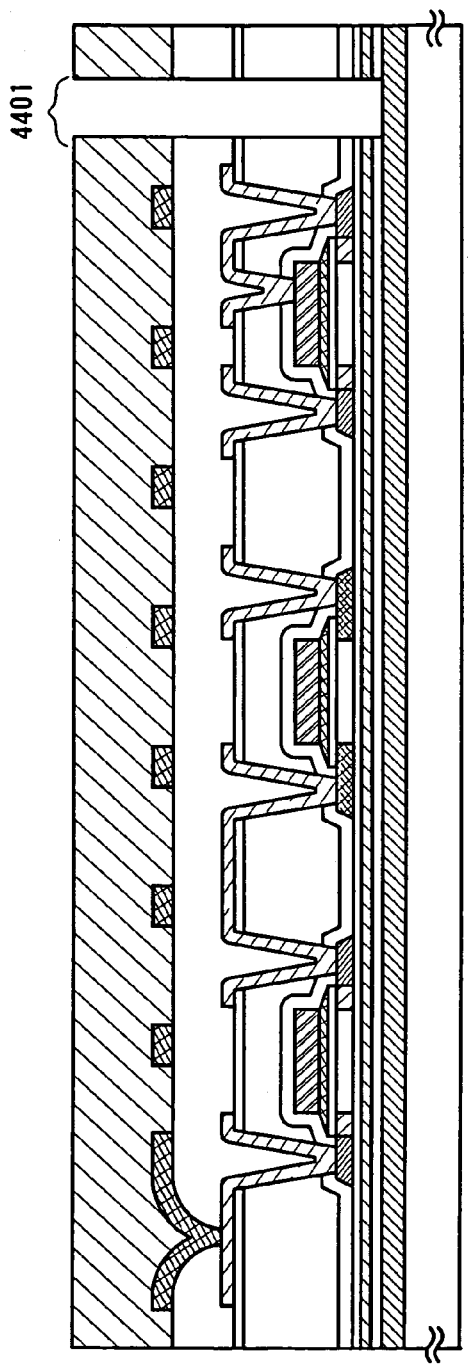
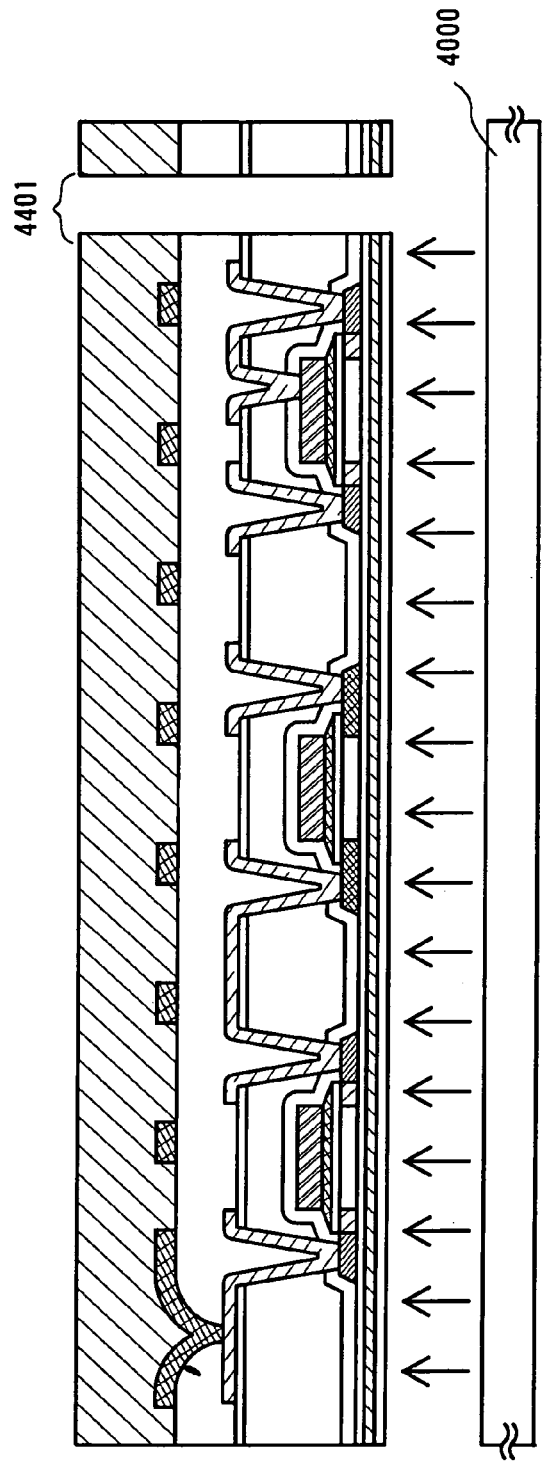
FIG.26(A)
FIG.26(B)

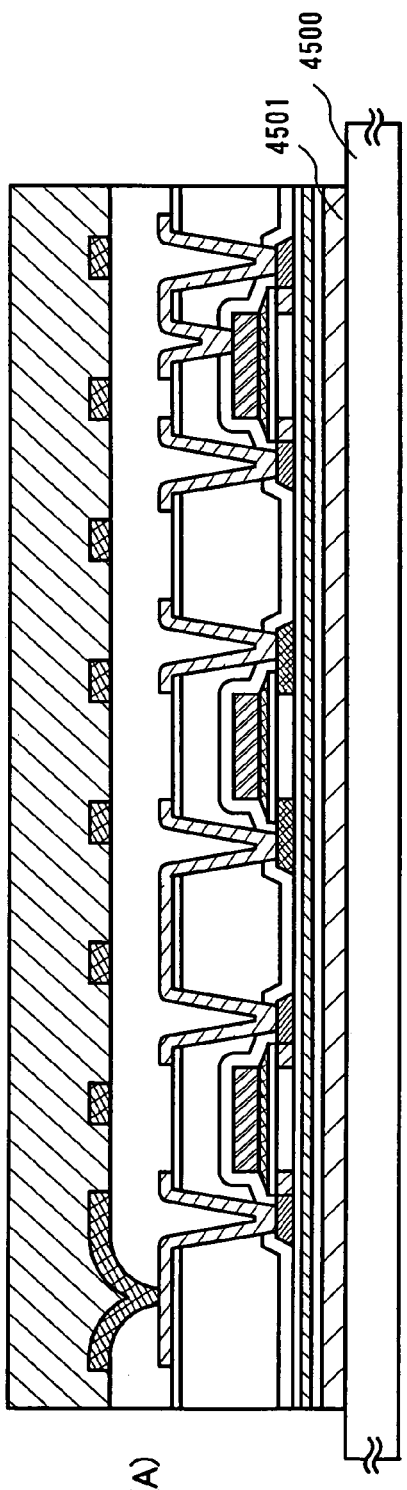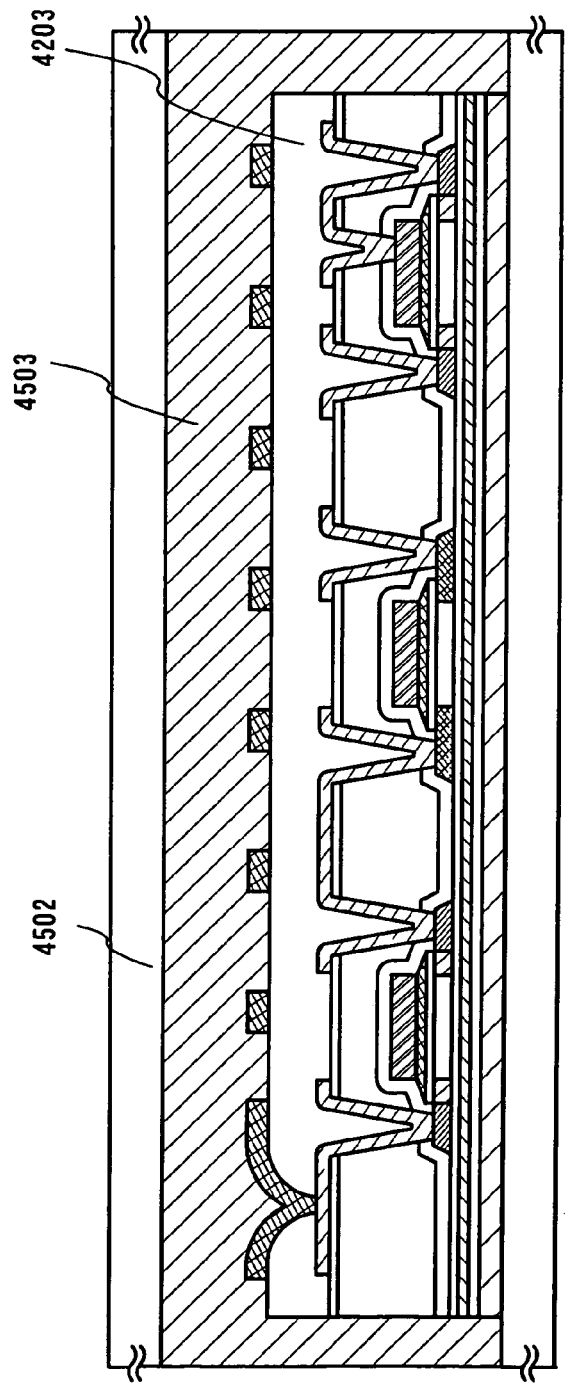
FIG.27(A)
FIG.27(B)

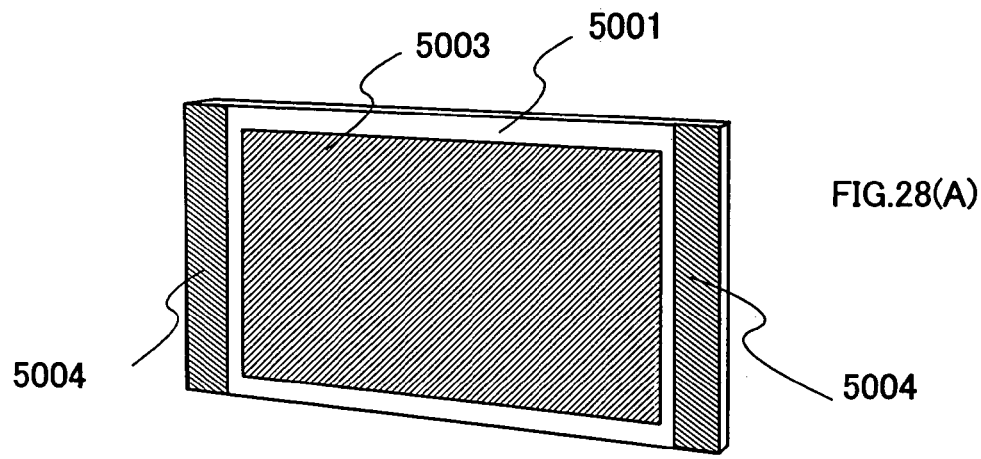
FIG.28(A)
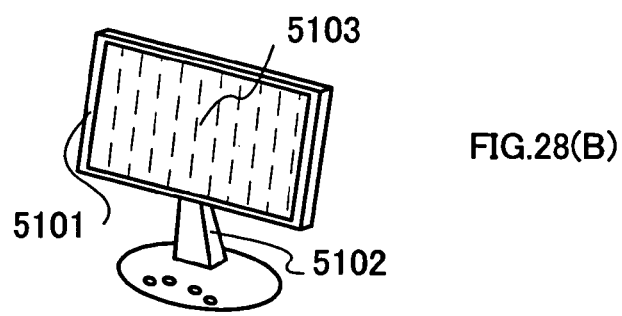
FIG.28(B)
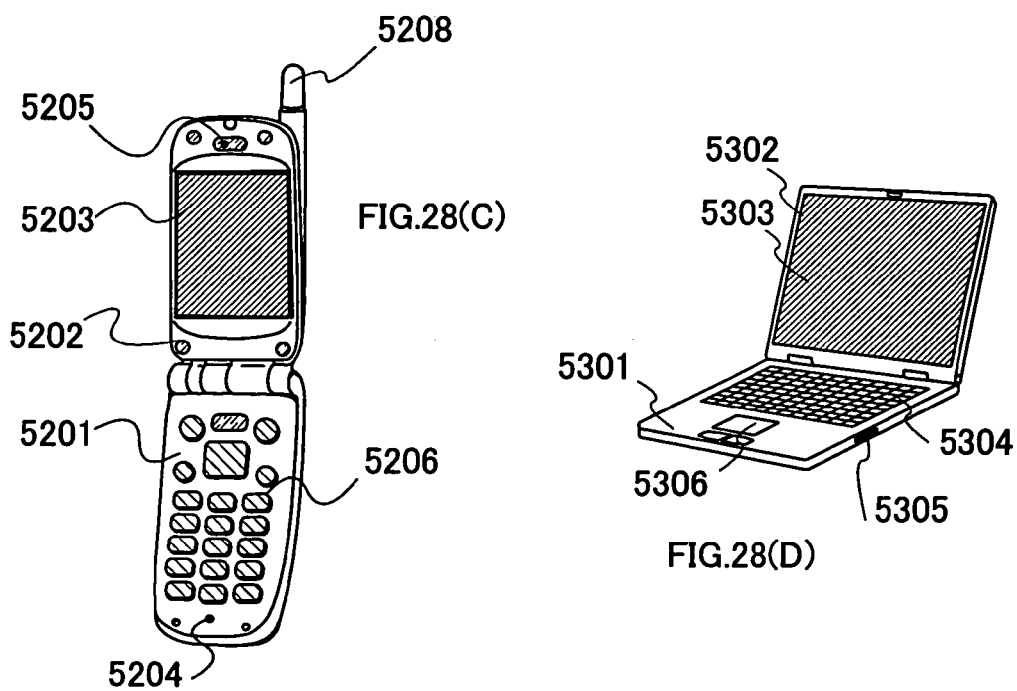
FIG.28(C)
FIG.28(D)

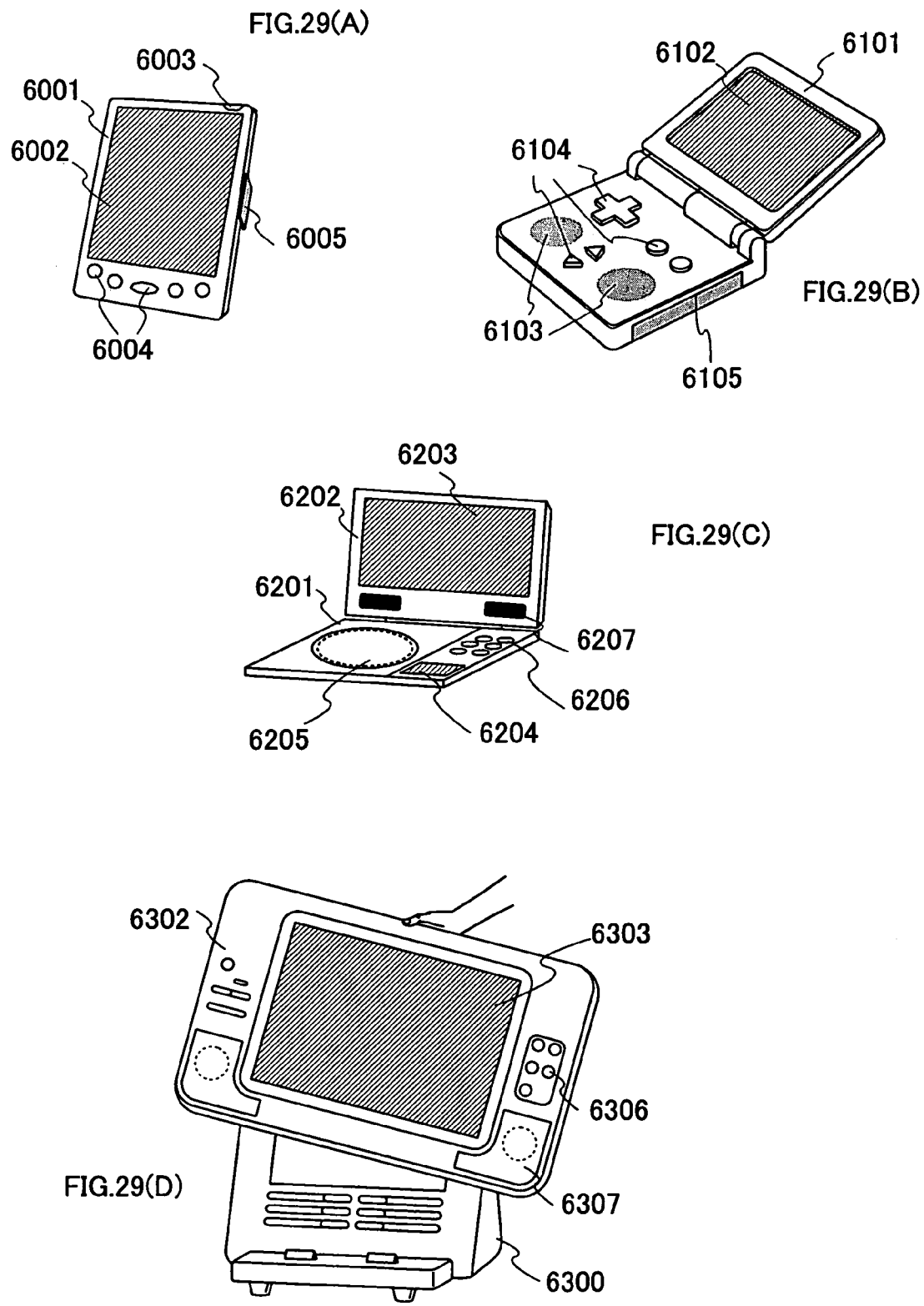

LASER PROCESSING UNIT, LASER PROCESSING METHOD, AND METHOD FOR MANUFACTURING SEMICONDUCTOR DEVICE

FIELD OF THE INVENTION

The present invention relates to a method for irradiating with a laser light. Furthermore, the invention relates to a method for manufacturing a semiconductor device using irradiation of the laser light.

BACKGROUND ART

Recently, a technique for manufacturing a semiconductor device, for example a thin film transistor (hereinafter, a TFT) over a substrate has made progress considerably, and application development to an active matrix type display device, for example, has made. Specifically, a TFT using a crystalline semiconductor film can be operated at high speed since the TFT has a higher electric field effect mobility (also referred to as mobility) as compared with a TFT using a conventional amorphous semiconductor film. Therefore, control of a pixel which has done by a drive circuit provided outside the substrate has been tried to be performed by a drive circuit formed over the same substrate as the pixel.

A glass substrate is more promising entry than a quartz substrate as a substrate in a semiconductor device from a monetary viewpoint. The glass substrate is inferior in a heat resistance property and heat deformation is easily generated. Therefore in the case of forming a TFT using a crystalline semiconductor film over a glass substrate, laser annealing is used for crystallizing a semiconductor film so as to avoid the heat deformation of the glass substrate.

The feature of the laser annealing is that a processing time can be vastly shortened compared to an annealing method in which radiant heating or conductive heating is used, and the substrate is not damaged practically by heating a semiconductor substrate or a semiconductor film selectively and locally.

Here, the laser annealing method refers to a technique for crystallizing a damaged layer or an amorphous layer formed over a semiconductor substrate or a semiconductor film, a technique for crystallizing an amorphous semiconductor film formed over a substrate, and a technique for heating (annealing) a crystalline semiconductor film which is not a single crystal (a semiconductor film which is not the above mentioned single crystal is collectively referred to as an amorphous semiconductor film). Further, a technique to be applied for planarization and surface modification of a semiconductor substrate or a semiconductor film is included.

Excimer laser is often used for laser annealing. The excimer laser has advantages that it has high output and it can perform repeated irradiation with high frequency. Moreover, the laser beam emitted from the excimer laser has an advantage that it is sufficiently absorbed in a silicon film which is often employed as the semiconductor film.

As for the laser beam irradiation, the shape of the laser beam at an irradiation surface is formed to be linear by an optical system; an irradiation position of the laser beam is moved relatively to the irradiation surface in a width direction of the linear laser beam (referred to as a linear beam). Thus, a method for the irradiation has high productivity and is superior to industrial use (refer to patent document 1).
[Patent Documents 1]
Japanese Patent Laid-Open No. 8-195357

DISCLOSURE OF THE INVENTION

Problem to be Solved by the Invention

A continuous wave laser (referred to as a CW laser) is formed to be linear, and an irradiation position of the laser is moved relatively to its width direction. Thus, a large grain size crystal in which a crystal grain is extended lengthwise in a direction of movement can be formed. When forming a TFT in accordance with a direction to which the large grain size crystal is extended, a TFT having higher mobility can be manufactured as compared to a TFT manufactured by an excimer laser. Since a circuit can be driven at high speed using the TFT, a driver, a CPU, and the like can be manufactured.

In this specification, a direction in which a linear beam is extended lengthwise is referred to as a long axis direction or a longitudinal direction of the linear beam and a direction of shorter axis direction is referred to as short axis direction or a width direction of the linear beam.

Laser light which is visible or has a wavelength in ultraviolet wavelength is used mostly because of preferable absorptive efficiency. However, when solid laser such as a CW or a simulated CW laser (a quasi-CW laser) is applied, a wavelength band of the fundamental wave is in red to near infrared band, and absorptive efficiency in a semiconductor film is small. Hence, when using the solid laser in this laser annealing, the wave length is converted to a harmonic wave below a visible range by using a non-linear optical element, to be used. Generally, a method for converting a near infrared fundamental wave from which high output can be easily obtained into laser light with green color that is a second harmonics has the highest conversion efficiency, and is often used.

Note that the simulated CW laser means a pulsed oscillation laser which is characterized to be as similar to a CW laser and has high repetition such as a repetition frequency of 10 MHz or more, preferably, 80 MHz or more.

A harmonic wave can be obtained by injecting a fundamental wave generated from a laser medium into a non-linear optical element. However, when the output of the laser becomes larger, the non-linear optical element is damaged due to a non-linear optical effect such as multi-photon absorption, thereby causing a problem of leading a breakdown. Accordingly, the CW laser in a visible range which is produced has electric power of approximately 15 W at a maximum due to the problem of the non-linear optical element.

When laser annealing is performed using a CW laser or a simulated CW laser, productivity becomes worse compared to the case when using an excimer laser, and improvement of productivity is required. For example, when laser annealing is performed using a CW laser with 532 nm and an electric power of 10 W which is formed to be linear of 300 μm in a longitudinal direction and 10 μm in a lateral direction, a region in a large grain size crystal which can be scanned once is approximately 200 μm in width. Therefore, in order to crystallize the entire surface of the semiconductor film having a rectangle shape of 100 mm on a side generally used in a mass-production process, a beam spot has to be repeatedly scanned several thousands times.

The object of the present invention is to shorten a manufacturing process, manufacturing time and manufacturing cost of a semiconductor device by making a larger beam spot of a linear beam to reduce the scanning time of the linear beam and time for laser annealing.

Means to Solve the Problem

In the present invention, a gas at high temperature is blown locally so as to overlap at a laser spot on a semiconductor film. Since the whole glass substrate is not exposed at high temperature, and locally overheated temporary, a distortion of the substrate due to heat can be suppressed. Accordingly, temperature of the semiconductor film can be kept high locally, and an energy density required in laser crystallization can be decreased, and a length of a linear beam can be extended. At this time, an inert gas such as nitrogen, argon, or the like, or air can be used as the gas to be blown. The gas is preferably blown at a temperature at from 300° C. to 1500° C. with a size to overlap at a laser spot.

By blowing the gas at a temperature at from 300° C. to 1500° C., laser annealing can be performed to have a laser spot with a sufficient temperature distribution even though the length of the linear beam is extended. The temperature for heating the gas is to be equal to or more than 300° C. since the effect for blowing the gas is small at less than 300° C. Further, gas for heating up to 1500° C. is sufficient for blowing since the melting-point of silicon (Si) is 1414° C.

The invention relates to a laser processing unit comprising a laser oscillator for radiating laser light, a lens for processing the radiated laser light to a linear beam light and a heater for heating a gas, and in which the heated gas that is blown to an irradiated surface of the linear beam light.

Further the invention relates to a laser processing method comprising the steps of, using a laser processing unit having a laser oscillator, a lens, and a heater, radiating laser light from the laser oscillator, processing the radiated laser light to a linear beam light using the lens, heating a gas by the heater, and blowing the heated gas to an irradiated surface of the linear beam light.

Furthermore, the invention relates to a method for manufacturing a semiconductor device manufactured by forming a semiconductor film over a substrate, blowing a heated gas while irradiating the semiconductor film with linear beam light, and using the semiconductor film to which the heated gas is blown while irradiating with the linear beam light. The linear beam light can be obtained by using a laser processing unit having a laser oscillator, a lens and a heater, radiating laser light from the laser oscillator, and processing the radiated laser light to the linear beam light by the lens. The heated gas can be obtained by heating the gas by the heater.

In this invention, the laser light is continuous wave laser light.

In this invention, the laser light is pulsed oscillation laser light having a repetition frequency of 10 MHz or more.

In this invention, the laser light is pulsed oscillation laser light having a repetition frequency of 80 MHz or more.

In this invention, the compressed gas is heated at from 300° C. to 1500° C.

In this invention, the gas is an inert gas such as nitrogen, argon, or the like or air.

In this invention, the gas is a gas including oxygen.

In this invention, plasma can be used instead of using a heated gas.

In this invention, by blowing a gas locally at high temperature so as to overlap at a laser spot on a semiconductor film, an energy density required for laser crystallization can be reduced, thereby being effective for extending the length of the beam spot of the linear beam.

BRIEF DESCRIPTION OF THE DRAWINGS

[FIG. 10] Views showing a manufacturing process of a liquid crystal display device with the use of a liquid crystal dropping method of the present invention.

[FIG. 12] Views showing a manufacturing process of a liquid crystal display device with the use of a liquid crystal dropping method of the present invention.

[FIG. 14] Views showing a manufacturing process of an EL display device of the present invention.

[FIG. 15] Views showing a manufacturing process of an EL display device of the present invention.

[FIG. 20] Views showing a manufacturing process of a CPU of the present invention.

[FIG. 24] Views showing a manufacturing process of an ID chip of the present invention.

[FIG. 26] Views showing a manufacturing process of an ID chip of the present invention.

[FIG. 27] Views showing a manufacturing process of an ID chip of the present invention.

[FIG. 28] Views showing examples of electric apparatus to which the present invention can be applied.

[FIG. 29] Views showing examples of electric apparatus to which the present invention can be applied.

BEST MODE FOR CARRYING OUT THE INVENTION

Embodiment mode of the present invention is described with reference to FIG. 1. However, the invention can be applied in various modes, and it can be easily understood by a person of ordinary skill in the art that the mode and the detail can be variously changed without departing from the purpose and the range of the invention. Therefore, the invention is not interpreted while limiting to the description of the embodiment mode.

Figure 1:
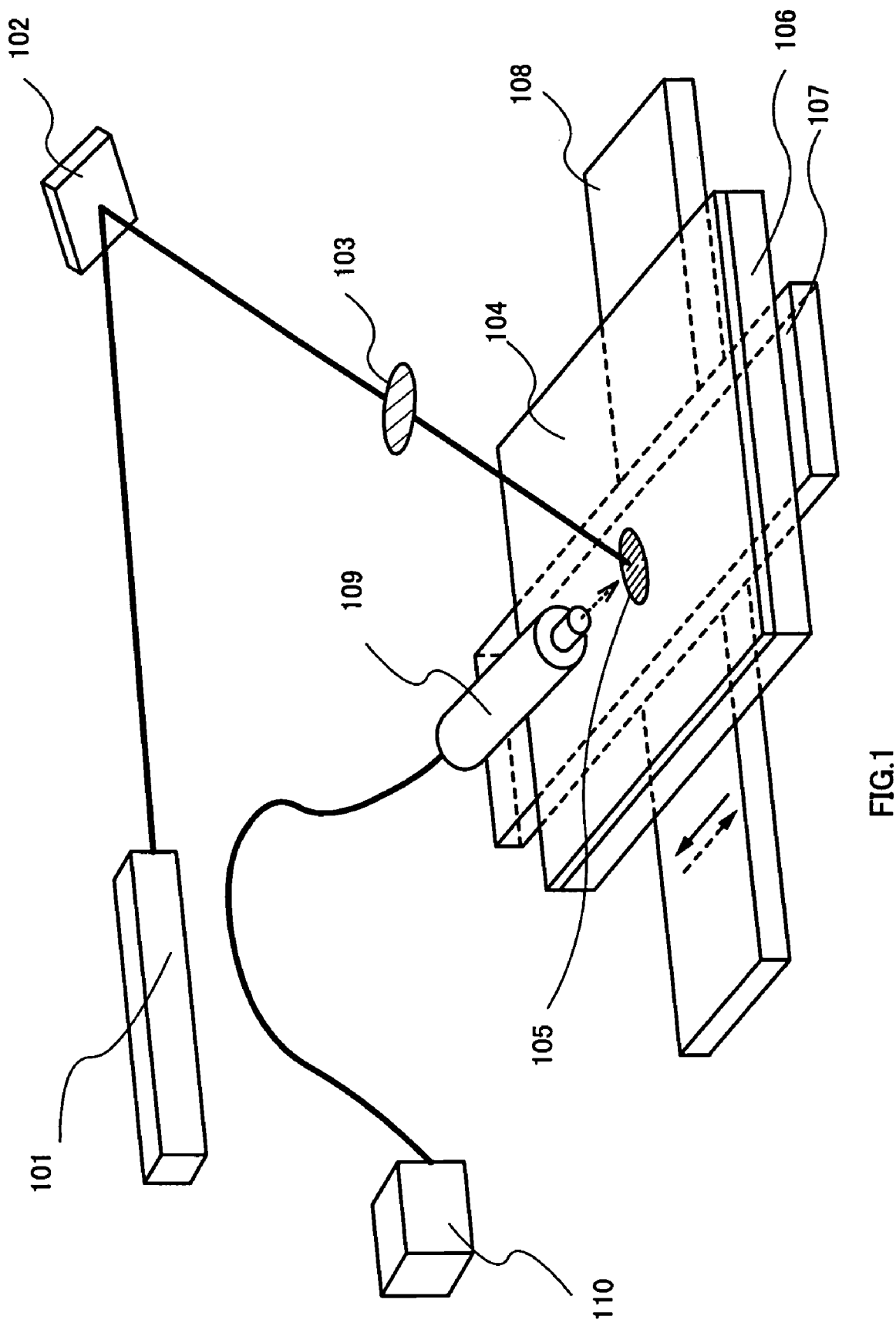
[FIG. 1] A view showing a laser processing unit of the present invention.

FIG. 1 shows a laser processing unit of the invention. In FIG. 1, laser light radiated from a laser oscillator 101 reflects on a mirror 102 and is injected into a planoconvex lens 103 placed parallel to a glass substrate 106. At this time, by giving laser light to be injected an incidence angle (not 0°) to the planoconvex lens 103, a beam spot 105 at an irradiated surface is extended only in an incidence direction by astigmatism of the lens to be a linear beam.

By making the linear beam thinner at this time, the beam spot of the linear beam can be longer. By scanning the beam spot in a minor axis direction of the linear beam, the width of a region to be crystallized at a time can be wide, and it is preferable for its productivity.

A gas compressed by a gas compressor 110, is heated at from 300° C. to 1500° C., for example at 600° C., by a nozzle type heater 109, and sprayed from a point of the nozzle type heater 109 so as to overlap at a beam spot 105 on a semiconductor film 104 shown in a dotted arrow. Accordingly, the semiconductor film 104 can be locally heated, and an energy density of the linear beam which is required for melting the semiconductor film can be reduced. Hence, the linear beam can be longer.

However, the compressed gas by the gas compressor is not necessarily required for the heated gas, and, for example, the gas may run by connecting a pipe to the nozzle type heater 109 via a flow meter or a pressure gage from a gas-pressure container.

Instead of using the heated gas, plasma may be generated in a plasma generator including a parallel plate electrode or concentric cylindricality electrode and sprayed so as to overlap at the beam spot 105.

The glass substrate 106 is placed over an X stage 107 and a Y stage 108 which can be moved at 0 to 100 mm/sec. The X stage 107 is moved in a minor axis direction of the beam spot 105 of a linear beam, and the Y stage 108 is moved in a major axis of the beam spot 105 of the linear beam. After the X stage 107 is moved in the direction of the arrow shown by a full line (a homeward trip), the Y stage 108 is moved in accordance with the length of the major axis of the beam spot. Then, the X stage 107 is moved in a direction of the arrow shown in a dotted line (an outward trip), and the Y stage 108 is moved in accordance with the length of the major axis of the beam spot. By repeating this operation, laser annealing can be performed over the whole substrate.

According to the above method, a large grain size crystal can be formed in the semiconductor film 104. And by manufacturing a semiconductor device, for example, a TFT using the semiconductor film 104 with the large grain size crystal by known means, high speed device can be obtained.

Embodiment 1

This embodiment mode is described with reference to FIG. 2, FIGS. 3(A) to 3(C), FIGS. 4(A) to 4(C), and FIGS. 5(A) to 5(C).

Figure 2:
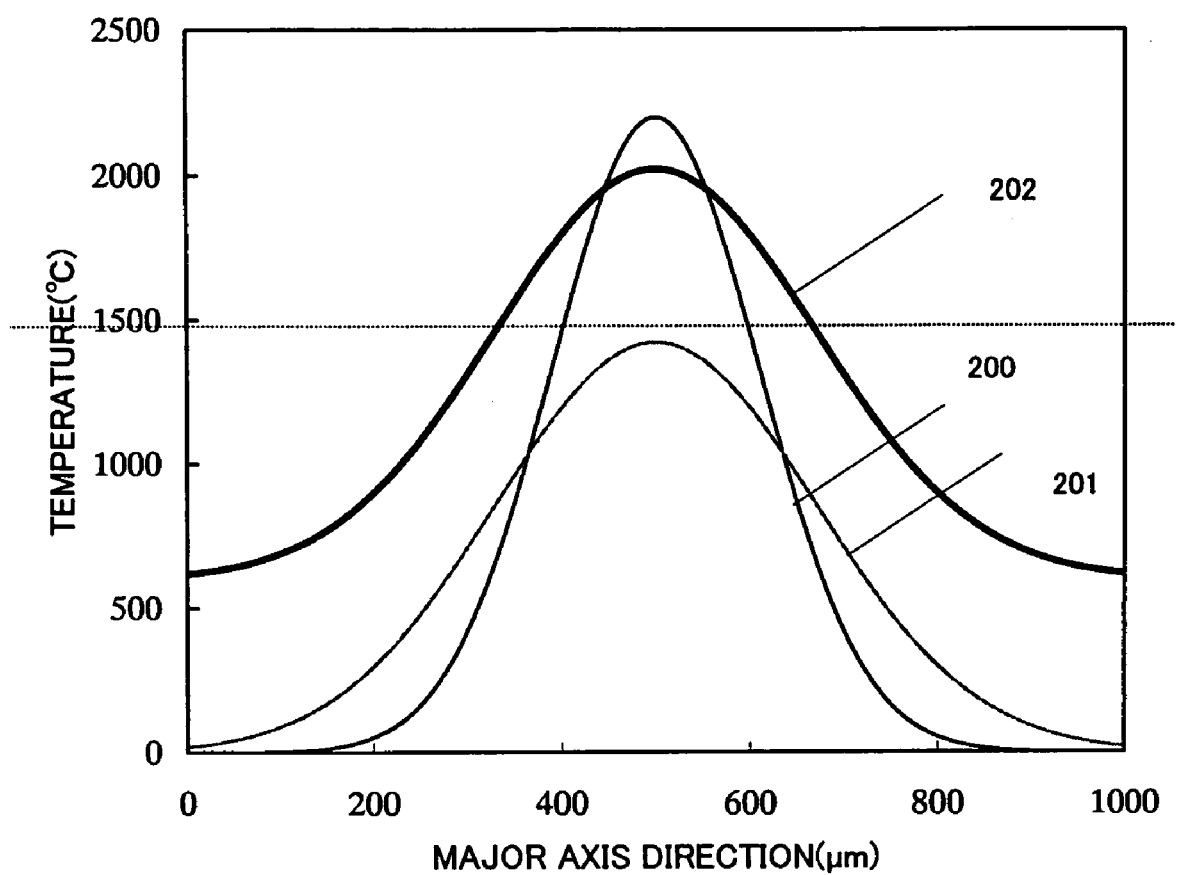
[FIG. 2] A view showing a temperature distribution of a linear beam of the present invention.

In FIG. 2, reference numeral 200 denotes temperature distribution of a linear beam in which a CW laser having a wave length of 532 nm and electric power of 10 W is formed in a linear, in a major axis direction, and the distribution generally becomes Gaussian distribution. When using an amorphous silicon film as a semiconductor film, the amorphous silicon is required to be completely melted so as to form a large grain size crystal. When the temperature for melting the amorphous silicon is supposed to be 1414° C., the length in the major axis direction of the linear beam having a temperature more than the temperature for completely melting the amorphous silicon, is approximately 200 μm. At this time, the length of a minor axis direction is to be 10 μm.

A full width at half maximum and strength in 201 is changed so that the integral value of 201 and 200 is the same, and the length of the beam spot of the linear beam becomes further longer. At this time, over the whole area in the length of the beam spot of the linear beam, the temperature of the semiconductor film does not reach the temperature required for melting the amorphous silicon. Thus, the silicon can not be melted, and the large grain size crystal can not be formed.

Reference numeral 202 is temperature distribution when the linear beam having Gaussian distribution of 201 is blown by a gas with high temperature of 600° C. By blowing the gas with high temperature of 600° C., the semiconductor film is locally heated at 600° C. By irradiating the region with the linear beam having the temperature distribution shown in 201, the temperature distribution in 202 can be obtained, thus the semiconductor film can be melted in a wider range.

When the amorphous semiconductor film is melted once by laser annealing and crystallized, a bond angle of atoms is arranged since the atom has a crystalline structure, and flexibility of the semiconductor film is lessened. Hence, adhesiveness between a glass substrate and a semiconductor film, and adhesiveness between large grain size crystals becomes worse, thereby being considered as a cause that the semiconductor film is easily peeled off.

At this time, when amorphous silicon is used in the semiconductor film, by using a gas including oxygen as a gas for blowing, the silicon takes the oxygen in when it is melted, and Si—O—Si bond is formed. Since flexibility after crystallization becomes preferable, the silicon film is expected to be hardly peeled off.

Therefore, a permissible range of an energy density of a laser which is required for crystallization can be larger, and the width in the large grain size crystal region can be easily widen.

In order to perform this embodiment mode, a laser processing unit shown in FIG. 1 described in the embodiment mode is used. The temperature distribution of the beam spot 105 of the linear beam in FIG. 1 is processed so as to be the temperature distribution 201 shown in FIG. 2, and a gas heated by a nozzle type heater 109 is blown, thereby changing the temperature distribution of the beam spot 105 to the temperature distribution 202. The semiconductor film 104 can be melted in a wide range, and a large grain size crystal can be obtained.

An example of using a method for manufacturing a semiconductor device of the invention is described with reference to FIGS. 3(A) to 3(C), FIGS. 4(A) to 4(C), and FIGS. 5(A) to 5(C).

Figure 3:
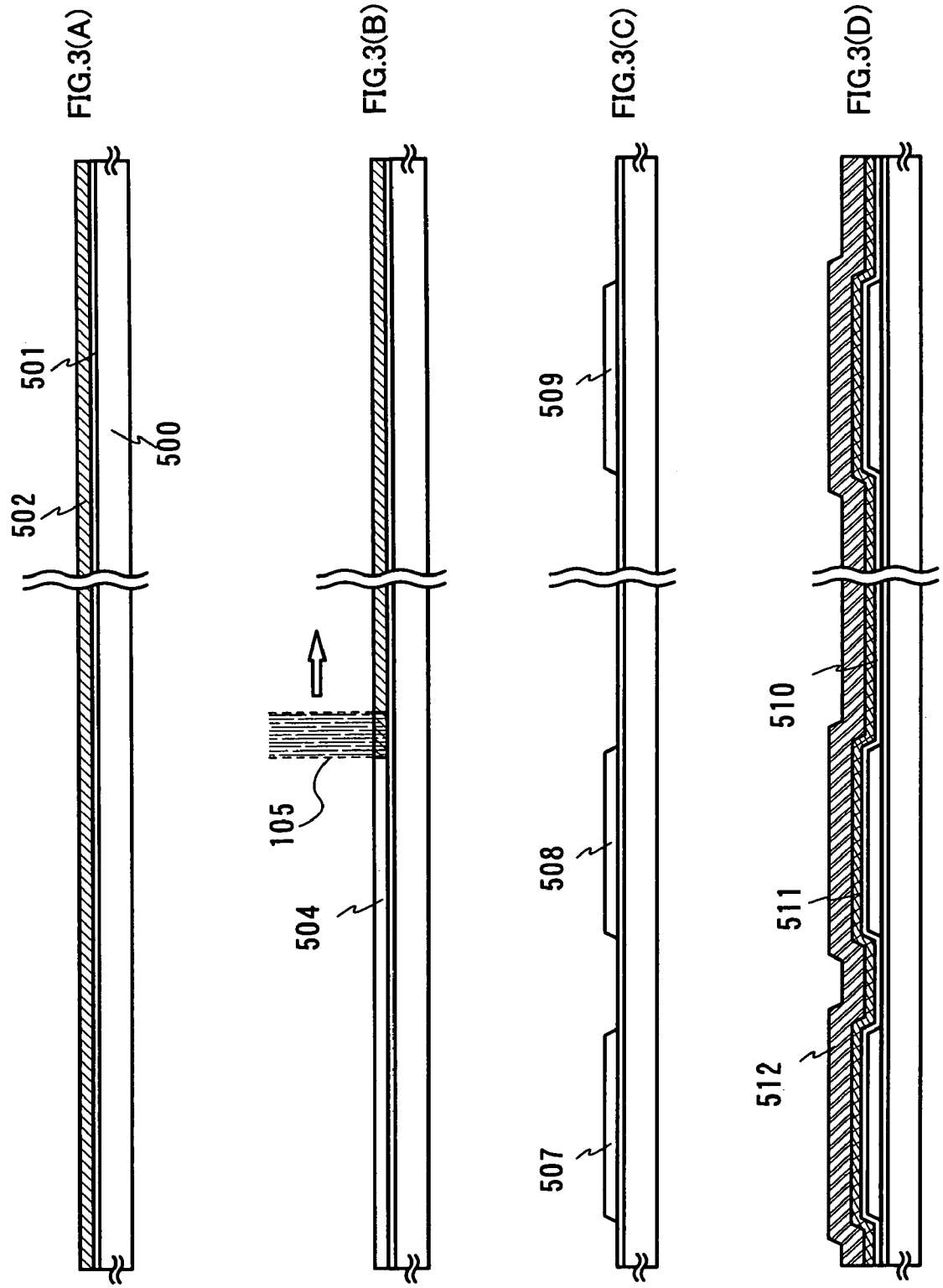
[FIG. 3] Views showing a manufacturing process of a semiconductor device of the present invention.

First, a base film 501 is formed over a substrate 500 as shown in FIG. 3(A). A glass substrate such as barium borosilicate glass, alumino borosilicate glass, a quartz substrate, a stainless substrate, or the like can be used as the substrate 500, for example. Further, a substrate composed of plastic typified by PET, PES, and PEN, or a synthetic resin having flexibility such as acryl can be used.

The base film 501 is provided so as to prevent an alkali metal such as Na and an alkali earth metal included in the substrate 500 from being diffused in a semiconductor film and adversely affecting properties of a semiconductor element. Therefore, an insulating film such as silicon nitride and silicon oxide including nitrogen is used so as to prevent the alkali metal such as Na and the alkali earth metal from being diffused into the semiconductor film for forming the base film. In this embodiment mode, silicon oxide including nitrogen is formed so as to have a film thickness of 10 nm to 40 nm (preferably 50 nm to 300 nm).

The base film 501 can be a single layer of an insulating film such as silicon nitride, silicon oxide including nitrogen, silicon nitride including oxide, or a laminated layer of plurality of insulating films such as silicon oxide, silicon nitride, silicon oxide including nitrogen, silicon nitride including oxide. When using a substrate in which an alkali metal or an alkali earth metal is included in any way such as a glass substrate, a stainless substrate or a plastic substrate, the base film is effectively provided for preventing an impurity from being diffused. However, when it matters little whether the impurity is diffused or not such as a quartz substrate, the base film is not necessarily provided.

Then, a semiconductor film 502 is formed on the base film 501. The film thickness of the semiconductor film 502 is to be 25 nm to 100 nm (preferably, 30 nm to 60 nm). Note that the semiconductor film 502 may be an amorphous semiconductor or a polycrystalline semiconductor. Silicon germanium (SiGe) in addition to silicon (Si) can be used as the semiconductor. When using silicon germanium, the concentration of the germanium is preferably and approximately at 0.01 to 4.5 atomic %.

Subsequently, as shown in FIG. 3(B), the semiconductor film 502 is irradiated with a linear beam by using a laser processing unit shown in FIG. 1 for crystallization. The beam spot 105 has a temperature distribution 202 shown in FIG. 2.

When performing laser crystallization, before performing the laser crystallization, heat treatment at 500° C. for one hour may be applied to the semiconductor film 502 so as to increase resistance of the semiconductor film 502 to a laser.

A pulsed oscillation laser with a repetition frequency of equal to or more than 10 MHz, preferably, equal to or more than 80 MHz can be used as a continuous wave laser or a simulated CW laser for the laser crystallization.

In particular, an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser which includes a medium in which one or a plurality kind of Nd, Yb, Cr, Ti, Ho, Er, Tm and Ta are added to YAG, $Y_2O_3$, $YVO_4$, $YAlO_3$, and $GdVO_4$ of a polycrystal (ceramic) as a dopant are given as a continuous wave laser.

As a simulated CW laser, as far as pulse oscillation is carried out at a repetition frequency of 10 MHz or more, preferably 80 MHz or more, a pulsed oscillation laser such as an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, a $YAlO_3$ laser, a $GdVO_4$ laser, an alexandrite laser, a Ti:sapphire laser, a copper vapor laser or a gold vapor laser, a laser which includes a medium in which one or a plurality kind of Nd, Yb, Cr, Ti, Ho, Er, Tm, and Ta are added to YAG, $Y_2O_3$, $YVO_4$, $YAlO_3$, and $GdVO_4$ of a polycrystal (ceramic) as a dopant can be used.

Such a pulsed oscillation laser eventually shows equal effect to the continuous wave laser by increasing its repetition frequency.

When using a solid state laser capable of the continuous wave, for example, a large grain size crystal can be obtained by irradiating with laser light of a second harmonic wave to a fourth harmonic wave. Typically, the second harmonic wave (532 nm) or the third harmonic wave (355 nm) of YAG laser (fundamental wave 1064 nm) is preferably used. Concretely, laser light radiated from the continuous wave YAG laser is converted into a harmonic wave by a nonlinear optical element to irradiate the semiconductor film 502. Energy density is assumed to be approximately 0.01 to 100 $MW/cm^2$ (preferably 0.1 to 10 $MW/cm^2$). And a scanning speed is set to be approximately 10 to 2000 cm/sec for irradiation.

Note that a continuous wave can be carried out by using a laser which includes a medium in which one or multiple kinds of Nd, Yb, Cr, Ti, Ho, Er, Tm, and Ta are added to YAG, $YVO_4$, forsterite ($Mg_2SiO_4$), $YAlO_3$, and $GdVO_4$ of a single crystal or YAG, $Y_2O_3$, $YVO_4$, $YAlO_3$, and $GdVO_4$ of a polycrystal (ceramic) as a dopant, an Ar laser, a Kr laser, or a Ti:sapphire laser, and pulsed oscillation can be carried out by Q-switch operation, mode locking, or the like. By oscillating a laser beam with a repetition frequency of equal to or more than 10 MHz, a semiconductor film can be irradiated with next pulse before the semiconductor film that has been melted by laser light is solidified. Therefore, unlike in the case of using the pulsed laser with low repetition frequency, the interface between a solid phase and a liquid phase can be continuously moved in the semiconductor film, and crystal grain sequentially grown in a scanning direction can be obtained.

By using a ceramic (polycrystal) as a medium, the medium can be formed freely for short time at low cost. When using a single crystal, a cylindricality medium with a diameter of several mm and a length of several 10 mm is used. However, when using the ceramic, the medium can be formed larger.

The concentration of dopant such as Nd or Yb in a medium which directly contributes to light emission can be largely changed neither in a single crystal nor polycrystal; and thereby the improvement in laser output by increasing the concentration has limitations to some extent. However, when using ceramic, the medium can be made remarkably large compared to the case of using a single crystal. Hence, the remarkable improvement in output can be expected.

When using ceramic, a medium having a parallelepiped shape or a rectangular solid shape can be easily formed. By using the medium having such a shape, an oscillation light path can be elongated by running the oscillated light in zig-zags inside the medium. Therefore, amplification is increased and oscillation with large output is possible. Since the laser beam radiated from such a medium has a cross-section of a quadrangle when it is radiated, there has an advantage in forming into a linear beam compared to a round shape beam. The linear beam with a narrow side 1 mm or less long and a long side several mm long to several m can be easily obtained by forming the laser beam radiated in this way by using an optical system. Further, by irradiating the medium with exciting light uniformly, the linear beam has a uniform energy distribution in its long side direction.

By irradiating the semiconductor film with the linear beam, the whole surface of the semiconductor film can be annealed more uniformly. When it is necessary to anneal to both ends of the linear beam uniformly, a device such as arranging a slit to the both ends to shade the attenuation point of energy is required.

By irradiating the semiconductor film 502 with laser light, a crystalline semiconductor film 504 having higher crystallinity can be formed.

By patterning the crystalline semiconductor film 504 shown in FIG. 3(C), island shape semiconductor films 507 to 509 are formed. These island shape semiconductor films 507 to 509 become active layers of a TFT formed in the later step.

An impurity is introduced into the island shape semiconductor films for controlling a threshold. Boron (B) is introduced in the island shape semiconductor films by doping diborane ($B_2H_6$) in this embodiment.

Then, an insulating film 510 is formed so as to cover the island shape semiconductor films 507 to 509. Silicon oxide (SiO), silicon nitride (SiN), silicon oxide including nitrogen (SiON), or the like can be used for the insulating film 510, for example. Plasma CVD, sputtering, or the like can be used for forming a film.

By patterning a conductive film after forming the conductive film on the insulating film 510, gate electrodes 570 to 572 are formed.

The gate electrodes 570 to 572 are formed using a structure in which a conductive film is used in a single layer or laminated with two or more. When laminating equal to or more than two conductive films, the gate electrodes 570 to 572 may be formed using an element selected from tantalum (Ta), tungsten (W), titanium (Ti), molybdenum (Mo), and aluminum (Al), an alloy material or a compound material mainly including the element. The gate electrodes may be formed using a semiconductor film typified by a polycrystalline silicon film doped with an impurity element such as phosphorus (P).

In this embodiment, the gate electrodes 570 to 572 are formed as follows. First, a tantalum nitride (TaN) film is formed with a film thickness of 10 to 50 nm, for example, 30 nm as a first conductive film 511. A tungsten (W) film is formed with a film thickness of 200 to 400 nm, for example, 370 nm as a second conductive film 512 on the first conductive film 511, thereby forming a laminated film of the first conductive film 511 and the second conductive film 512 (FIG. 3(D)).

Figure 4:
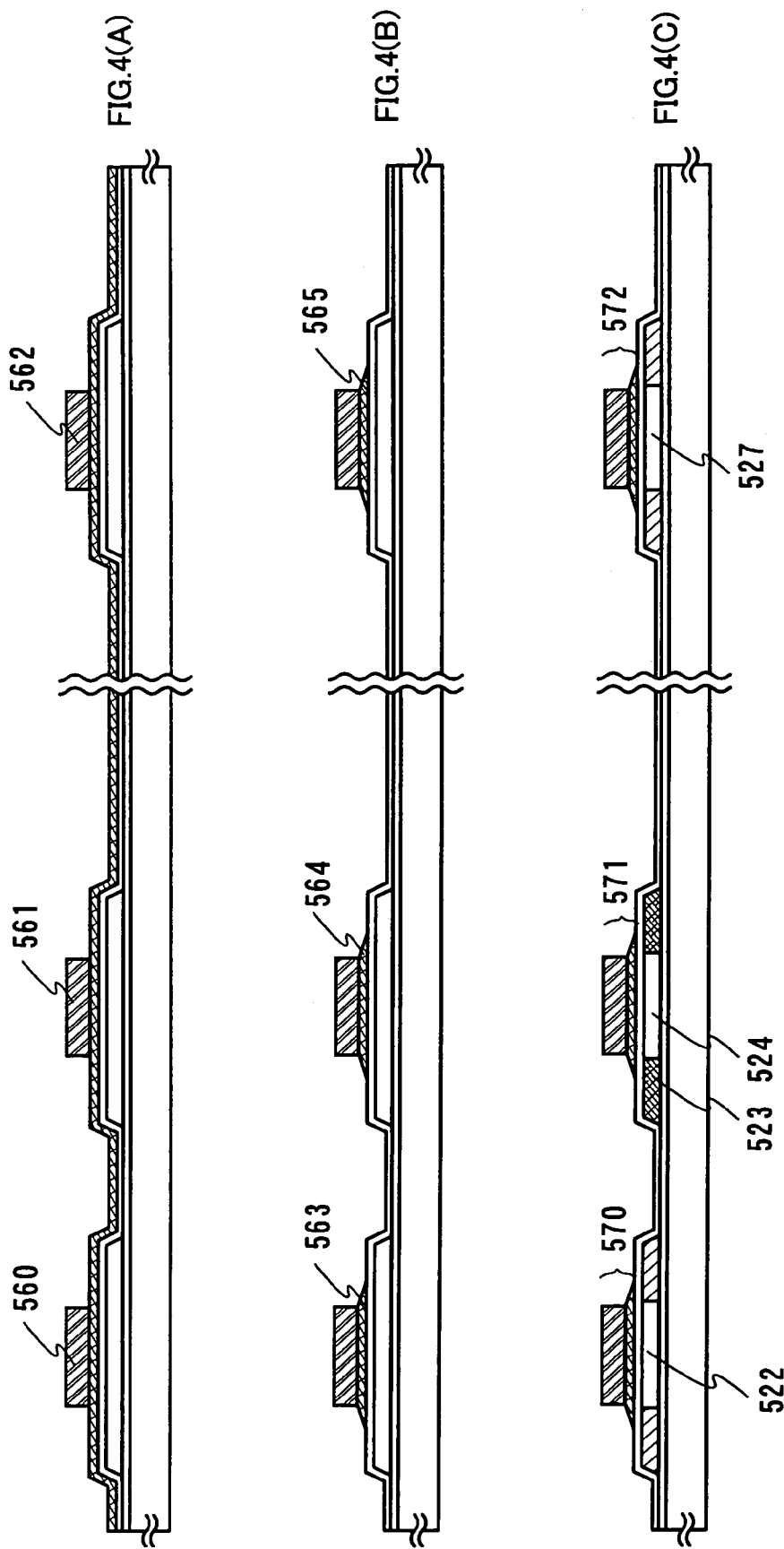
[FIG. 4] Views showing a manufacturing process of a semiconductor device of the present invention.

The second conductive film 512 is etched by anisotropic etching, thereby forming upper layer gate electrodes 560 to 562 (FIG. 4(A)). Then, the first conductive film 511 is etched by isotropic etching, thereby forming lower layer gate electrodes 563 to 565 (FIG. 4(B)). Accordingly, the gate electrodes 570 to 572 are formed.

The gate electrodes 570 to 572 may be formed as one part of a gate wire, or the gate electrodes 570 to 572 may be connected to a gate wire which is separately formed.

The gate electrodes 570 to 572 or a resist which is formed and patterned may be used as a mask, and then an impurity imparting one conductivity (n-type or p-type conductivity) is added to the island semiconductor films 507 to 509 respectively so as to form a source region, a drain region and a low concentration impurity region.

Phosphorus (P) is introduced into the island shape semiconductor films under the following condition: accelerating voltage is 60 to 120 keV and a dose amount is $1 \times 10^{13}$ to $1 \times 10^{15}$ cm$^{-2}$, by using phosphine ($PH_3$). When introducing the impurity, n-channel TFTs 550 and 552 and channel formation regions 522 and 527 are formed.

In order to manufacture a p-channel TFT 551, Boron (B) is introduced into the island shape semiconductor films under the following condition: applied voltage is 60 to 100 keV, for example, 80 keV, and a dose amount is $1 \times 10^{13}$ to $5 \times 10^{15}$ cm$^{-2}$, for example, $3 \times 10^{15}$ cm$^{-2}$, by using diborane ($B_2H_6$). Therefore, a source region or drain region 523 of the p-channel TFT and a channel formation region 524 are formed when introducing the impurity (FIG. 4(C)).

Then, the insulating film 510 is patterned so as to form gate insulating films 580 to 582.

After forming the gate insulating films 580 to 582, phosphorus (p) is introduced into island shape semiconductor films which become n-channel TFTs 550 and 552 under the following condition: applied voltage is 40 to 80 keV, for example, 50 keV, and a dose amount is $1.0 \times 10^{15}$ to $2.5 \times 10^{16}$ cm$^{-2}$, for example, $3.0 \times 10^{15}$ cm$^{-2}$, by using phosphine ($PH_3$). Accordingly, low concentration impurity regions 521 and 526 of n-channel TFTs, and source or drain regions 520 and 525 can be formed (FIG. 5(A)).

In the embodiment, phosphorus (P) is included in each the source or drain regions 520 and 525 of the n-channel TFTs 550 and 552 at the concentration of $1 \times 10^{19}$ to $5 \times 10^{21}$ cm$^{-3}$. Further, phosphorus (P) is included in each the low concentration impurity regions 521 and 526 of the n-channel TFTs 550 and 552 at the concentration of $1 \times 10^{18}$ to $5 \times 10^{19}$ cm$^{-3}$. Furthermore, Boron (B) is included in the source or drain region 523 of the p-channel TFT 551 at the concentration of $1 \times 10^{19}$ to $5 \times 10^{21}$ cm$^{-3}$.

Then, a first interlayer insulating film 530 is formed while covering the island shape semiconductor films 507 to 509 and gate electrodes 570 to 572 (FIG. 5(B)).

The first interlayer insulating film 530 is formed by a plasma CVD method or a sputtering method using an insulating film including silicon, for example, silicon oxide film (SiO), silicon nitride film (SiN), silicon oxide film including nitrogen (SiON), or a laminated film thereof. Needless to say, the first interlayer insulating film 530 is not limited to the silicon oxide film including nitrogen or silicon nitride film, or the laminated film thereof, and an insulating film including other silicon having a single layer structure or a laminated structure may be used.

In this embodiment, after introducing an impurity, silicon oxide film including nitrogen (SiON film) is formed with a film thickness of 50 nm by a plasma CVD method, the impurity is activated by a laser irradiation method described in the embodiment mode or other laser irradiation methods. Alternatively, after forming a silicon oxide film including nitrogen, it may be heated at 550° C. for four hours to activate the impurity.

A silicon nitride film (SiN film) is formed with a film thickness of 50 nm by a plasma CVD method, and then, silicon oxide film including nitrogen film (SiON film) is formed with a film thickness of 600 nm. The laminated film formed of the silicon oxide film including nitrogen, silicon nitride film, and the silicon oxide film including nitrogen is the first interlayer insulating film 530.

The whole is heated at 410° C. for one hour and hydrogenation is carried out by releasing hydrogen from the silicon nitride film.

A second interlayer insulating film 531 which functions as a planarizing film is formed while covering the first interlayer insulating film 530.

As the second interlayer insulating film 531, a photosensitive or nonphotosensitive organic material (polyimide, acryl, polyamide, polyimide amide, resist or benzocyclobutene), siloxane, or a laminated film thereof can be used. As the organic material, a positive photosensitive organic resin or a negative photosensitive organic resin can be used.

Note that siloxane is constructed by a skeletal structure of the combination of silicon (Si) and oxygen (O), and its substitute contains an organic group at least including hydrogen (for example an alkyl group, aromatic hydrocarbon). As the constituent, a fluoro group may be used. And as the substituent, an organic group containing at least hydrogen, and a fluoro group may be used.

In this embodiment, siloxane is formed by a spin coating method as the second interlayer insulating film 531.

The first interlayer insulating film 530 and the second interlayer insulating film 531 are etched, and contact holes reaching the island shape semiconductor films 507 to 509 are formed in the first interlayer insulating film 530 and the second interlayer insulating film 531.

A third interlayer insulating film is formed on the second interlayer insulating film 531 and contact holes may be formed in the first interlayer insulating film to the third interlayer insulating film. As the third interlayer insulating film, a film which hardly transmits moisture and oxygen is used. Typically, a silicon nitride film, a silicon oxide film, a silicon nitride film including oxygen (SiNO film (composition ratio N>O) or SiON film (composition ratio N<O)), a thin film mainly including carbon (for example, DLC film, CN film), and the like can be used.

A third conductive film is formed over the second interlayer insulating film 531 through a contact hole, and the third conductive film is patterned, thereby forming electrodes or wirings 540 to 544.

In this embodiment mode, a metal film is used as the third conductive film. A film composed of an element of aluminum (Al), titanium (Ti), molybdenum (Mo), tungsten (W) or silicon (Si), or an alloy film using the element thereof is used as the metal film. In this embodiment, titanium film (Ti), titanium nitride film (TiN), silicon-aluminum alloy film (Al—Si), titanium film (Ti) are laminated with a film thickness of 60 nm, 40 nm, 300 nm, 100 nm, respectively, and then patterned and etched to the desired shape, so as to form the electrodes or the wirings 540 to 544.

Further, the electrodes or the wirings 540 to 544 may be formed of at least one kind of an element selected from nickel, cobalt, and iron, or an aluminum alloy film including carbon. Such aluminum alloy film can prevent the counter diffusion of silicon and aluminum when the film is in contact with silicon. Oxidation-reduction reaction is not generated when such aluminum alloy film is in contact with a transparent conductive film, for example, ITO (Indium Tin Oxide), therefore, the aluminum alloy film can have contact with the transparent conductive film directly. Such aluminum alloy film has low specific resistance and superior heat-resistance, thereby being useful for a material of a wiring.

Each of the electrodes and the wirings 540 to 544 may be formed of the same material and by the same process, or the electrodes and the wirings are formed separately, and then connected.

By the series of processes, a CMOS circuit 553 including an n-channel TFT 550 and a p-channel TFT 551, and a semiconductor device including an n-channel TFT 552 can be formed (FIG. 5(C)). A method for manufacturing the semiconductor device of the invention is not limited to the above manufacturing process, which is done after forming the island shape semiconductor film. By using the island shape semiconductor film crystallized by a laser irradiation method of the invention as an active layer of the TFT, variation in mobility between elements, threshold voltage, and on-current can be controlled.

In this embodiment, an example of applying a laser irradiation method for crystallizing a semiconductor film according to the invention is shown; however the method may be applied for activating an impurity element with which an island shape semiconductor film is doped.

This embodiment can be freely combined with any description in embodiment mode if necessary.

Embodiment 2

In this embodiment, an example of manufacturing a liquid crystal display device (LCD) is shown with reference to FIGS. 6, 7, 8, 9, and 18(A) and 18(B).

The method for manufacturing a display device described in this embodiment is a method for manufacturing a pixel portion including a pixel TFT and a TFT of drive circuit portion provided for the periphery thereof. However, for brief description, a CMOS circuit that is a basic unit concerning a drive circuit is shown.

Figure 5:
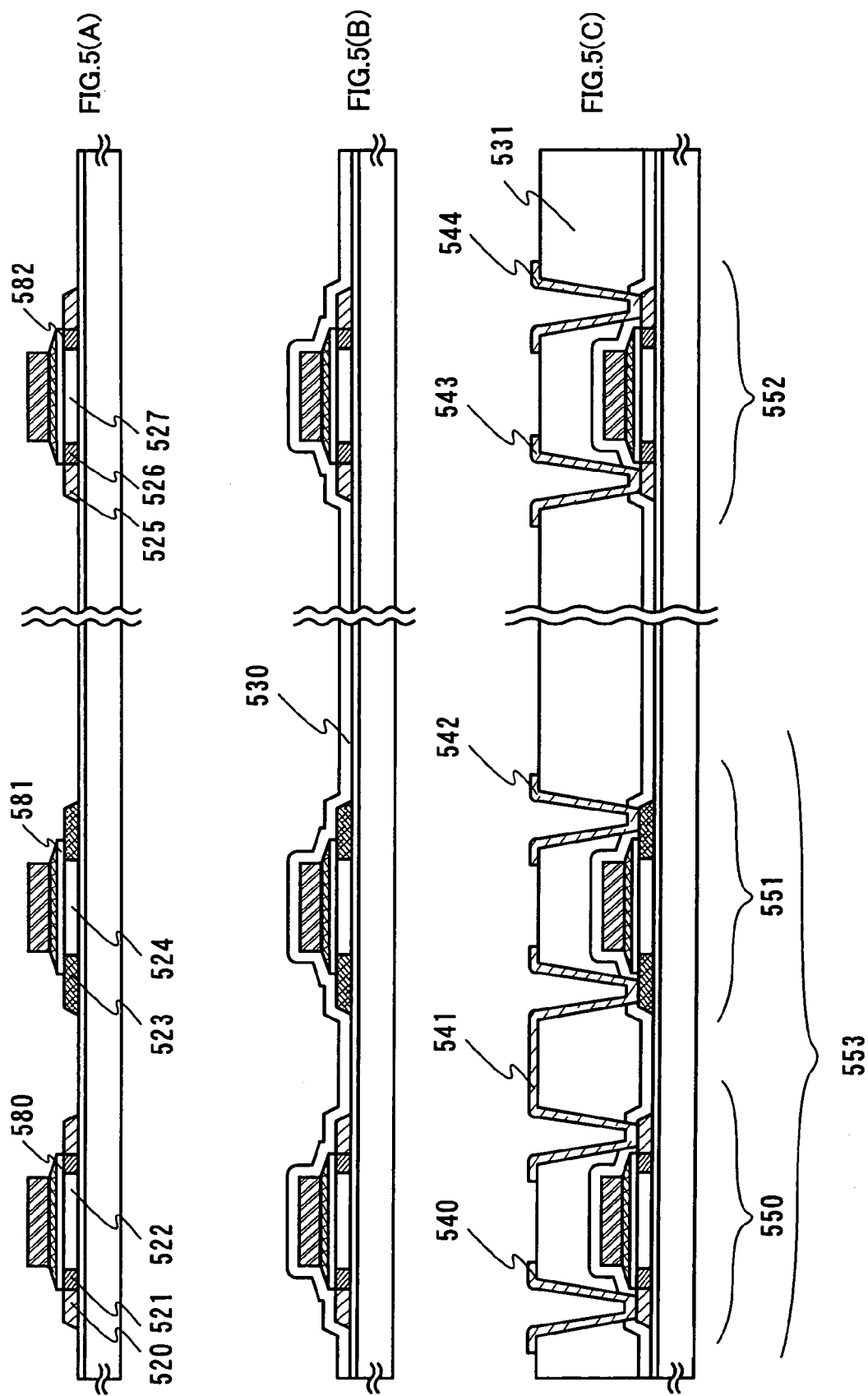
[FIG. 5] Views showing a manufacturing process of a semiconductor device of the present invention.

First, based on Embodiment 1, the processes up to forming electrodes and wirings 540 to 544 in FIG. 5 (C) are carried out. The same symbol is used in the part corresponding with Embodiment 1.

Then, a third interlayer insulating film 610 is formed over the second interlayer insulating film 531 and the electrodes or the wirings 540 to 544. Note that the third interlayer insulating film 610 can be formed using the same material as the one used for the second interlayer insulating film 531.

A resist mask is formed using a photomask, and one part of the third interlayer 610 is removed by dry etching to form a contact hole. For forming the contact hole, carbon tetrafluoride ($CF_4$), oxygen ($O_2$) and helium (He) are used at a flow rate of 50 sccm, 50 sccm, and 30 sccm, respectively. Note that the bottom of the contact hole reaches the electrode or the wiring 544.

Figure 6:
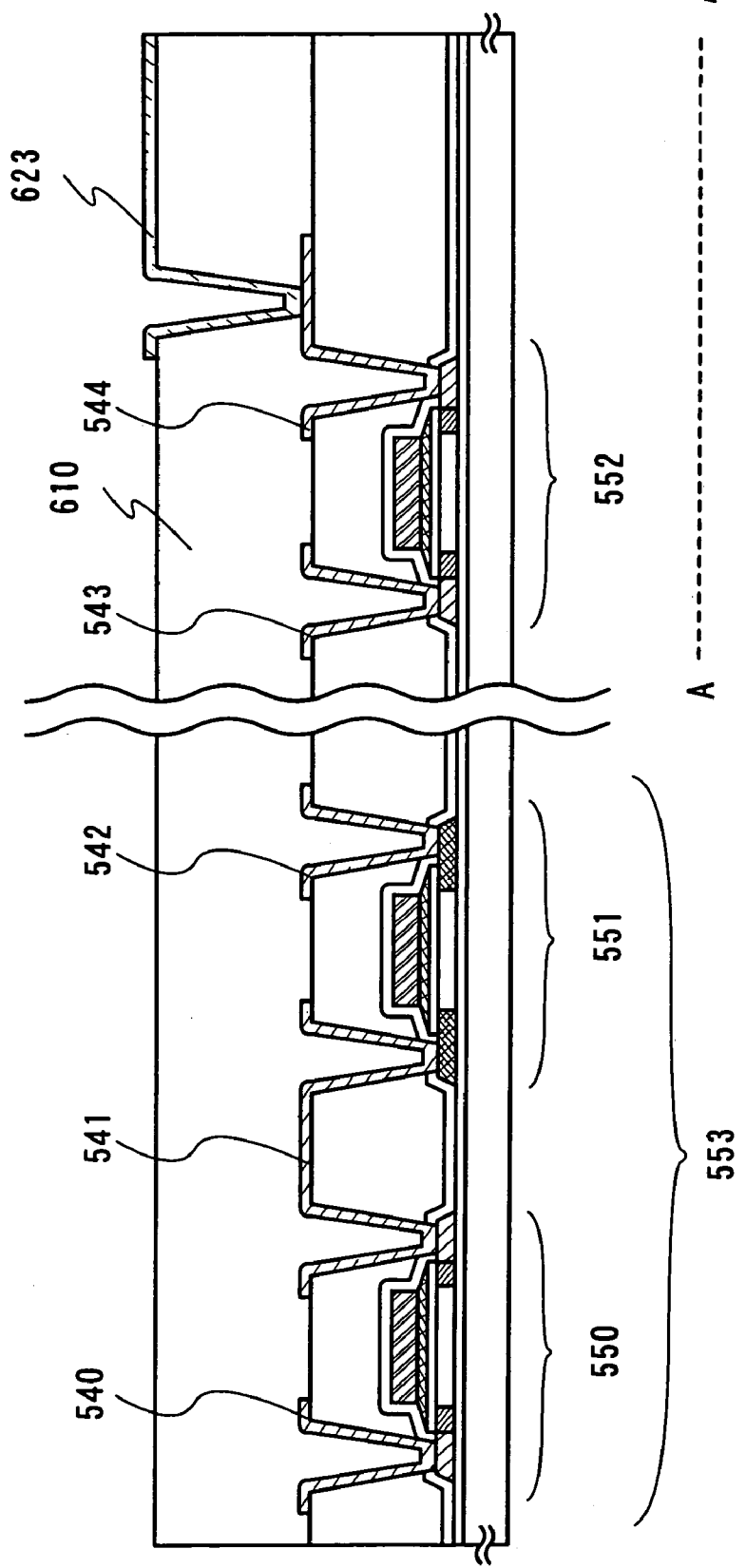
[FIG. 6] A view showing a manufacturing process of a liquid crystal display device of the present invention.

Then, after removing the resist mask, a second conductive film is formed over the whole surface. By using a photo mask, the second conductive film is patterned to form a pixel electrode 623 which is electrically connected to the electrode or the wiring 544 (FIG. 6). In this embodiment, a reflective type liquid crystal display panel is manufactured. Thus, a metal material having light reflectivity such as Ag (silver), Au (Aurum), Cu (copper), W (tungsten), Al (Aluminum) or the like is used for forming the pixel electrode 623 by sputtering.

When manufacturing a transparent liquid crystal display panel, a transparent conductive film such as indium tin oxide (ITO), indium tin oxide including silicon oxide, zinc oxide (ZnO), and tin oxide ($SnO_2$) is used for forming the pixel electrode 623.

Figure 8:
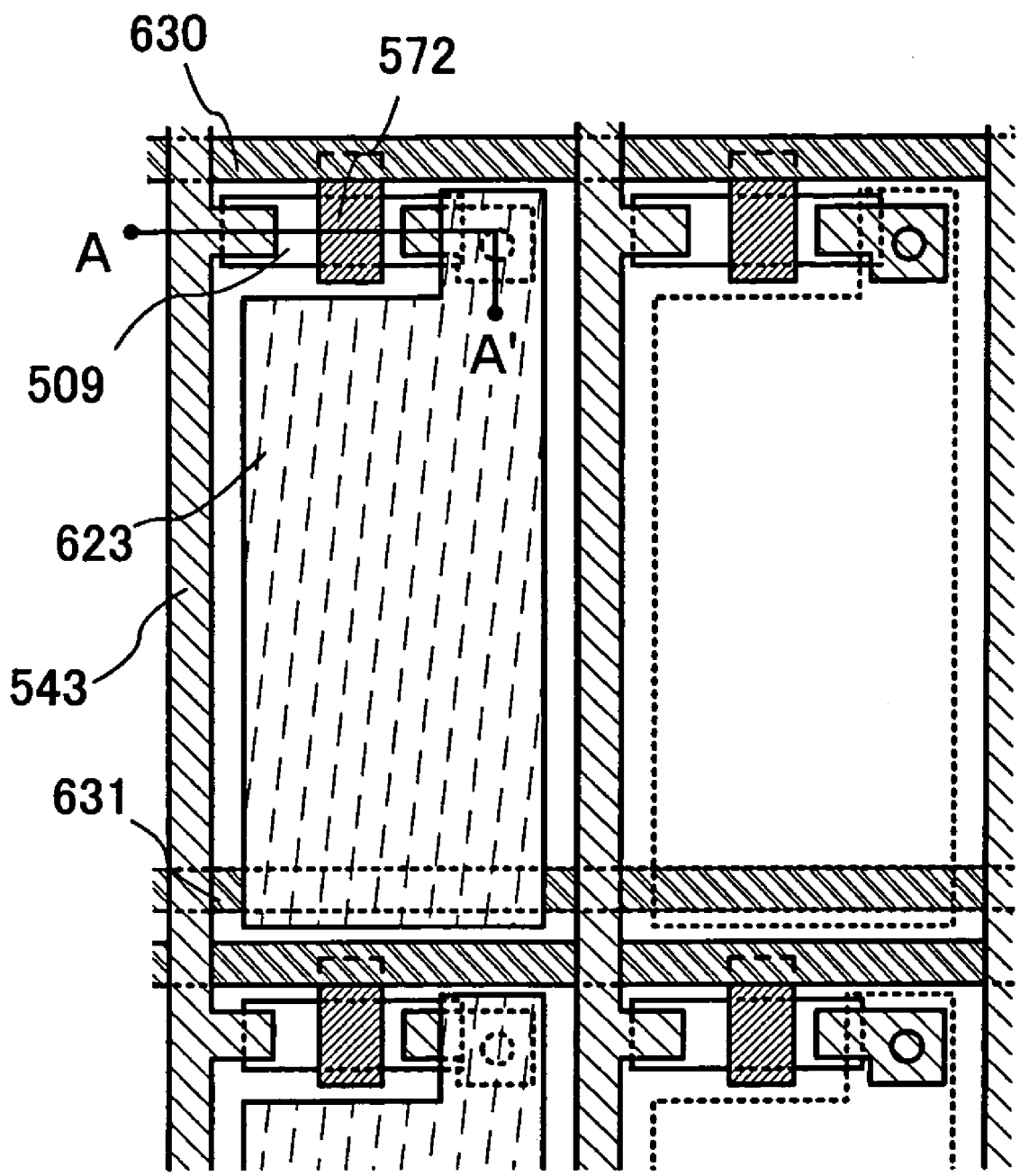
[FIG. 8] A view showing one pixel of a liquid crystal display device of the present invention.

FIG. 8 shows a top view in which one part of a pixel portion 650 including a pixel TFT is enlarged. FIG. 8 shows halfway through the formation of the pixel electrode, which shows the state that the pixel electrode is formed at the left side pixel; however not at the right side pixel. In FIG. 8, a figure cut along an actual line A-A' corresponds with a cross section of the pixel portion in FIG. 6, and the same symbol is used in the part corresponding with FIG. 6.

As shown in FIG. 8, a gate electrode 572 is connected to the gate wiring 630. Further, the electrode 543 is integrally formed with a source wiring.

A capacitance wiring 631 is provided, and a storage capacitor is formed of the pixel electrode 623 and the capacitance wiring 631 overlapped with the pixel electrode while using the first interlayer insulating film 530 as a dielectric.

In this embodiment, a region of the second interlayer insulating film 531 and the third interlayer insulating film 610 in which the pixel electrode 623 and the capacitance wiring 631 are overlapped with each other are etched. A storage capacitor is formed of the pixel electrode 623, the first interlayer insulating film 530, and the capacitance wiring 631. However, if it is possible to use the second interlayer insulating film 531 and the third insulating film 610 as dielectrics, the second interlayer insulating film 531 and the third interlayer insulating film 610 are not required to be etched. In this case, the first interlayer insulating film 530, the second interlayer insulating film 531, and the third interlayer insulating film 610 function as dielectrics. Alternatively, only the third interlayer insulating film 610 may be etched to use the first interlayer insulating film 530 and the second interlayer insulating film 531 as dielectrics.

According to the above-mentioned steps, a TFT substrate of a liquid crystal display device in which a top-gate pixel TFT 552, a CMOS circuit 553 formed of top-gate type TFTs 550 and 551, and a pixel electrode 623 are formed can be completed. In this embodiment, a top-gate TFT is formed, however a bottom gate TFT can be appropriately used.

Then, an orientation film 624a is formed so as to cover the pixel electrode 623. A droplet discharge method, a screen printing method, or an offset printing method is used for forming the orientation film 624a. Subsequently, rubbing treatment is carried out on the surface of the orientation film 624a.

Figure 7:
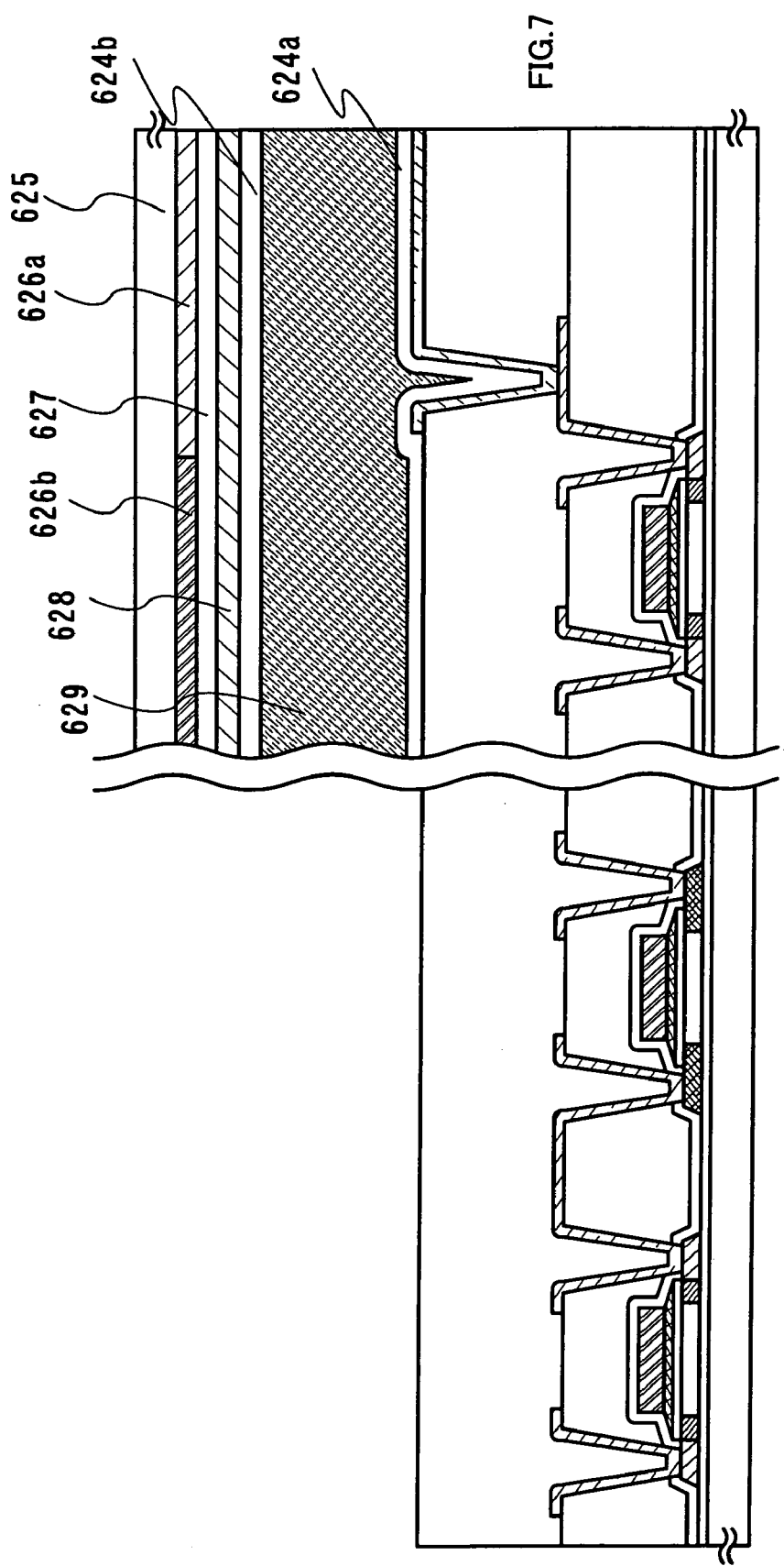
[FIG. 7] A view showing a manufacturing process of a liquid crystal display device of the present invention.

A counter substrate 625 is provided with a coloring layer 626a, a shading layer (black matrix) 626b, and a color filter composed of an over coat layer 627, and further, a counter electrode 628 composed of a transparent electrode or a reflective electrode, and an orientation film 624b formed thereon are formed (FIG. 7). A sealing member 600 that is a closed pattern is formed so as to surround a region overlapped with a pixel portion 650 including a pixel TFT by a droplet discharge method (FIG. 9(A)). Here, an example of drawing the sealing member 600 that has a closed pattern is shown for dropping a liquid crystal. However, a dipping method (a lift pump type) for injecting a liquid crystal using a capillary phenomenon after providing a sealing pattern having an opening portion and sticking the substrate 500 thereon may be used.

Figure 9A:
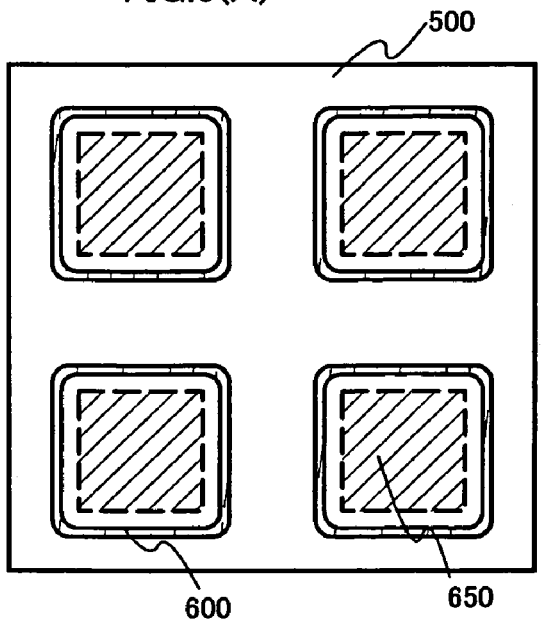
[FIG. 9] Views showing a manufacturing process of a liquid crystal display device of the present invention.
Figure 9B:
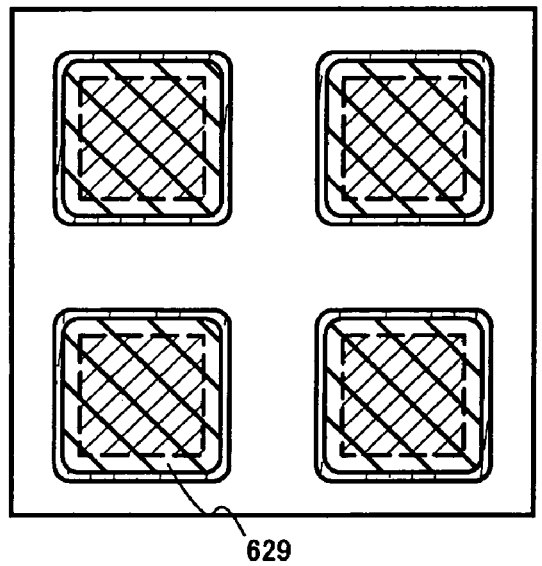
Figure 9C:
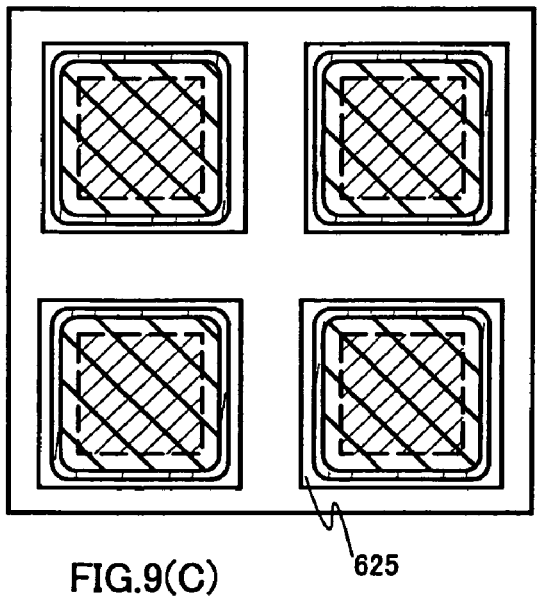
Figure 9D:
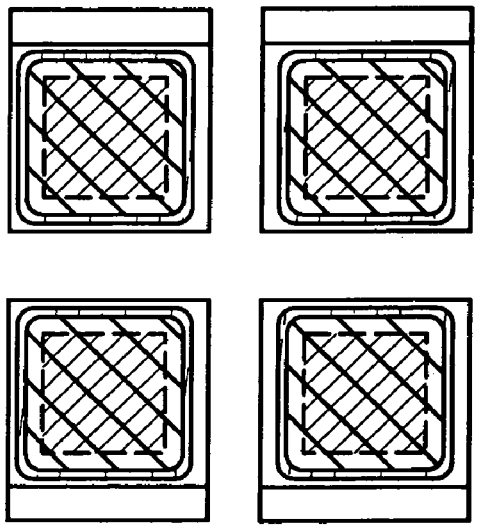

The liquid crystal 629 is dropped under reduced pressure so that air bubble is not entered (FIG. 9(B)), and both substrates 500 and 625 are stuck together (FIG. 9(C)). The liquid crystal is dropped once or multiple times in the sealing pattern of a closed-loop. As an orientation mode of the liquid crystal 629, it is often the case that a TN mode in which liquid crystal molecules are arranged while being twisted at the angle of 90° from the incident entrance to exit of light, is used. When manufacturing the liquid crystal display device of the TN mode, the substrates are stuck together so that the rubbing direction of the substrate is perpendicular.

An interval between a pair of substrates is maintained by dispersing a spherical type spacer, forming a columnar spacer composed of a resin, or putting filler in the sealing member 600. The columnar spacer is an organic resin material containing at least one of acrylic, polyimide, polyimide amide, or an epoxy as the main component, a material selected from any one of silicon oxide, silicon nitride, or silicon oxide containing nitrogen, or an inorganic material composed of the laminated film thereof.

Subsequently, the substrate is divided. When applying multiple patterns, each of the panel is divided. When applying a pattern, dividing process can be omitted by pasting a counter substrate which has already cut (FIG. 9(D)).

An FPC (Flexible Printed Circuit) is stuck through an anisotropic conductive layer using a known technique. According to the above mentioned steps, a liquid crystal display device is completed. Further, an optics film is stuck if necessary. When manufacturing a transparent liquid crystal display device, a polarizing plate is stuck on both the TFT substrate and the counter substrate.

Figure 18A:
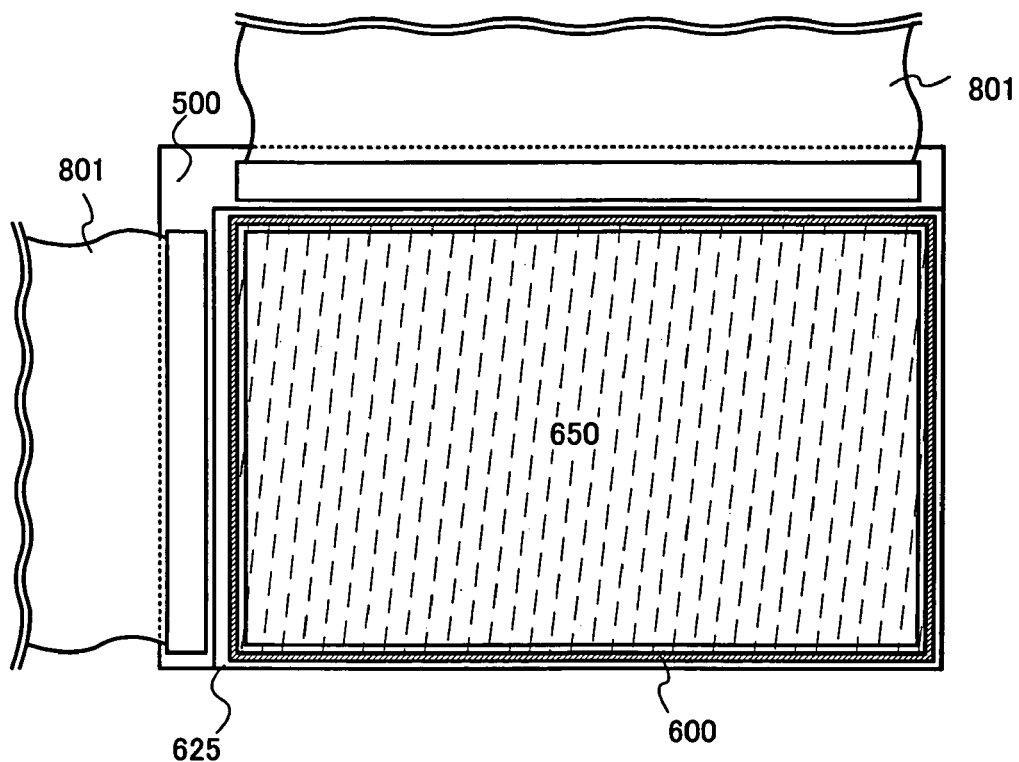
[FIG. 18] Views showing a manufacturing process of a liquid crystal display device of the present invention.

A top view of the liquid crystal display device obtained according to the steps stated above is shown in FIG. 18(A), and an example of a top view of another liquid crystal display device is shown in FIG. 18 (B).

In FIG. 18 (A), reference numeral 500 denotes a TFT substrate, 625 denotes a counter substrate, 650 denotes a pixel portion, 600 denotes a sealing member, and 801 denotes a FPC. Note that liquid crystal is ejected by a droplet discharge method, and one pair of substrates 500 and 625 is stuck together with the sealing member 600 under reduced pressure.

Figure 18B:
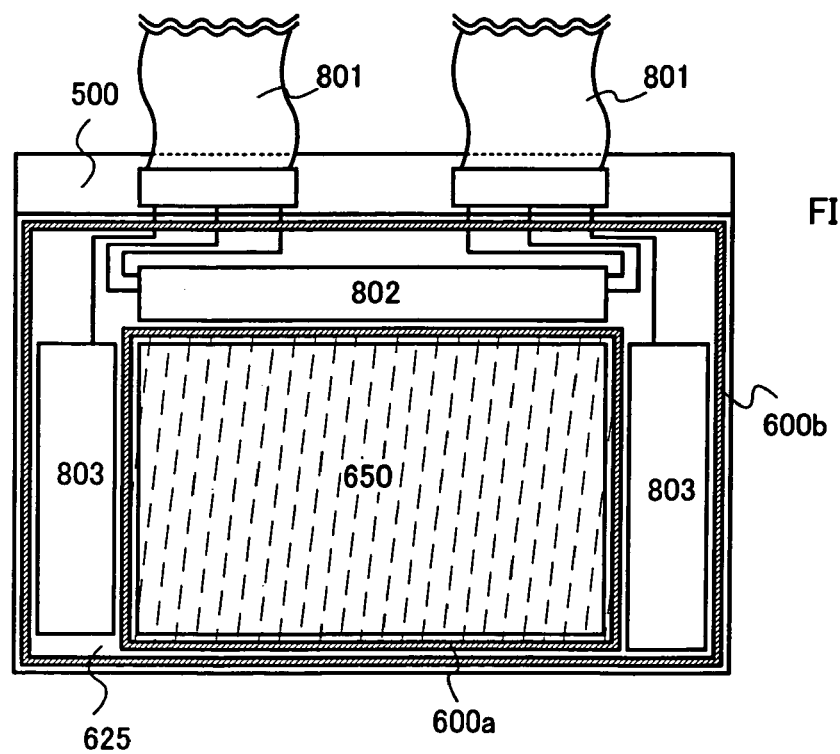

In FIG. 18(B), reference numeral 500 denotes a TFT substrate, 625 denotes a counter substrate, 802 denotes a source signal line drive circuit, 803 denotes a gate signal line drive circuit, 650 denotes a pixel portion, 600a denotes a first sealing member, and 801 denotes an FPC. Note that liquid crystal is ejected by a droplet discharge method, and one pair of substrates 500 and 625 is stuck together with the first sealing member 600a and the second sealing member 600b. The liquid crystal is held only in the pixel portion 650 since a liquid crystal is not necessary in the drive circuit portions 802 and 803. And the second sealing member 600b is provided for strengthening the whole panel.

As described above, in this embodiment, a liquid crystal display device can be manufactured using a TFT including a crystalline semiconductor film which is crystallized by the laser processing method of the invention. Accordingly, a manufacturing time and a cost for manufacturing can be reduced. The liquid crystal display device manufactured according to this embodiment can be used as a display portion of each kind of electronic devices.

In this embodiment, a top gate TFT is used as a TFT, however, the structure is not limited thereto. And, a bottom gate (inversely staggered) TFT or a staggered TFT can be used. Further, it is not limited to the TFT having a single gate structure, and multi-gate TFT, for example, a double gate TFT may be used.

The present invention can be freely combined with any description in embodiment mode and Embodiment 1, if necessary.

Embodiment 3

In this embodiment, an example for applying a droplet discharge method for dropping a liquid crystal is shown. In this embodiment, a large area substrate 1110 is used, and a manufacturing method by which 4 panels can be obtained from one substrate is shown in FIG. 10(A) to 10(D), FIGS. 11(A) and 11(B) and FIGS. 12(A) and 12(B).

FIG. 10(A) shows a cross sectional view in process of forming a liquid crystal layer by a dispenser (or ink jet). A liquid crystal material 1114 is discharged, sprayed, or dropped from a nozzle 1118 of a droplet discharge device 1116 so as to cover a pixel portion 1111 that is surrounded by a sealing member 1112. The droplet discharge device 1116 is moved in direction of an arrow in FIG. 10(A). Note that, the nozzle 1118 is moved here; however, a liquid crystal layer may be formed by fixing the nozzle and moving the substrate.

FIG. 10(B) shows a perspective view. The liquid crystal material 1114 is selectively discharged, sprayed, or dropped only over the region surrounded by the seal member 1112, and an object surface 1115 is moved correspondingly to a nozzle scan direction 1113.

FIGS. 10(C) and 10(D) show enlarged cross sectional view of a region 1119 surrounded by a dotted line in FIG. 10(A). When the liquid crystal material has high viscosity, it is discharged continuously and applied in a manner where each droplet of the liquid crystal material is joined to one another as shown in FIG. 10(C). On the other hand, when the viscosity of the liquid crystal material has low viscosity, it is discharged intermittently and the droplets are dropped as shown in FIG. 10(D).

In FIG. 10(C), reference numeral 1120 denotes a top gate TFT and 1121 denotes a pixel electrode, respectively. The pixel portion 1111 is formed of a pixel electrode arranged in matrix; a switching element being connected to the pixel electrode; a top gate TFT used here; and a storage capacitor.

The top gate TFT is used in this embodiment; however a bottom gate TFT may be also used.

The flow of manufacturing a panel is described below with reference to FIGS. 11(A) and 11(B), and FIGS. 12(A) and 12(B).

Figure 11A:
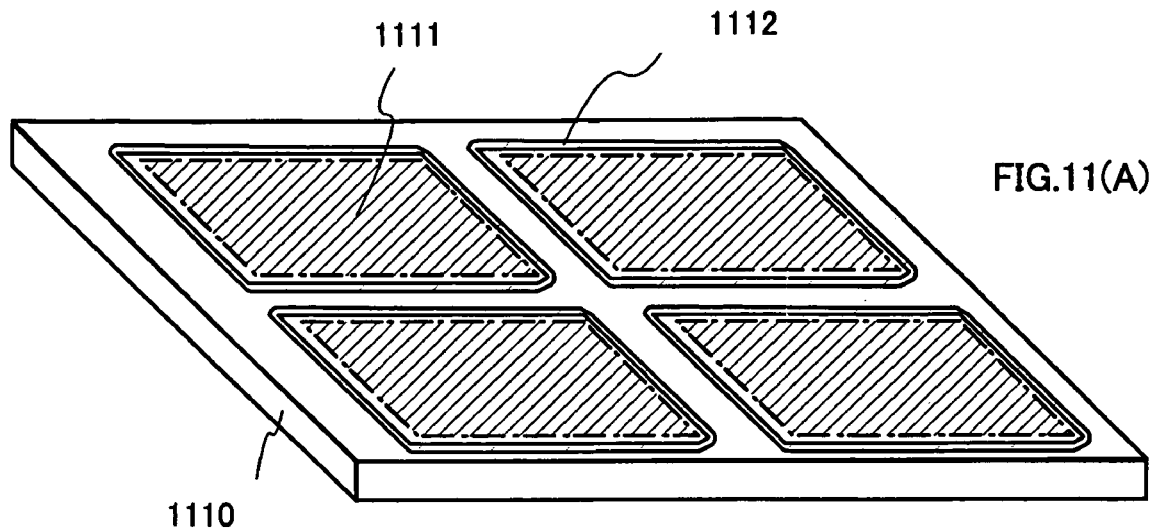
[FIG. 11] Views showing a manufacturing process of a liquid crystal display device with the use of a liquid crystal dropping method of the present invention.
Figure 11B:
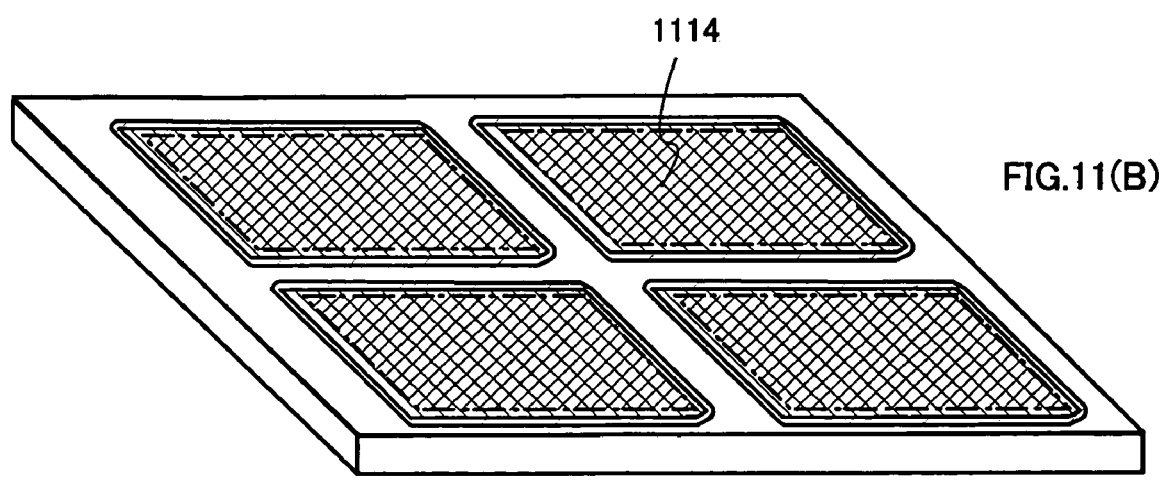

First, a first substrate 1110 in which a pixel portion 1111 is formed on its insulating surface is prepared. The first substrate 1110 is pretreated with the following steps: forming an alignment layer, rubbing, dispersing spherical spacers, forming a column spacer or a color filter, or the like. Subsequently, a sealing member 1112 is formed on a predetermined position (a pattern surrounding the pixel portion 1111) over the first substrate 1110 in an inert atmosphere or under reduced pressure by a dispenser or an ink-jet system, as shown in FIG. 11(A). A material containing a filler (diameter of 6 μm to 24 μm), which has a viscosity of 40 to 400 Pa·s, is used for the sealing member 1112 that is translucent. Note that, it is preferable to select a sealing material that is insoluble in a liquid crystal to be in contact therewith. A photo curing acrylic resin or a thermosetting acrylic resin may be used for the sealing member 1112. Further, the sealing member 1112 can be formed by a printing method due to its simple seal pattern.

Subsequently, a liquid crystal 1114 is applied to a region surrounded by the sealing member 1112 by an ink-jet method (FIG. 11 (B)). A known liquid crystal material with the viscosity that allows discharging by an ink-jet method may be used for the liquid crystal 1114. Further, it is suitable to apply a liquid crystal when using an ink-jet method since the viscosity of a liquid crystal material can be controlled by adjusting its temperature. The required amount of the liquid crystal 1114 can be stored in the region surrounded by the sealing member 1112 without a loss.

The first substrate 1110 provided with the pixel portion 1111 and the second substrate 1031 provided with the counter electrode and the alignment layer are stuck together under reduced pressure without bubbles being mixed in (FIG. 12(A)). The sealing member 1112 is cured here by applying a ultra-violet irradiation or heat treatment while the substrates are stuck together. Note that, heat treatment may be carried out in addition to ultra-violet irradiation.

Figure 13A:
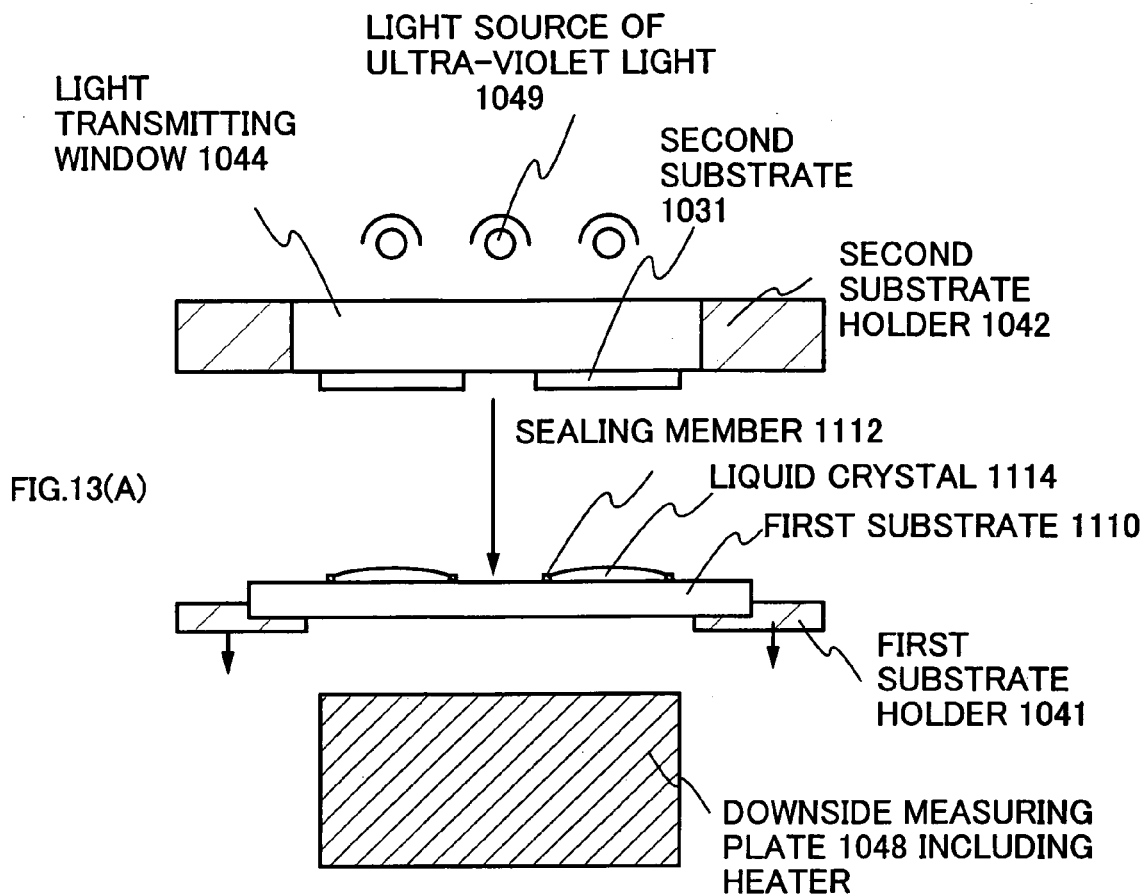
[FIG. 13] Views showing a manufacturing process of a liquid crystal display device with the use of a liquid crystal dropping method of the present invention.
Figure 13B:
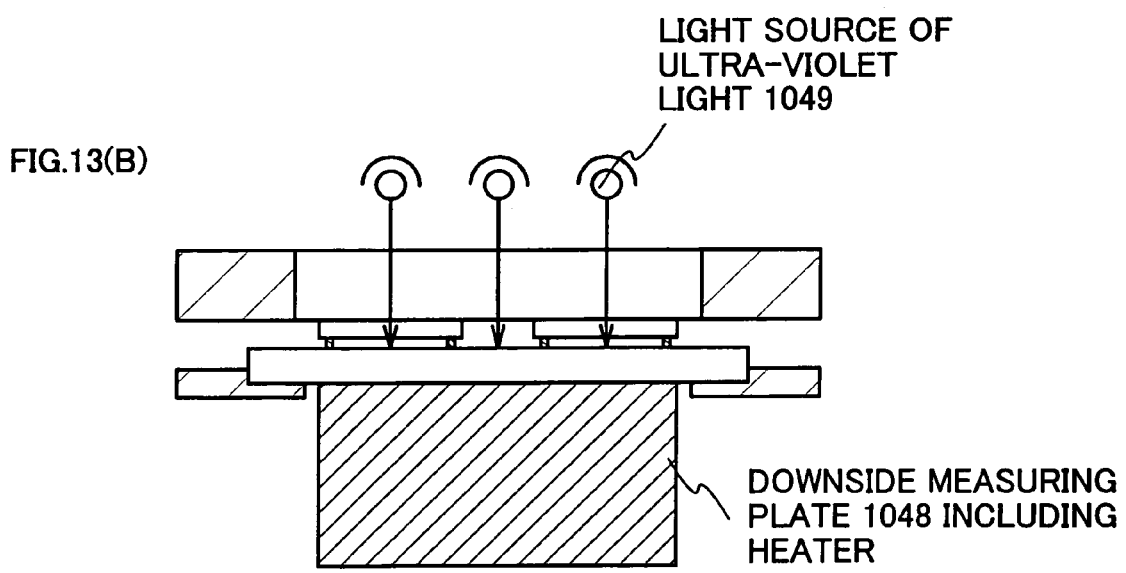
Figure 16:
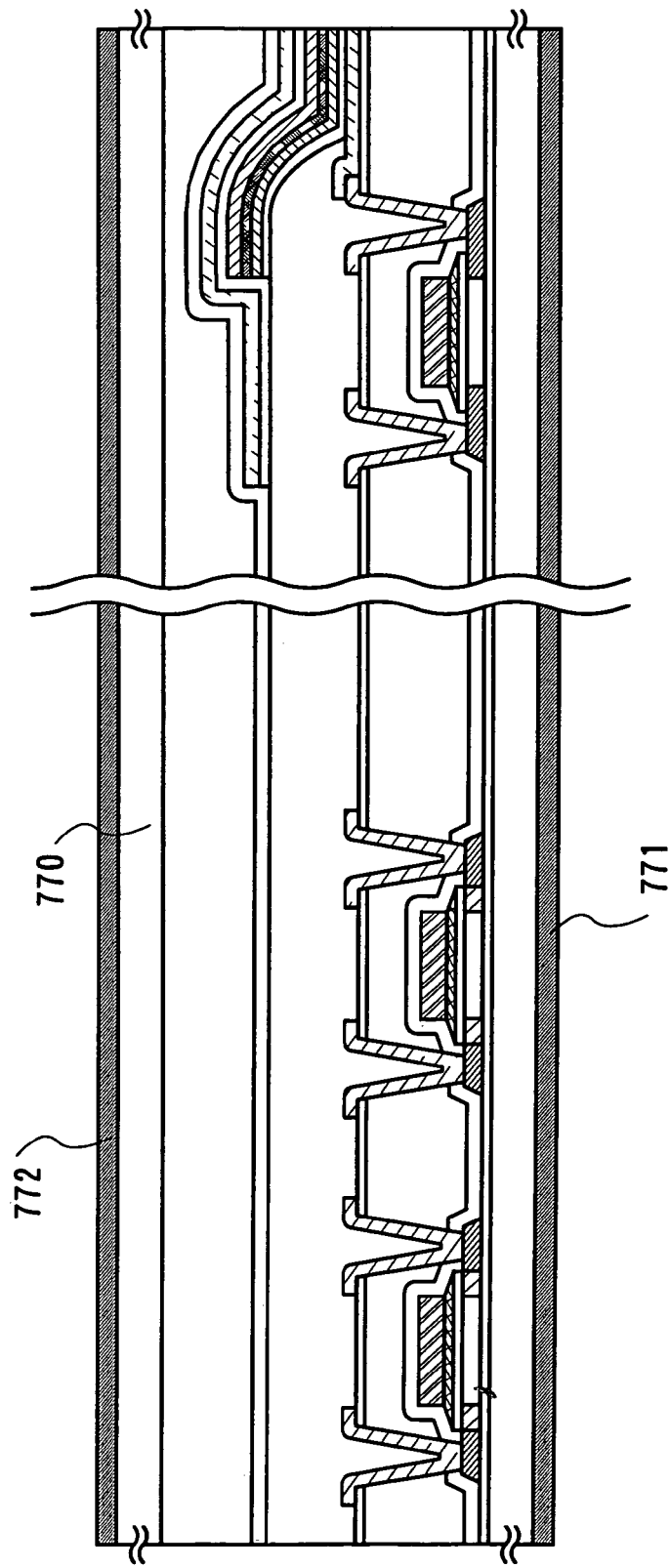
[FIG. 16] A view showing a manufacturing process of an EL display device of the present invention.

FIGS. 13(A) and 13(B) show an example of a bonding device that is capable of ultra-violet irradiation or heat treatment while or after the substrates are stuck together.

In FIGS. 13(A) and 13(B), reference numeral 1041 denotes a first substrate holder, 1042 denotes a second substrate holder, 1044 denotes a light transmitting window, 1048 denotes a downside measuring plate, and 1049 denotes a light source of ultra-violet light. Note that, the same reference numerals in FIGS. 13(A) to 13(B) are used for the corresponding parts in FIGS. 10(A) to 10(D), FIGS. 11(A) and 11(B) and FIGS. 12(A) and 12(B).

The downside measuring plate 1048 includes a heater, which cures the sealing member 1112. The second substrate holder 1042 is provided with the light-transmitting window 1044, so that ultra-violet light or the like from the light source 1049 can transmit therethrough. Although it is not illustrated here, a position alignment of the substrate is performed through the window 1044. The second substrate 1031 that is to be a counter substrate is cut into a desirable size and fixed to the second substrate holder 1042 with a vacuum chuck or the like. FIG. 13(A) shows a state prior to pasting.

On the occasion of pasting, after the first substrate holder 1041 and the second substrate holder 1042 are lowered, the first substrate 1110 and the second substrate 1031 are stuck together by pressure, and cured by being irradiated with ultraviolet light. A state after pasting is shown in FIG. 13(B).

Next, the first substrate 1110 is cut by means of a cutting machine such as a scriber, a breaker, or a circular saw (FIG. 12(B)). Thus, four panels can be manufactured from one substrate. And an FPC is stuck thereon by using a known technique.

Note that, the first substrate 1110 and the second substrate 1031 can be formed from a glass substrate, a quartz substrate, or a plastic substrate.

This embodiment can be freely combined with any description in embodiment mode, and Embodiment 1 and 2 if necessary.

Embodiment 4

In this embodiment, an example of manufacturing a dual emission type display device according to the present invention is shown with reference to FIG. 14(A) to 14(C), FIGS. 15(A) and 15(B), FIG. 16, and FIG. 17.

Island shape semiconductor films 507 to 509 shown in FIG. 3(C) are formed based on Embodiment 1. Note that the same symbol is used in the part corresponding with Embodiment 1.

Then, an impurity is introduced into island shaped semiconductors 507 to 509 for controlling a threshold value. In this embodiment, diborane ($B_2H_6$) is doped so as to introduce boron (B) into the island shape semiconductor films.

An insulating film 700 is formed so as to cover the island shape semiconductor films 507 to 509. Silicon oxide (SiO), silicon nitride (SiN), silicon oxide including nitrogen (SiON), or the like can be used for the insulating film 700. Further, a plasma CVD method, a sputtering method, or the like can be used for forming films.

After forming a conductive film over the insulating film 700, gate electrodes 707 to 709 are formed by pattering the conductive film.

The gate electrodes 707 to 709 are formed by employing a single layer structure of a conductive film or a structure in which two or more conductive films are stacked. When two or more layers of the conductive film are stacked, the gate electrodes 707 to 709 may be formed by stacking an element selected from tantalum (Ta), tungsten (W), titanium (Ti), molybdenum (Mo), and aluminum (Al); or an alloy material or a compound material containing the element as the main component. In addition, the gate electrodes may be formed by using a semiconductor film typified by a polycrystalline silicon film doped with an impurity element such as phosphorus (P).

In this embodiment mode, the gate electrodes 707 to 709 are formed by using a laminated film in which tantalum nitride (TaN) 105a and tungsten (W) are each stacked in a thickness of 30 nm and 370 nm. In this embodiment, upper layer gate electrodes 701 to 703 are formed using tungsten (W), and lower layer gate electrodes 704 to 706 are formed using tantalum nitride (TaN).

The gate electrodes 707 to 709 may be formed as a part of a gate wiring. However, a gate wiring may be formed separately, and then the gate electrodes 707 to 709 are connected to the gate wiring.

The gate electrodes 707 to 709, or a resist which is formed and patterned is used as a mask, and an impurity imparting n-type or p-type conductivity is added to the island shape semiconductor films 507 to 509, thereby forming a source region, a drain region, a low concentration impurity region, and the like.

Phosphorus (P) is introduced into the island shape semiconductor films by using phosphine ($PH_3$) under the following condition: accelerating voltage of 60 to 120 keV, a dose amount of $1\times10^{13}$ to $1\times10^{15}$ $cm^{-2}$. Channel formation regions 713 and 716 of n-channel TFTs 761 and 762 are formed by introducing the impurity.

In order to manufacture a p-channel TFT, boron (B) is introduced into the island shape semiconductor films by using diborane ($B_2H_6$) under the following condition: applied voltage of 60 to 120 keV, for example, 80 keV a dose amount of $1\times10^{13}$ to $5\times10^{15}$ $cm^{-2}$, for example, $3\times10^{15}$ $cm^{-2}$. Accordingly, a source or a drain region 717 of a p-channel TFT 763, and a channel formation region 718 are formed by introducing the impurity (FIG. 14(A)).

Then, the insulating film 700 is patterned, thereby forming gate insulating films 721 to 723.

After forming the gate insulating films 580 to 582, phosphorus (P) is introduced into the island shape semiconductor films 507 and 508 by using phosphine ($PH_3$) under the following condition: accelerating voltage of 40 to 80 keV, for example, 50 keV, a dose amount of $1.0\times10^{15}$ to $2.5\times10^{16}$ $cm^{-2}$, for example, $3.0\times10^{15}$ $cm^{-2}$. Accordingly, low concentration impurity regions 712 and 715, source regions or drain regions 711 and 714 of the n-channel TFTs 761 and 762 are formed (FIG. 14(B)).

In this embodiment, phosphorus (P) is included at the concentration of $1\times10^{19}$ to $5\times10^{21}$ $cm^{-3}$ in the source regions or drain regions 711 and 714 of the n-channel TFTs 761 and 762. Phosphorus (P) is included at the concentration of $1\times10^{18}$ to $5\times10^{19}$ $cm^{-3}$ in each low concentration impurity regions 712 and 715 of the n-channel TFTs 761 and 762. And boron (B) is included in the source or drain region 717 of the p-channel TFT 763 at the concentration of $1\times10^{19}$ to $5\times10^{21}$ $cm^{-3}$.

In this embodiment, the p-channel TFT is used as a pixel TFT of the dual emission type display device. And the n-channel TFTs 761 and 762 are used as a drive circuit for driving the pixel TFT 763. However, the pixel TFT is not necessarily a p-channel TFT, and may be an n-channel TFT. Furthermore, the drive circuit is not necessarily a circuit formed by combining a plurality of n-channel TFTs, and may be a circuit formed by combining an n-channel TFT and p-channel TFT in a complementary style, or a circuit combining a plurality of p-channel TFTs.

Then, an insulating film 730 including hydrogen is formed and activation of an impurity element with which the island shape semiconductor films is doped is performed. The activation of the impurity element is carried out by a laser processing method described in embodiment mode and Embodiment 1. Alternatively, after forming the insulating film including hydrogen, the film may be heated at 550° C. for 4 hours so as to activate the impurity.

A silicon oxide film including nitrogen (SiON film) obtained by a PCVD method is used as the insulating film containing hydrogen. Alternatively, a silicon nitride film including oxygen (SiNO film) may be used. In addition, gettering for reducing nickel in a channel formation region can also be performed at the same time as activation, when the semiconductor film is crystallized by using a metal element, typically, nickel which promotes crystallization. Note that the insulating film 730 containing hydrogen is a first interlayer insulating film and a light-transmitting insulating film containing silicon oxide.

Afterwards, the whole is heated at 410° C. for 1 hour, thus hydrogenation of the island shape semiconductor is performed.

Then, a planarizing film to be a second interlayer insulating film 731 is formed. A light-transmitting inorganic material (silicon oxide, silicon nitride, silicon nitride including oxygen, or the like), a photosensitive or non-photosensitive organic material (polyimide, acrylic, polyamide, polyimideamide, a resist or benzocyclobutene), a laminate of these materials, or the like is used for the planarizing film. Further, an insulating film formed of an $SiO_x$ film including an alkyl group to be obtained by an application method, for example, an insulating film made of silica glass, alkyl siloxane polymer, alkyl silsesquioxane polymer, hydrogenated silsesquioxane polymer, hydrogenated alkyl silsesquioxane polymer or the like, can be used as another light-transmitting film used for the polarizing film. There is given PSB-K1 or PSB-K31 of an insulating coating film material manufactured by Toray Industries. or ZRS-5PH of an insulating coating film material manufactured by Catalysts & Chemicals Industries. as an example of the siloxane based polymer.

Then, a third light-transmitting interlayer insulating film 732 is formed. The third interlayer insulating film 732 is provided as an etching stopper film in patterning a transparent electrode 750 to be formed in a later step so as to protect the planarizing film which is the second interlayer insulating film 731. Note that the third interlayer insulating film 732 is not required when the second interlayer insulating film 731 serves as an etching stopper film when patterning the transparent electrode 750.

A contact hole is formed in the first interlayer insulating film 730, the second interlayer insulating film 731, and the third interlayer insulating film 732 by using a new mask. Then, the mask is removed. After a conductive film (laminated film of TiN/Al/TiN) is formed, it is etched (dry-etched with a mixture gas of $BCl_3$ and $Cl_2$) using another mask to form electrodes and wirings 741 to 745 (such as a source wiring or a drain wiring of a TFT or a current supply wiring) (FIG. 14 (C)). In this embodiment, the electrodes and the wirings are formed integrally, however, the electrodes and the wirings may be formed separately, and the electrically connected each other. Note that TiN is one of materials that have a favorable adhesiveness with a highly thermostable planarizing film. In addition, it is preferable that an N content of TiN is less than 44% so as to have a favorable ohmic-contact with a source region or a drain region of the TFT.

The transparent electrode 750, that is, an anode of an organic light-emitting element is formed to be 10 nm to 800 nm thick using a new mask. A transparent conductive material having a high work function (work function of 4.0 eV or more) such as indium tin oxide including a Si element (ITSO), or indium zinc oxide (IZO) in which zinc oxide (ZnO) of 2 to 20% is mixed into indium oxide, as well as indium tin oxide (ITO) can be used for the transparent electrode 750.

An insulating material 733 (also referred to as a bank, a partition wall, a barrier, an embankment and the like) covering an edge of the transparent electrode 750 is formed using a new mask. The insulating material 733 can be made of a photosensitive or non-photosensitive organic material (polyimide, acrylic, polyamide, polyimideamide, a resist or benzocyclobutene) or an SOG film obtained by an application method (for example, a $SiO_x$ film including an alkyl group) to be 0.8 μm to 1 μm thick.

Next, layers 751, 752, 753, 754, and 755 containing an organic compound are formed by an evaporation method or an application method. It is preferable to perform vacuum heating for deaeration before forming the layer 751 containing the organic compound in order to improve reliability of a light-emitting element. For example, it is preferable to perform a heat treatment at a temperature of from 200° C. to 300° C. under a low pressure atmosphere or an inert atmosphere in order to remove a gas included in the substrate, before evaporating an organic compound material. Here, when the interlayer insulating film and the barrier are made of a highly thermostable $SiO_x$ film, a heat treatment at higher temperature (410° C.) can be conducted additionally.

A first layer 751 containing an organic compound is selectively formed on the transparent electrode 750 by a co-evaporation of molybdenum oxide (MoOx), 4,4'-bis [N-(1-naphthyl)-N-phenyl-amino]-biphenyl (α-NPD) and rubrene using an evaporation mask.

Note that a material having a favorable hole injecting property such as copper phthalocyanine (CuPC), vanadium oxide $(VO_x)$, ruthenium oxide $(RuO_x)$, or tungsten oxide $(WO_x)$ can be used as well as $MoO_x$. In addition, a film made of a high-molecular weight material (polymer material) having a favorable hole injecting property such as a poly (ethylenedioxythiophen)/poly (styrenesulfonic acid) water solution (PEDOT/PSS) by an application method may be used for the first layer 750 containing the organic compound.

α-NPD is selectively deposited using an evaporation mask to form a hole transporting layer (the second layer) on the first layer 751 containing the organic compound. A material having a favorable hole transporting property typified by an aromatic amine based compound such as 4,4'-bis [N-(3-methylphenyl)-N-phenylamino]-biphenyl (TPD), 4,4',4''-tris(N, N-diphenyl-amino)-triphenylamine (TDATA), or 4,4',4''-tris [N-(3-methylphenyl)-N-phenyl-amino]-triphenylamine (MTDATA) can be used as well as α-NPD.

A light-emitting layers 753 (the third layer) is formed selectively. The light-emitting layer is deposited selectively by aligning evaporation masks for every light emission color (R, G, B) to obtain a full-color display.

For the light-emitting layer 735R for red light-emission, a material such as $Alq_3$:DCM or $Alq_3$:rubrene:BisDCJTM is used. For the light-emitting layer 753G for green light-emission, a material such as $Alq_3$:DMQD (N,N'-dimethyl quinacridone) or $Alq_3$:coumarin 6 is used. For the light-emitting layer 753B for blue light-emission, a material such as α-NPD or tBu-DNA is used.

$Alq_3$ (tris(8-quinolinolate) aluminum) is deposited selectively using an evaporation mask to form an electron transporting layer (the fourth layer) on the light-emitting layers 753. A material having a favorable electron transporting property typified by metal complexes having a quinoline skeleton or benzoquinoline skeleton such as tris(5-methyl-8-quinolinolate)aluminum($Almq_3$), bis(10-hydroxybenzo[h]-quinolinato)beryllium($BeBq_2$), bis(2-methyl-8-quinolinolate)-4-phenyl phenolate-aluminum ($BAlq_2$) or the like can be used as well as $Alq_3$. Other examples include metal complexes having oxazole-based and thiazole-based ligands such as bis[2-(2-hydroxyphenyl)-benzoxazorato]zinc($Zn(BOX)_2$) and bis[2-(2-hydroxyphenyl)-benzothiazorato]zinc($Zn(BTZ)_2$). Further, 2-(4-biphenylyl)-5-(4-tert-butylphenyl)-1,3,4-oxadiazole(PBD), and 1,3-bis [5-(p-tert-butylphenyl)-1,3,4-oxadiazole-2-yl]benzene(OXD-7); 3-(4-tert-butylphenyl)-4-phenyl-5-(4-biphenylyl)-1,2,4-triazole(TAZ) and 3-(4-tert-butylphenyl)-4-(4-ethylphenyl)-5-(4-biphenylyl)-1,2,4-triazole(p-EtTAZ); bathophenanthroline (BPhen); bathocuproin (BCP) and the like can be used as the electron transporting layer 754 in addition to metal complexes, since they have a favorable electron transporting property.

Next, 4,4'-bis(5-methylbenzoxazol-2-yl)stilbene($B_zO_S$) and lithium (Li) are co-deposited to form an electron injecting layer (the fifth layer) 755 entirely to cover the electron transporting layer and the insulating material. Damages due to sputtering when forming the transparent electrode 756 performed in a later step can be suppressed by using benzoxazole derivatives ($B_zO_s$). Note that a compound of an alkali metal or an alkali earth metal such as $CaF_2$, lithium fluoride (LiF), cesium fluoride ($C_sF$), or the like, which have a favorable electron injecting property can be used in addition to BzOs: Li. Further, a mixture of $Alq_3$ and magnesium (Mg) can be also used.

The transparent electrode 756 that is a cathode of the organic light-emitting element is formed on the fifth layer 755 to be 10 nm to 800 nm thick. Indium tin oxide including a Si element (ITSO), or indium zinc oxide (IZO) in which zinc oxide (ZnO) of 2 to 20% is mixed into indium oxide can be used for the transparent electrode 756 as well as indium tin oxide (ITO).

As described above, a light-emitting element is manufactured. Each material for an anode, layers containing organic compound (the first to fifth layers) and a cathode, of which a light-emitting element is constituted, is appropriately selected and each film, thickness is adjusted. It is preferable that the anode and the cathode are formed of the same material and have almost the same thickness, preferably, a thin thickness of about 100 nm.

If necessary, a transparent protective layer 757 for preventing water from entering is formed to cover the light-emitting element. A silicon nitride film, a silicon oxide film or a silicon oxynitride film (an SiNO film (N>O in composition ratio) or an SiON film (N<O in composition)), a thin film mainly containing carbon (such as DLC film or a CN film) or the like, which can be obtained by a sputtering method or a CVD method, can be used (FIG. 15 (B)).

A second substrate 770 and the substrate 500 are stuck with a sealing member containing a gap material for keeping a substrate gap. The second substrate 770 may be also formed from a light-transmitting glass substrate or a quartz substrate. Note that the gap between the pair of substrates may be provided with a drying agent as an air gap (an inert gas) or be filled with a transparent sealing member (ultra-violet curing resin, thermosetting epoxy resin or the like).

In the light-emitting element, the transparent electrodes 750 and 756 are formed of a light-transmitting material, and light can be extracted in two directions, in other words, from the opposite sides.

By employing a panel structure described above, light-emission from a top face and a bottom face can be almost the same.

Lastly, optical films 771 and 772 (a polarizing plate or a circularly polarizing plate) are provided to improve contrast.

Figure 17:
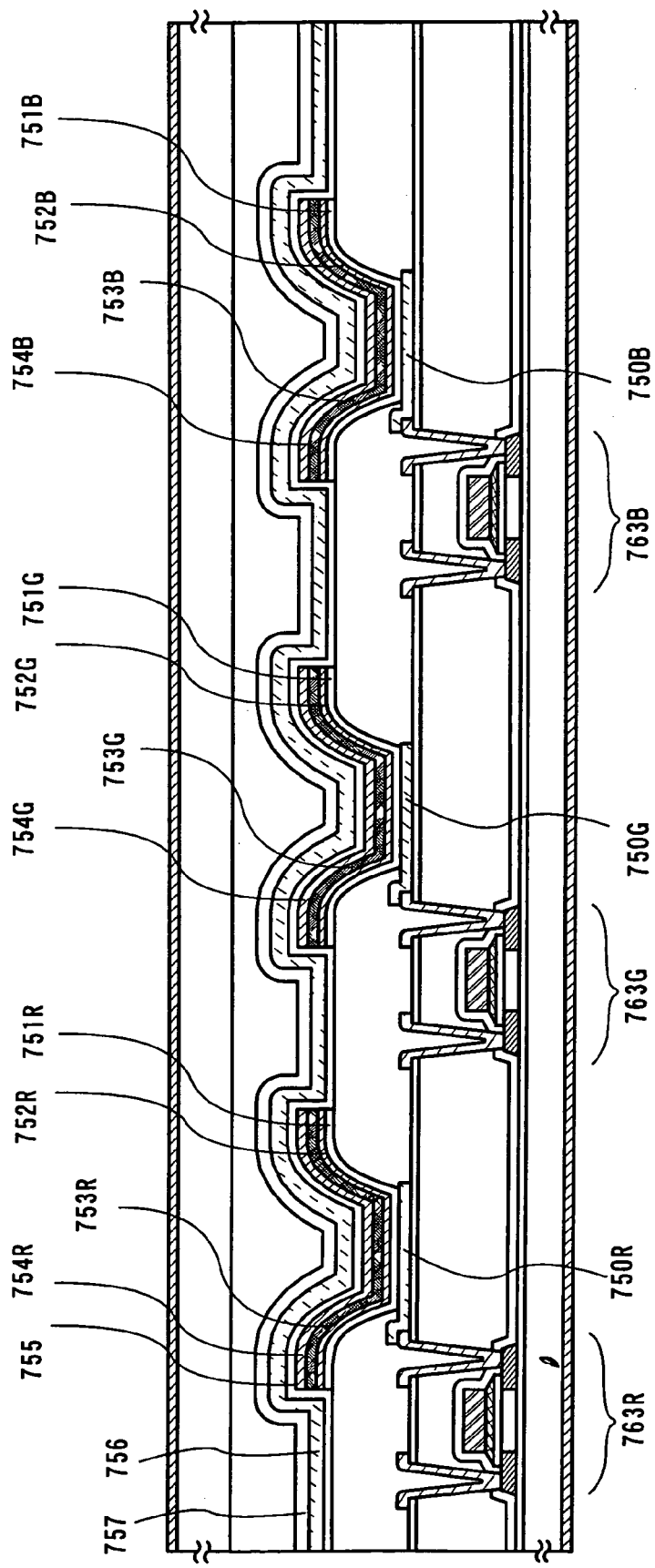
[FIG. 17] A view showing a manufacturing process of an EL display device of the present invention.

A cross sectional view of a light-emitting element for each emission color (R, G, B) is shown in FIG. 17. The light-emitting element of red color (R) includes a pixel TFT 763R, a transparent electrode (anode) 750R, a first layer 751R, a second layer (hole transporting layer) 752R, a third layer (light-emitting layer) 753R, a fourth layer (electron transporting layer) 754R, a fifth layer (electron injection layer) 755, a transparent electrode (cathode) 756, and a transparent protective layer 757.

Further, the light-emitting element of green color (G) includes a pixel TFT 763G, a transparent electrode (anode) 750G, a first layer 751G, a second layer (hole transporting layer) 752G, a third layer (light-emitting layer) 753G, a fourth layer (electron transporting layer) 754G, a fifth layer (electron injection layer) 755, a transparent electrode (cathode) 756, and a transparent protective layer 757.

Furthermore, the light-emitting element of blue color (B) includes a pixel TFT 763B, a transparent electrode (anode) 750B, a first layer 751B, a second layer (hole transporting layer) 752B, a third layer (light-emitting layer) 753B, a fourth layer (electron transporting layer) 754B, a fifth layer (electron injection layer) 755, a transparent electrode (cathode) 756, and a transparent protective layer 757.

In this embodiment, a top gate TFT is used as a TFT, however it is not limited to this structure and a bottom gate (inversely staggered) TFT or a staggered TFT can be used. Further, it is not limited to a TFT with a single gate structure, and multi-gate TFT having plural channel forming regions, e.g., a double gate TFT, may be employed.

This embodiment can be freely combined with any description in embodiment mode and Embodiment 1 if necessary.

Embodiment 5

In this embodiment, an example of manufacturing a CPU (Central Processing Unit) by applying the present invention is shown with reference to FIGS. 19(A) to 19(C), FIG. 20(A) to 20(C), FIG. 21, FIG. 22 and FIG. 23(A) to 23(C).

A base film 3001 is formed over a substrate 3000 having an insulating surface as shown in FIG. 19(A). A glass substrate such as barium borosilicate glass or aluminoborosilicate glass, a quartz substrate, a stainless substrate, or the like can be used as the substrate 3000. Although a substrate made of a flexible synthetic resin such as plastics typified by PET, PES or PEN, or acrylic generally tends to have a lower heat resistance temperature compared to other substrates, it can be used as long as it can withstand the process temperature in a manufacturing step.

The base film 3001 is formed in order to prevent an alkaline metal such as Na or an alkaline earth metal contained in the substrate 3000 from being diffused in a semiconductor film and adversely affecting properties of a semiconductor element. The base film 3001 is therefore formed by using an insulating film such as silicon oxide, silicon nitride, or silicon oxide including nitrogen, which is capable of suppressing the diffusion of an alkaline metal or an alkaline earth metal into the semiconductor film. In this embodiment mode, a silicon nitride film (SiNO) including oxygen formed by a plasma CVD method with $SiH_4$, $NH_3$, $N_2O$, or $H_2$ used as a reacting gas, to be from 10 to 200 nm (50 nm in this embodiment) in thickness, and a silicon nitride film including oxygen formed by a plasma CVD method with $SiH_4$ or $N_2O$ used as a reacting gas to be from 50 to 200 nm (100 nm in this embodiment) in thickness are sequentially laminated. Note that the base film 3001 may have a single layer structure, and can be formed of for example a silicon oxide film including nitrogen to be from 10 to 400 nm (preferably from 50 to 300 nm) in thickness.

It is effective to provide a base film in order to prevent impurity from being diffused in the case of using a substrate that contains a certain amount of an alkaline metal or an alkaline earth metal, such as a glass substrate or a plastic substrate. However, a base film is not necessarily required to be provided when using a quartz substrate or the like, with which the diffusion of the impurity does not cause a problem.

An amorphous semiconductor film 3002 is formed over the base film 3001. The film thickness of the amorphous semiconductor film 3002 is to be from 25 to 100 nm (preferably, from 30 to 60 nm). In addition, silicon germanium as well as silicon can be used for an amorphous semiconductor. In the case of using silicon germanium, a concentration of germanium is preferably set about from 0.01 to 4.5 atomic %. In this embodiment, a semiconductor film (also described as an amorphous silicon film or amorphous silicon) with 66 mm including silicon as its main component is used.

Then, a catalyst element is added to the amorphous semiconductor film 3002. Here, adding means that a catalyst element is formed on the surface of the amorphous semiconductor film 3002 so as to promote crystallization of at least the amorphous semiconductor film. By forming the catalyst element, the amorphous semiconductor film can be preferably crystallized at low temperature.

For example, a Ni solution (including an aqueous solution and an acetic acid solution) is applied onto the amorphous semiconductor film 3002 by an application method such as a spin coating method or a dip method in order to form a film including Ni 3003 (however, there is a case that the film can not be observed since the film is extremely thin). At this time, in order to improve wettability of the surface of the amorphous semiconductor film and to coat all over the surface thereof with the solution, it is desirable to form an oxide film (not shown) to be from 1 nm to 5 nm by ultra-violet light irradiation in the oxygen atmosphere, by a thermal oxidation method, by treatment using ozone water or hydrogen peroxide including a hydroxyl radical, or the like. Alternatively, a Ni ion can be injected to the amorphous semiconductor film by an ion implantation method; heat treatment can be performed in the water vapor atmosphere including Ni; or sputtering can be performed using a Ni material as a target under Ar plasma. In this embodiment mode, an aqueous solution containing Ni acetate by 10 ppm is applied by a spin coating method.

Figure 19:
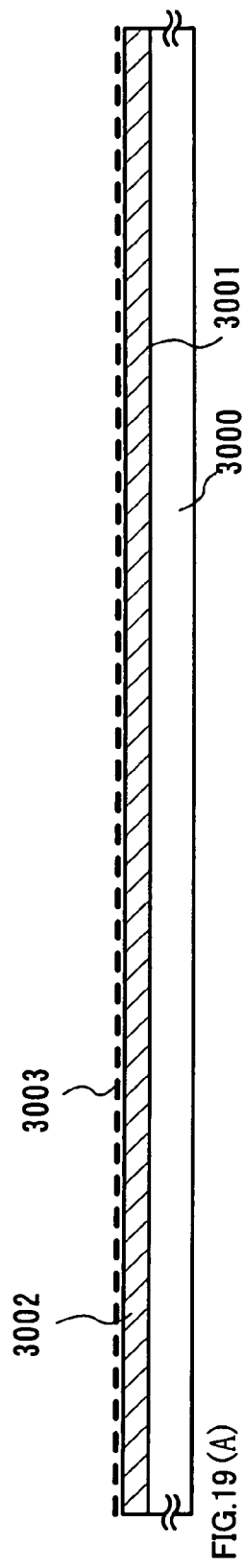
[FIG. 19] Views showing a manufacturing process of a CPU of the present invention.
Figure 19B:
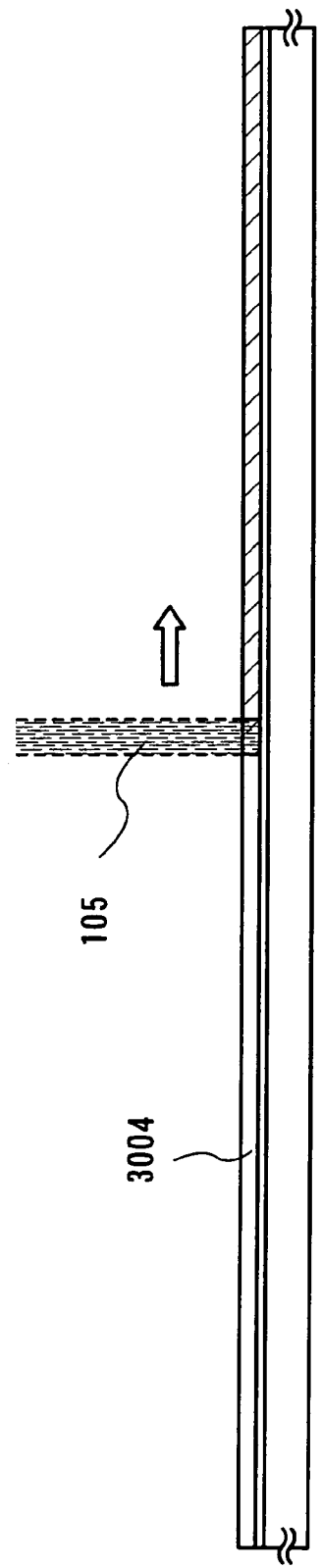

Subsequently, as described in embodiment mode and Embodiment 1, the amorphous semiconductor film 3002 is irradiated with a laser light (laser beam) 105 (FIG. 19 (B)).

In the laser irradiation, a marker can be formed so as to laminate with maximum accuracy and control an irradiation starting position and irradiation end position. The marker is formed onto a substrate using a photolithography method.

The amorphous semiconductor film 3002 is crystallized and a crystalline semiconductor film 3004 is formed by this laser irradiation.

Afterwards, a gettering process is performed so as to reduce or remove the catalyst element. In this embodiment, a method for capturing a catalyst element while using the amorphous semiconductor film as a gettering sink is described. First, a silicon oxide film is formed by applying ultra-violet light irradiation, a thermal oxidation method, and treatment using ozone water including hydroxyradical or hydrogen peroxide onto a crystalline semiconductor film in an oxygen atmosphere. Then, an amorphous semiconductor film is formed by a plasma CVD method, with a material gas of $SH_4$ and Ar, a pressure of 0.3 Pa, RF power of 3 kW, a substrate temperature of 150° C. to be 150 nm in thickness.

Subsequently, heat treatment at 550° C. in a nitrogen atmosphere for four hours is carried out so as to reduce or remove the catalyst element. The amorphous semiconductor film and the oxide film to be gettering sinks are removed by hydrofluoric acid or the like so as to obtain a crystalline semiconductor film in which the catalyst element is reduced or removed.

Figure 19C:
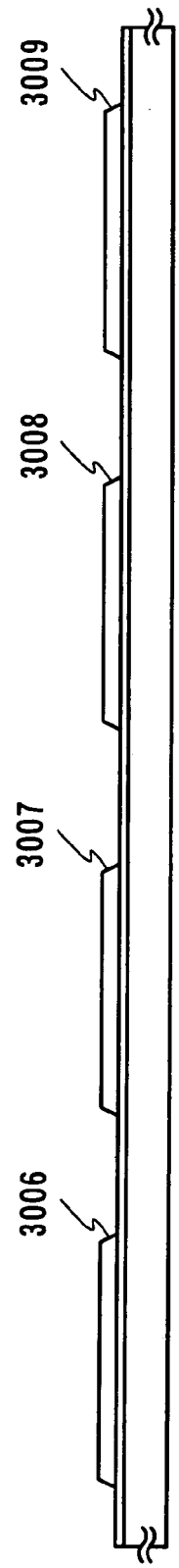

As shown in FIG. 19(C), the crystalline semiconductor film 3004 is patterned in a predetermined form, and island shape semiconductor films 3006 to 3009 are obtained. When performing patterning, a photoresist is applied to the crystalline semiconductor film 3004, and a predetermined mask form is exposed and baked, thereby forming a mask over the crystalline semiconductor film. By using this mask, the crystalline semiconductor film is patterned by a dry etching method. As the gas for the dry etching method, $CF_4$, and $O_2$ can be used.

Afterwards, by the same steps as Embodiment 1, the steps up to introducing an impurity are carried out, and a TFT is formed. If there are not any descriptions concerning manufacturing condition, manufacturing steps, materials for film formation, or the like, the same manufacturing condition, manufacturing steps, materials for film formation, and the like as Embodiment 1 are used.

In this embodiment, n-channel TFTs 3201 and 3203 and p-channel TFTs 3202 and 3204 are formed over the substrate 3000. In FIG. 20(A), the n-channel TFT 3201 includes, over the base film 3001, the island shape semiconductor film 3006, the gate insulating film 3020, and a gate electrode 3060 formed of a first layer gate electrode (lower layer gate electrode) 3050 and a second layer gate electrode (upper layer gate electrode) 3040. Further, in the island shape semiconductor film 3006, a source or drain region 3010, a low concentration impurity region 3011, and a channel formation region 3012 are included.

The p-channel TFT 3202 includes an island shape semiconductor film 3007, a gate insulating film 3021, a gate electrode 3061 formed of a first layer gate electrode (lower layer gate electrode) 3051 and second layer gate electrode (upper layer gate electrode) 3041, over the base film 3001. In the island shape semiconductor film 3007, a source or drain region 3041 and a channel formation region 3014 are included.

The n-channel TFT 3203 includes an island shape semiconductor film 3008, a gate insulating film 3022, and a gate electrode 3062 formed of a first layer gate electrode (lower layer gate electrode) 3052 and a second layer gate electrode (upper layer gate electrode) 3042, over the base film 3001. Further, in the island shape semiconductor film 3008, a source or drain region 3015, a low concentration impurity region 3016, and a channel formation region 3017 are included.

The p-channel TFT 3204 includes an island shape semiconductor film 3009, a gate insulating film 3023, a gate electrode 3063 formed of a first layer gate electrode (lower layer gate electrode) 3053 and a second layer gate electrode (upper layer gate electrode) 3043, over the base film 3001. Further, in the island shape semiconductor film 3009, a source or drain region 3018 and a channel formation region 3019 are included.

A first insulating film 3101 is formed so as to cover the island shape semiconductor films 3006 to 3009, the gate insulating films 3020 to 3023, and the gate electrodes 3060 to 3063. An insulating film including nitrogen is used as the first insulating film 3001. In this embodiment, silicon nitride with a film thickness of 100 nm is formed by a plasma CVD method.

Subsequently, heat treatment is carrier out to perform hydrogenation. In this embodiment, heat treatment is carried out at 410° C. for one hour in a nitrogen atmosphere. Consequently, a dangling bond of a silicon oxide film and a silicon film is terminated by hydrogen emitted from silicon nitride.

A second insulating film 3102 is formed so as to cover the first insulating film 3101. As the second insulating film 3102, an inorganic material (silicon oxide, silicon nitride, silicon nitride including oxygen, or the like), a photosensitive or nonphotosensitive organic material (polyimide, acryl, polyamide, polyimide amide, resist or benzocyclobutene), siloxane, or a laminated film thereof can be used.

Note that siloxane is constructed by a skeletal structure of the combination of silicon (Si) and oxygen (O), and its substitute contains an organic group at least including hydrogen (for example an alkyl group, aromatic hydrocarbon). As the constituent, a fluoro group may be used. And as the substituent, an organic group containing at least hydrogen, and a fluoro group may be used.

When forming the second insulating film 3102 using an organic material, a positive photosensitive resin or a negative photosensitive organic resin is used. For example, when a positive type photosensitive acrylic is used as an organic material, an opening with curvature on the top end portion can be formed by etching the positive photosensitive organic resin with exposure in photolithography. In this embodiment mode, a nitrided silicon oxide film is formed to be a film thickness of 600 nm by a plasma CVD method using $SiH_4$ and $N_2O$ as a source gas. On this occasion, the substrate is heated at from 300° C. to 450° C., 400° C. in this embodiment.

Opening portions, so called contact holes are formed in the first insulating film 3101 and the second insulating film 3102 so as to form electrodes or wirings 3301 to 3308 connected to the impurity region. In this embodiment, the electrodes and the wirings are formed integrally, however they may be formed separately and then electrically connected. A wiring which connects with the gate electrodes is formed as well as the electrodes or the wirings. Hereupon, the opening portions are preferably formed vertically with a diameter of about 1.0 μm. The end portions of the resists are intended not to have tapered shape. Further, when the selectivity of the resists is high considerably, the end portions of the resists may have tapered shape. In this embodiment mode, since a nitrided silicon oxide film is used for the second insulating film 3102, the openings are formed by dry etching using resist masks which are formed to have vertical side surfaces; namely, the resist masks are intended not to have tapered shape. Etching is performed using $CHF_3$ and He as an etching gas, for a first etching time of several sec, 3 sec for example, for a second etching time of 100 sec to 130 sec, 117 sec for example, and for a third etching time of 200 sec to 270 sec, 256 sec for example. Hereupon, a flow rate of the etching gas can be determined depending on the etching condition of the openings.

Note that, in the case where an organic material or siloxane is used for the second insulating film 3102, a mask with higher hardness than a resist mask, a hard mask formed of an inorganic material such as a silicon oxide film is preferably used, so that the side surfaces of the openings are made vertical.

Thereafter, the resist masks are removed by $O_2$ ashing or a resist stripper.

Wirings 3301 to 3308 are formed in the openings. The wirings are formed with a film containing an element selected from aluminum (Al), titanium (Ti), molybdenum (Mo), tungsten (W), and silicon (Si), or an alloy film using the elements thereof. In this embodiment mode, a titanium film (Ti), a titanium nitride film (TiN), a titanium-aluminum alloy film (Al—Si), and a titanium film (Ti) are stacked to each have a thickness of 60 nm, 40 nm, 300 nm, and 100 nm, and are patterned and etched to the desired shape to form wirings, that is, a source electrode and a drain electrode.

Further, the wirings 3301 to 3308 may be formed of an aluminum alloy film containing at least one kind of element selected from nickel, cobalt and iron, and carbon. Such aluminum alloy film can prevent counter diffusion of silicon and aluminum when being in contact with silicon. Using such aluminum alloy film, oxidation-reduction reaction is not generated even when being in contact with a transparent conductive film, for example, ITO (Indium Tin Oxide), thus, both films can be in touch directly. Furthermore, since the aluminum alloy film has low resistivity, and heat resistance, it is useful for a wiring material.

As described above, an n-channel thin film transistor which has an LDD structure formed so as to have a low concentration impurity region and whose gate length is 1.0 µm or less can be manufactured. Further, a p-channel thin film transistor which has a so-called single-drain structure and whose gate length is 1.0 µm or less can be completed. Note that the TFT whose gate length is 1.0 µm or less can be also described as a submicron TFT. The p-channel thin film transistor can have a single-drain structure since deterioration due to a hot carrier and short-channel effect are hard to occur.

In this invention, the p-channel thin film transistor may have an LDD structure. Moreover, the n-channel thin film transistor and p-channel thin film transistor may have a so-called GOLD structure in which a low concentration impurity region is overlapped with a gate electrode as a substitute for the LDD structure.

A semiconductor device having a thin film transistor formed as described above, in this embodiment, a CPU can be manufactured, and which can be operated at high speed with a drive voltage of 5V and an operation frequency of 30 MHz.

Moreover, a structure of the CPU in this embodiment is described by using a block diagram.

Figure 21:
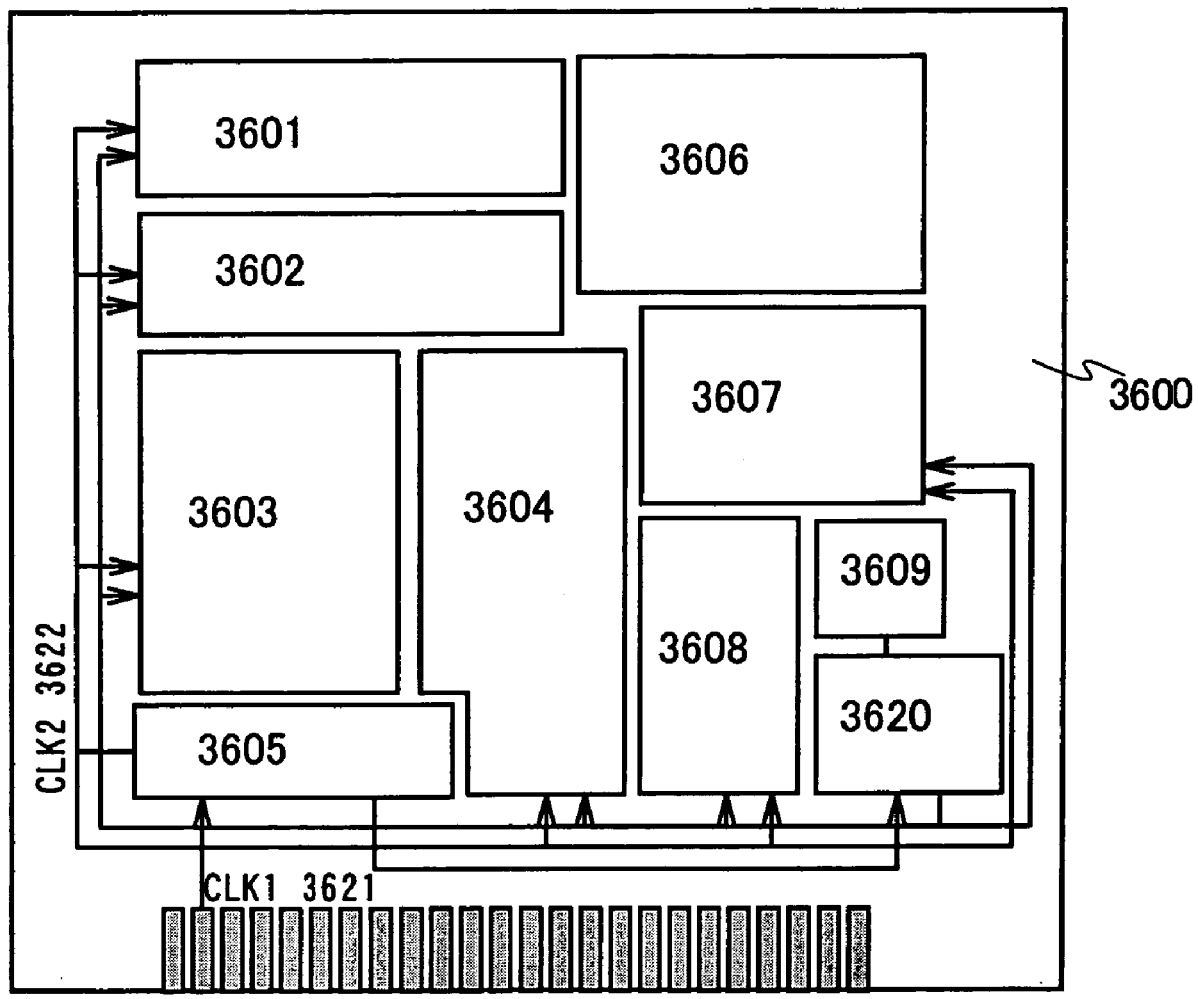
[FIG. 21] A top view of a CPU of the present invention.

A CPU shown in FIG. 21 mainly includes an arithmetic circuit (ALU: Arithmetic Logic Unit) 3601, a control unit for the arithmetic circuit (ALU controller) 3602, an instruction decoder 3603, and an interrupt controller 3604, a timing controller 3605, a register 3606, a register controller 3607, a bus interface (bus I/F) 3608, a rewritable ROM 3609, and a ROM interface (ROM I/F) 3620 over a substrate 3600. Further, the rewritable ROM 3609 and the ROM interface (ROM I/F) 3620 may be provided over another chip.

FIG. 21 shows only an example of simplified configuration of a CPU. Accordingly, actual CPUs have various configurations depending on the usages.

An instruction input into the CPU via the bus interface 3608 is then input to the instruction decoder 3603 and decoded, and further input into the control unit for an arithmetic circuit 3602, the interrupt controller 3604, the register controller 3607, and the timing controller 3605.

The control unit for an arithmetic circuit 3602, the interrupt controller 3604, the register controller 3607, and the timing controller 3605 perform control based on decoded instructions. Specifically, the control unit for an arithmetic circuit 3602 generates a signal for controlling the operation of the arithmetic circuit 3601. The interrupt controller 3604 handles the interrupt request from a peripheral circuit and an external input-output device evaluated from the priority or the mask condition during execution of the program of the CPU. The register controller 3607 generates an address of the register 3606, and performs reading and writing in accordance with the state of the CPU.

The timing controller 3605 generates signals for controlling timing of the operations of the arithmetic circuit 3601, the control unit for an arithmetic circuit 3602, the instruction decoder 3603, the interrupt controller 3604, and the register controller 3607. For example, the timing controller 3605 has an internal clock generation unit where an internal clock signal CLK2 (3622) is generated from a base clock CLK1 (3621), and the clock signal CLK2 is supplied to the above circuits.

Figure 22:
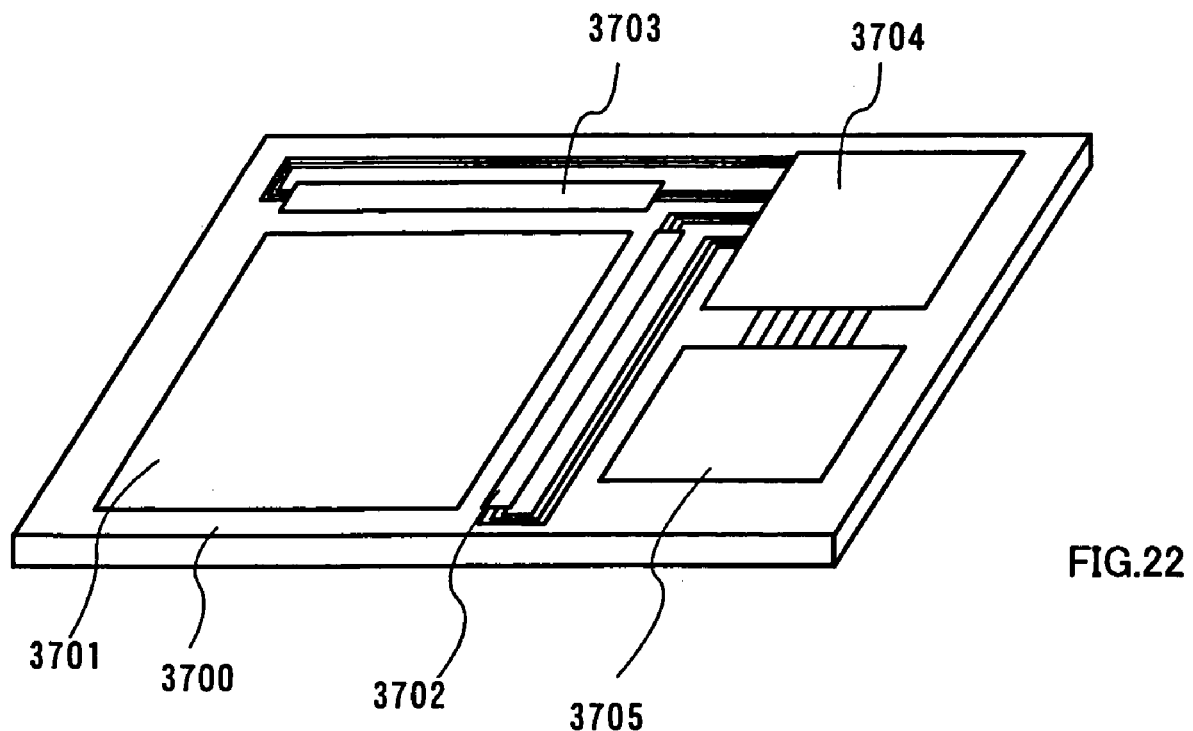
[FIG. 22] A view showing a system on panel of the present invention.

FIG. 22 shows a display device in which a pixel portion, a CPU, and other circuits are formed over one substrate, what is called a system on panel. A pixel portion 3701, a scan line driver circuit 3702 which selects a pixel of the pixel portion 3701, and a signal line driver circuit 3703 which supplies a video signal to the selected pixel are provided over a substrate 3700. Wirings led from the scan line driver circuit 3702 and the signal line driver circuit 3703 connects a CPU 3704 and other circuits such as a control circuit 3705. The control circuit includes an interface. A connection area with an FPC terminal is provided at the end portion of the substrate to interact with external signals As other circuits, a video signal processing circuit, a power supply circuit, a gradation power supply circuit, a video RAM, a memory (DRAM, SRAM, PROM), and the like may be provided over the substrate. These circuits may be formed with IC chips and mounted on the substrate. Further, the scan line driver circuit 3702 and the signal line driver circuit 3703 are not necessarily formed over the same substrate. And, for example, only the scan line driver circuit 3702 may be formed over a substrate, and the signal line driver circuit 3703 may be formed with an IC chip and mounted on the substrate afterwards.

Figure 23A:
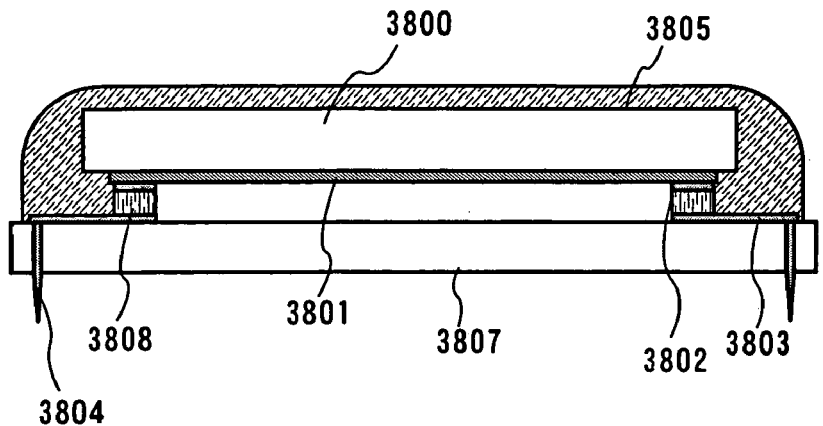
[FIG. 23] Views showing a manufacturing process of a CPU of the present invention.

FIG. 23(A) shows a mode of a packaged CPU. A transistor array 3801 serving as a CPU provided on a substrate 3800 is set face down so that an electrode (a source electrode, a drain electrode, or another electrode formed over the source or drain electrode with an insulating film therebetween) 3802 over the surface of the CPU is provided downward. The substrate 3800 can use glass or plastic. A wiring board provided with a wiring 3803 comprising copper or an alloy of copper, a printed circuit board 3807 here, is prepared. The printed circuit board 3807 is provided with a connection terminal (pin) 3804. The electrode 3802 and the wiring 3803 are connected via an anisotropic conductive film 3808. Subsequently, the substrate 3800 is covered with a resin 3805 such as epoxy resin from the top; thus, a packaged CPU can be completed. Alternatively, the periphery thereof may be surrounded with a plastic or the like with hollow space kept inside.

Figure 23B:
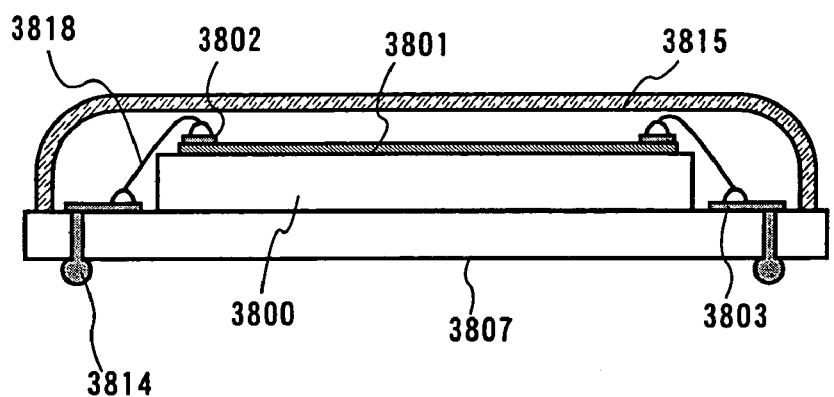

In FIG. 23(B), a CPU is mounted face up as an electrode 3802 provided on the surface of a CPU is set upward, unlike in FIG. 23(A). A substrate 3800 is fixed to a printed circuit board 3807, and the electrode 3802 and a wiring 3803 are connected via a wire 3818. Such connection using a wire is called wire bonding. The electrode 3802 and a bump 3814 connected to the wiring 3803 are connected. Finally, the periphery is surrounded with a plastic 3815 with hollow space kept inside; thus, a packaged CPU is completed.

Figure 23C:
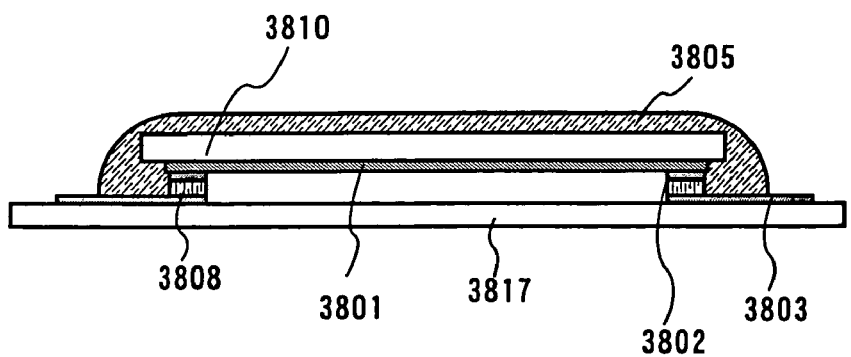

FIG. 23(C) shows an example of fixing a transistor array 3801 serving as a CPU formed over a flexible substrate such as an FPC (flexible printed circuit). The transistor array 3801 serving as a CPU formed over the substrate 3810 is set face down so that an electrode 3802 over the surface of the CPU is provided downward. The substrate 3800 can use glass, quartz, metal, a bulk semiconductor, or plastic. In the case of FIG. 23(C), a highly flexible plastic is preferably used as a substrate. An FPC 3817 provided with a wiring 3803 formed of copper or an alloy of copper is prepared. The electrode 3802 and the wiring 3803 are connected via an anisotropic conductive film 3808. Subsequently, the substrate 3810 is covered with a resin 3805 such as epoxy resin from the top; thus, a packaged CPU can be completed.

Thus packaged CPU is protected from outside, and further, it is easier to be carried. The CPU can be mounted on a desired portion. In particular, in the case where the completed CPU is flexible as in FIG. 23(C), it can be mounted on a desired portion more freely. Further, the function of the CPU can be supported by packaging.

As described above, a semiconductor device such as a CPU can be manufactured using a TFT of the invention. Further, the CPU fabricated with a thin film transistor is light in weight; thus, difficulties in carrying and mounting can be reduced. A system on panel can be manufactured by using various display devices such as CPU described in this embodiment, a liquid crystal display device described in Embodiment 2 and 3, and an EL display device described in Embodiment 4.

This embodiment can be combined with any description in embodiment mode, and Embodiment 1 to 4, if necessary.

Embodiment 6

This embodiment describes an example of forming an ID chip according the present invention with reference to FIGS. 24(A) and 24(B), FIGS. 25(A) and 25(B), FIGS. 26(A) and 26(B), and FIGS. 27(A) and 27(B).

In this embodiment, a TFT which is insulated is shown as an example of a semiconductor element, however, a semiconductor element included in a thin film integrated circuit is not limited to this and various circuit elements can be used. A memory element, a diode, a photoelectric transfer element, a resistive element, a coil, a capacitance element, and an inductor can be typically used, besides TFT, for example.

As shown in FIG. 24(A), a peeling layer 4001 is formed on a substrate 4000 having heat resistance (a first substrate) by a sputtering method. A glass substrate such as a barium borosilicate glass or an alumino-borosilicate glass, a quartz substrate, a ceramic substrate and the like can be used as the first substrate 4000. A metal substrate including a stainless substrate or a substrate in which an insulating film is formed over the surface of the semiconductor substrate may be used. A substrate formed of a synthetic resin having flexibility such as plastic tends to have low allowable temperature limit generally, compared to the above described substrates, however, the substrate that can resist processing temperature in a later manufacturing step can be used.

A layer mainly containing silicon such as amorphous silicon, polycrystalline silicon, single crystalline silicon or microcrystalline silicon (including semi-amorphous silicon) can be used for the peeling layer 4001. The peeling layer 4001 can be formed by a sputtering method, a vacuum CVD method, a plasma CVD method or the like. In this embodiment mode, an amorphous silicon film is formed to be about 50 nm in thickness by a vacuum CVD method, and is used as the peeling layer 4001. Note that the peeling layer 4001 is not limited to silicon, and can be formed of a material which can be selectively removed by etching. The film thickness of the peeling layer 4001 is preferably from 50 nm to 60 nm. In the case of using semiamorphous silicon, the film thickness may be from 30 to 50 nm.

The semiamorphous semiconductor typified by semiamorphous silicon is a film containing a semiconductor with an intermediate structure between an amorphous semiconductor and a crystalline semiconductor (including a single crystal structure and a polycrystalline structure). The semiamorphous semiconductor has a third condition that is stable in term of free energy, and is a crystalline substance having a short range order along with lattice distortions. A crystal region with a grain size of 0.5 to 20 nm can be dispersed in the semiamorphous semiconductor. Raman spectrum is shifted toward lower wave number than 520 $cm^{-1}$. The diffraction peaks of (111) and (220), which are believed to be derived from a silicon crystal lattice, are observed in the semiamorphous semiconductor by X-ray diffraction. The semiamorphous semiconductor contains hydrogen or halogen of at least 1 atomic % or more as a neutralizing agent for dangling bonds. The semiamorphous having the above mentioned structure is, herein, referred to as a semiamorphous semiconductor (SAS) for the sake of convenience. The lattice distortions are further extended by adding a rare gas element such as helium, argon, krypton and neon so that the favorable semiamorphous semiconductor with improved reliability can be obtained.

The SAS is formed by glow discharge decomposition with a silicide gas. $SiH_4$ is a typical silicide gas. In addition to $SiH_4$, $Si_2H_6$, $SiH_2Cl_2$, $SiHCl_3$, $SiCl_4$, $SiF_4$ and the like can be used as the silicide gas. By diluting the silicide gas with hydrogen, or a gas in which one or more of rare gas elements selected from helium, argon, krypton, and neon is added to hydrogen to be used, the SAS is easily formed. The dilution ratio is preferably set to be in the range of 1:2 to 1:1,000.

A base film 4002 is formed over the separating film 4001. The base film 4002 is provided so as to prevent alkali metal such as Na and alkali earth metal included in the substrate 4000 from being diffused in a semiconductor film and adversely affecting properties of a semiconductor element. Furthermore, the base film also serves for protecting the semiconductor element. The base film 4002 may be a single layer or a laminated layer formed of a plurality of insulating films. Therefore, an insulating film such as silicon oxide, silicon nitride, silicon oxide including nitrogen (SiON), silicon nitride including oxygen (SiNO), or the like is used so as to prevent the alkali metal and alkali earth metal from being diffused into the semiconductor film for forming the base film.

In this embodiment, a base film 4002 is formed by sequentially laminating a silicon oxide film including nitrogen (SiON film) with a film thickness of 100 nm as a lower layer base film 4002a, a silicon nitride film including oxygen (SiNO film) with a film thickness of 50 nm as a middle layer base film 4002b, and silicon oxide film including nitrogen (SiON film) with a film thickness of 100 nm as a upper layer base film 4002c. However, each material, film thickness, lamination number is not limited thereto. As a substitute for the SiON film of the lower layer, a siloxane resin with a film thickness of 0.5 to 3 μm may be formed by a spin coating method, a slit coater method, a drop discharge method, or the like. Further, as a substitute for the SiNO film of the middle layer, a silicon nitride film (SiNx, $Si_3N_4$, or the like) may be used. Furthermore, as a substitute for the SiON film of the upper layer, a silicon oxide film may be used. Each film thickness is preferably 0.05 to 3 μm, and can be selected from this range.

Alternatively, the lower layer of the base film 4002, which is the closest to the peeling layer 4001 may be formed using a SiON film or a silicon oxide film, the middle layer may be formed using a siloxane resin, and the upper layer may be formed using a silicon oxide film.

Here, the silicon oxide film can be formed by using a mixed gas of $SiH_4$ and $O_2$, TEOS (Tetraethoxysilane) and $O_2$, or the like by a method such as a thermal CVD, plasma CVD, normal pressure CVD, or bias ECRCVD. Further, the silicon nitride film can be formed of a mixed gas of typically $SiH_4$ and $NH_3$ by plasma CVD. Furthermore, the silicon oxide film including nitrogen (SiON: O>N) and the silicon nitride including oxygen (SiNO: N>O) are typically formed of a mixed gas of $SiH_4$ and $N_2O$ by plasma CVD.

Subsequently, a semiconductor film is formed over the base film 4002. After forming the base film 4002, the semiconductor film is preferably formed without being exposed to air. The film thickness of the semiconductor film is 20 to 200 nm (desirably, 40 to 170 nm, preferably, 50 nm to 150 nm). Note that the semiconductor film may be an amorphous semiconductor, semiamorphous semiconductor, or a polycrystalline semiconductor. Not only silicon, but also silicon germanium can be used as the semiconductor. When using silicon germanium, the concentration of the germanium is preferably about 0.01 to 4.5 atomic %.

The amorphous semiconductor can be obtained by glow-discharge decomposition of a silicide gas. As the typical silicide gas, $SiH_4$, $Si_2H_6$ are given. Those silicide gases may be used by diluting with hydrogen, or hydrogen and helium.

As described above, the amorphous semiconductor can be obtained by grow-discharge decomposition of the silicide gas. However, a carbide gas such as $CH_4C_2H_6$, germanium gas such as $GeH_4$ and $GeF_4$, or $F_2$ may be mixed into the silicide gas to adjust the width of an energy band at 1.5 to 2.4 eV or 0.9 to 1.1 eV.

In the case of using the gas in which $H_2$ is added to $SiH_4$, or the gas in which $F_2$ is added to $SiH_4$, by manufacturing a TFT using the formed semiamorphous semiconductor, the sub-threshold coefficient (S value) of the TFT can be 0.35 V/sec or less, typically, from 0.25 to 0.09 V/sec, and the mobility can be 10 $cm^2$/Vsec. And when 19-stages ring oscillator is formed, a property in which a repetition frequency is 1 MH or more, preferably, 100 MHz or more, in power voltage ranging from 3 to 5V, can be obtained. Further, in the power voltage ranging from 3 to 5V, delay time per stage of an inverter can be 26 ns, preferably, 0.26 ns or less.

As shown in embodiment mode and Embodiment 1, a semiconductor film is crystallized using a laser. However, a crystallization method using a catalyst element and a laser crystallization method using a laser may be combined.

As the same steps as Embodiment 1, the step up to introducing an impurity shown in FIG. 5 is carried out.

Accordingly, an n-channel TFT 4011, p-channel TFT 4012, n-channel TFT 4013 are formed (FIG. 24(A)). Note that a top gate structure is applied to the TFTs 4011 to 4013 in this embodiment, however, a bottom gate structure (inversely staggered structure) may be applied.

The n-channel TFT 4011 includes an island shape crystalline semiconductor film 4100, a gate insulating film 4120, and a gate electrode 4160 formed of a lower layer gate electrode 4150 and upper layer gate electrode 4140, over an upper layer base film 4002c. In the island shape semiconductor film 4100, a channel formation region 4112, a low concentration impurity region 4111, and a source or drain region 4110 are formed.

The p-channel TFT 4012 includes an island shape crystalline semiconductor film 4101, a gate insulating film 4121, and a gate electrode 4161 formed of a lower layer gate electrode 4151 and upper layer gate electrode 4141, over an upper layer base film 4002c. In the island shape semiconductor film 4101, a channel formation region 4114, and a source or drain region 4113 are formed.

The n-channel TFT 4013 includes an island shape crystalline semiconductor film 4102, a gate insulating film 4122, and a gate electrode 4162 formed of a lower layer gate electrode 4152 and upper layer gate electrode 4142, over an upper layer base film 4002c. In the island shape semiconductor film 4102, a channel formation region 4117, a low concentration impurity region 4116, and a source or drain region 4116 are formed.

Afterwards, a passivation film 4200 for protecting the TFTs 4011 to 4013 may be formed. Silicon nitride, silicon oxide including nitrogen, aluminum nitride, aluminum oxide, silicon oxide, and the like each of which can prevent an alkaline metal or an alkaline earth metal from being diffused in the TFTs 4011 to 4013, are preferably used as the passivation film. Specifically, for example, a SiON film with a thickness of 600 nm can be used as the passivation film. In this case, hydrogenation process is carried out after forming the SiON film. As described, three-layered insulating films, SiON, SiNx, and SiON are formed over the TFTs 4011 to 4013; however each structure and material is not limited thereto. By using the above structure, the TFTs 4011 to 4013 are covered with the base film 4002 and the passivation film 4200. Thus, an alkaline metal such as Na or an alkaline earth metal can be prevented from being diffused in a semiconductor film used in a semiconductor element and adversely affecting properties of a semiconductor element.

Then, a first interlayer insulating film 4201 is formed so as to cover the TFTs 4011 to 4013 and the passivation film 4200. The first interlayer insulating film 4201 can be formed of an organic resin having heat resistance such as polyimide, acrylic, or polyamide. Besides, a low dielectric constant material (low-k material), a resin including Si—O—Si bond formed by using a siloxane material as a starting material (hereinafter this resin is called a siloxane resin), or the like can be used.

Note that siloxane is constructed by a skeletal structure of the combination of silicon (Si) and oxygen (O), and its substitute contains an organic group at least including hydrogen (for example an alkyl group, aromatic hydrocarbon). As the constituent, a fluoro group may be used. And as the substituent, an organic group containing at least hydrogen, and a fluoro group may be used.

The first interlayer insulating film 4201 can be formed by spin coating, dipping, spray coating, a droplet-discharge method (an ink-jet method, screen printing, offset printing, or the like), a doctor's knife, a roll coater, a curtain coater, a knife coater, or the like. The first interlayer insulating film 4201 may be formed by laminating these insulating films.

In this embodiment mode, a second interlayer insulating film 4202 is formed over the first interlayer insulating film 4201. The second interlayer insulating film 4202 may be formed of a film including carbon such as DLC (diamond-like carbon) or CN (carbon nitride), silicon oxide film, silicon nitride film, or silicon oxide film including nitrogen by a plasma CVD, atmospheric-pressure plasma CVD, or the like. Alternatively, a photosensitive or non-photosensitive organic material such as polyimide, acrylic, polyamide, resist, or benzocyclobuten or a siloxane resin may be used.

A filler may be mixed into the first interlayer insulating film 4201 or the second interlayer insulating film 4202 in order to prevent the first interlayer insulating film 4201 and the second interlayer insulating film 4202 from stripping and being damaged due to the stress caused by the difference of the coefficient of thermal expansion between the first interlayer insulating film 4201 or the second interlayer insulating film 4202 and a conductive material and the like for constituting the wiring to be formed afterward.

Next, contact holes are formed through the first interlayer insulating film 4201 and the second interlayer insulating film 4202, and wirings 4300 to 4304 to connect with the TFTs 4011 to 4013 are formed. In this embodiment, the electrode and wirings are integrally formed, however the electrode and the wirings may be formed separately, and then electrically connected. Although a mixed gas of $CHF_3$ and He is used as the etching gas for forming the contact holes, the present invention is not limited to this. In this embodiment, the wirings 4300 to 4304 are formed by applying five-layered structure by laminating Ti, TiN, Al—Si, Ti, and TiN with a sputtering method and patterning is performed thereto.

By mixing Si into Al, it is possible to prevent occurrence of a hillock in resist-baking when patterning the wirings. Cu may be mixed by approximately 0.5% instead of Si. When an Al—Si layer is sandwiched by Ti or TiN, the resistance against the hillock is improved further. It is desirable to use the hard mask formed of SiON or the like when patterning. The material and the manufacturing process of the wirings are not limited to the above, and the above-mentioned material used as the gate electrode may be used.

The wirings 4300 to 4304 may be formed of an aluminum alloy film including at least one kind of element selected from nickel, cobalt and iron, and carbon. An aluminum alloy film like this can prevent counter diffusion of silicon and aluminum in the case of being in contact with silicon. Oxidation-reduction reaction is not generated even when the aluminum alloy film like this is in contact with a transparent conductive film, for example, ITO (Indium Tin Oxide), therefore, the aluminum alloy film can have contact with the transparent conductive film directly. The aluminum alloy film like this has low specific resistance and superior heat resistance, thereby being useful for a material of a wiring.

Note that each of the wirings 4300 and 4301 are connected to a source or a drain region 4110 of the n-channel TFT 4011, the wirings 4301 and 4302 are connected to a source or a drain region 4113 of the n-channel TFT 4012, and the wirings 4303 and 4304 are connected to a source region or a drain region 4115 of the n-channel TFT 4013, respectively. Furthermore, the wiring 4304 is also connected to a gate electrode 4162 of the n-channel TFT 4013. The n-channel TFT 4013 can be used as a memory element of random number ROM (FIG. 24(B)).

A third interlayer insulating film 4203 is formed over the second interlayer insulating film 4202 so as to cover the wirings 4300 to 4304. The third interlayer insulating film 4203 is formed so as to have an opening portion at a position where one part of the wiring 4300 is exposed. Note that the third interlayer insulating film 4203 can be formed of the same material as the first interlayer insulating film 4201.

Figure 25A:
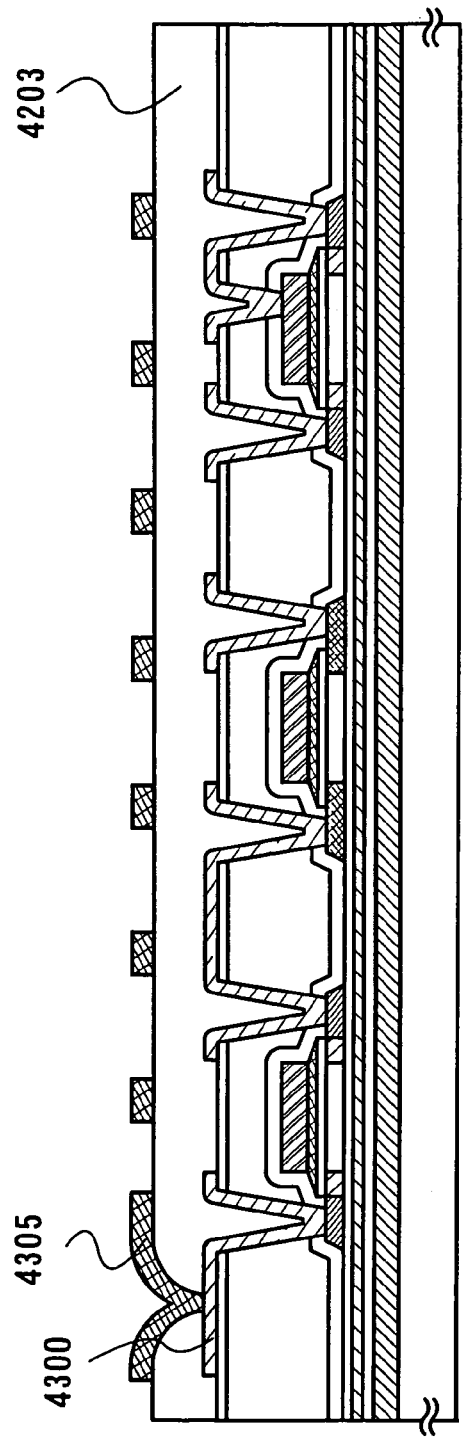
[FIG. 25] Views showing a manufacturing process of an ID chip of the present invention.
Figure 25B:
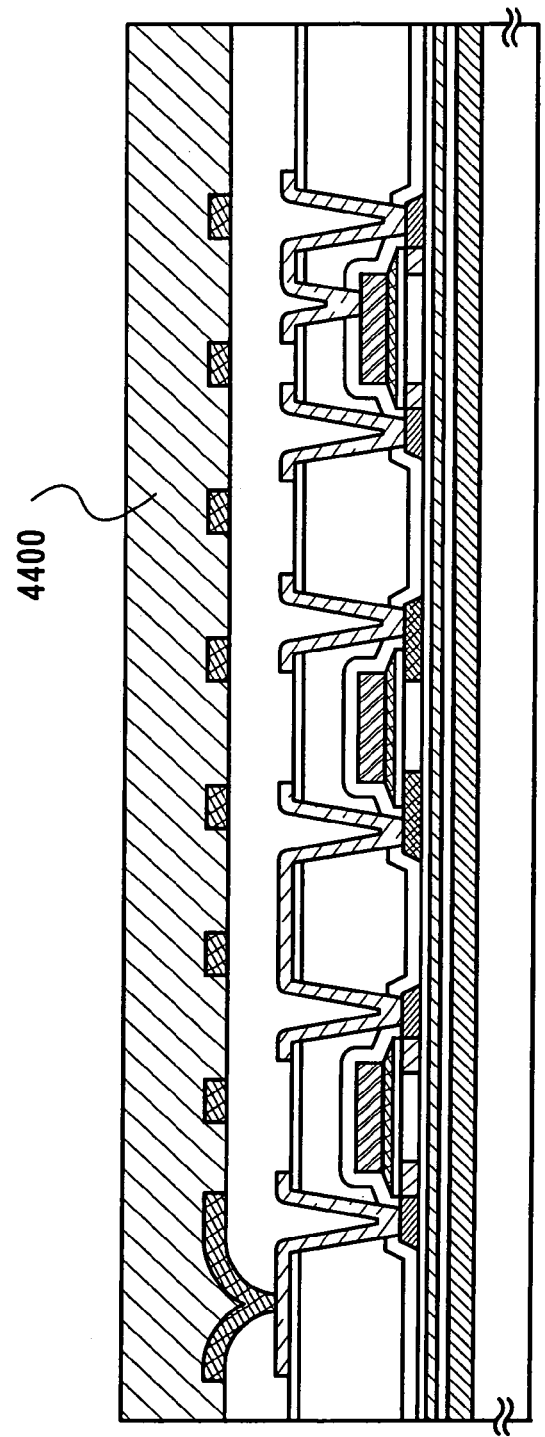

Then, an antenna 4305 is formed over the third interlayer insulating film 4203 (FIG. 25(A)). The antenna can be formed of a metal such as Ag, Au, Cu, Pd, Cr, Mo, Ti, Ta, W, Al, Fe, Co, Zn, Sn, and Ni, or a conductive material including one or a plurality of metal compound. And the antenna 4305 is connected with the wiring 4300. Note that in FIG. 25(A), the antenna 4305 and the wiring 4300 are directly connected, however the structure of the ID chip in this invention is not limited thereto. For example, a wiring formed separately may be used to connect the antenna 4305 and the wiring 4300 electrically.

The antenna 4305 can be formed by a printing method, a photolithography method, a vapor deposition method, a droplet discharge method or the like. In this embodiment, the antenna 4305 is formed with a single layer of a conductive film; however the antenna 4305 can be formed by laminating a plurality of conductive films. The antenna may be formed by coating a wiring formed of Ni or the like with Cu by using electroless plating.

The droplet discharge method is a method for forming a predetermined pattern by discharging droplets containing a predetermined composition from a minute orifice, which includes an ink-jet method. The printing method includes a screen-printing method, an offset printing method, and the like. By using the printing method or the droplet discharge method, the antenna 4305 can be formed without using a mask for exposure. Moreover, the droplet discharge method and the printing method do not waste a material as is removed by etching in the photolithography method. As an expensive mask for exposure is not required to be used, cost spent for manufacturing ID chips can be suppressed.

In the case of using the droplet discharge method or the printing method, conductive particles obtained by coating Cu with Ag and the like can be used as well, for example. In the case of forming the antenna 4305 by droplet discharge method, it is preferable to apply treatment to a surface of the third interlayer insulating film 4203 for enhancing an adhesion property of the antenna 4305.

As a method for enhancing the adhesion property, specifically, a method for attaching a metal or a metal compound which can enhance the adhesion property of a conductive film or an insulating film by a catalytic activity to a surface of the third interlayer insulating film 4203, a method for attaching an organic insulating film, a metal, and a metal compound which have a high adhesion property with a conductive film or an insulating film to be formed to the surface of the third interlayer insulating film 4203, a method for modulating a surface property by applying plasma treatment under an atmospheric pressure or a reduced pressure to the surface of the third interlayer insulating film 4203, and the like can be used. As a metal which has a high adhesion property with the conductive film or the insulating film, for example, titanium, titanium oxide, or $3d$ transition element such as Sc, Ti, V, Cr, Mn, Fe, Co, Ni, Cu, and Zn can be used. As a metal compound, oxide, nitride, oxynitride and the like of the aforementioned metal are used. As the organic insulating film, polyimide, siloxane resin and the like are used, for example.

In the case where the metal or the metal compound attaching to the third interlayer insulating film 4203 is conductive, sheet resistance thereof is controlled so that the antenna can operate normally. Specifically, an average thickness of the conductive metal or the metal compound is controlled to be 1 to 10 nm or the metal or the metal compound is partially or wholly insulated by oxidization, for example. Alternatively, the applied metal or the metal compound may be selectively removed by etching except for a region which requires a high adhesion property. The metal or the metal compound may be selectively applied only in a specific region by using the droplet discharge method, the printing method, a sol-gel process, and the like instead of applying it on a whole surface of the substrate in advance. The metal or the metal compound do not have to be in a state of a completely continuous film on the surface of the third interlayer insulating film 4203, but may be dispersed to some extent.

As shown in FIG. 25 (B), after forming the antenna 4305, a protective layer 4400 is formed on the third interlayer insulating film 4203 so as to cover the antenna 4305. The protective layer 4400 is formed by using a material which can protect the antenna 4305 when removing the peeling layer 4001 by etching. For example, the protective layer 4400 can be formed by wholly applying resin such as epoxy, acrylate, and silicon which is soluble in water or alcohols.

In this embodiment, the protective layer 4400 is formed by applying aqueous resin (TOA GOSEI CO., LTD.: VL-WSH L10) so as to have a thickness of 30 μm by a spin coating method, exposing for 2 minutes for temporary curing, and then exposing its back surface and front surface to UV light for 2.5 minutes and 10 minutes, respectively, 12.5 minutes in total to be fully cured. In the case of laminating a plurality of organic resins, there may be a case where the stacked organic resins melt depending on a solvent during application or baking, or where the adhesion property becomes too high. Therefore, in case of forming both the third interlayer insulating film 4203 and the protective layer 4400 using an organic resin which is soluble in the same solvent, it is preferable to form an inorganic insulating film (a $SiN_x$ film, a $SiN_xO_y$ film, an $AlN_x$ film, or an $AlN_xO_y$ film) so as to cover the third interlayer insulating film 4203 for smoothly removing the protective film 4400 in the subsequent process.

As shown in FIG. 26 (A), a groove 4401 is formed for separating the ID chips. The groove 4401 is required to be formed to the extent that the peeling layer 4001 is exposed. The groove 4401 can be formed by dicing, scribing and the like. In the case where the ID chips formed on the first substrate 4000 are not required to be separated, the groove 4401 is not necessarily formed.

As shown in FIG. 26 (B), the peeling layer 4001 is removed by etching. In this embodiment, halogen fluoride is used as an etching gas, which is brought in from the groove 4401. In this embodiment, the etching is performed using $ClF_3$ (chlorine trifluoride) at a temperature of 350° C. with a flow rate of 300 sccm and air pressure of 798 Pascal (798 Pa) for 3 hours. A gas obtained by mixing nitrogen in $ClF_3$ gas may be used as well. By using the halogen fluoride such as $ClF_3$, the peeling layer 4001 is selectively etched and the first substrate 4000 can be peeled off from the TFTs 4011 to 4013. Note that the halogen fluoride may be either a gas or liquid.

As shown in FIG. 27(A), the TFTs 4011 to 4013 which are peeled off and the antenna 4305 are stuck on the second substrate 4500 with an adhesive 4501. A material with which the second substrate 4500 and the base film 4002 can be stuck together is used for the adhesive 4501. For the adhesive 4501, for example, various curable adhesives such as a reactive curable adhesive, a heat curable adhesive, and a photo-curable adhesive such as an ultraviolet curable adhesive, and an anaerobic adhesive can be used.

For the second substrate 4500, a flexible organic material such as paper and plastic can be used. Alternatively, a flexible inorganic material may also be used for the second substrate 4500. ARTON (manufactured by JSR) formed of poly norbornene having a polar group can be used as the plastic substrate. Polyester represented by polyethylene terephthalate (PET), and polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, acrylonitrile butadiene styrene resin, poly vinyl chloride, polypropylene, poly vinyl acetate, acryl resin and the like can be used. It is preferable that the second substrate 4500 have a high degree of heat conductivity of about 2 to 30 W/mK for dispersing the heat generated in the integrated circuit.

In addition, as shown in FIG. 27(B), after removing the protective layer 4400, the adhesive 4503 is applied on the third interlayer insulating film 4203 so as to cover the antenna 4305, thereby a cover material 4502 is stuck thereto. The cover material 4502 can be formed by using a flexible organic material such as paper and plastic similarly to the second substrate 4500. The thickness of the adhesive 4503 is set to 1 to 200 μm, for example.

For the adhesive 4503, a material which can stick the cover material 4502, the third interlayer insulating film 4203, and the antenna 4305 are used. For the adhesive 4503, for example, various curable adhesives such as a reactive curable adhesive, a heat curable adhesive, and a photo-curable adhesive such as an ultraviolet curable adhesive, and an anaerobic adhesive can be used.

Through each of the aforementioned steps, the ID chip is completed. According to the aforementioned manufacturing method, an integrated circuit having a total thickness of 0.3 μm to 3 μm, typically about 2 μm, which is considerably thin can be formed between the second substrate 4500 and the cover material 4502. The thickness of the integrated circuit includes a thickness of each insulating film and an interlayer insulating film formed between the adhesives 4501 and 4503 as well as a thickness of the semiconductor element itself.

Further, the integrated circuit included in the ID chip can be formed so as to occupy an area of 5 mm square (25 mm²) or less, or more preferably about 0.3 to 4 mm square (0.09 mm² to 16 mm²).

By providing the integrated circuit at a position close to the center between the second substrate 4500 and the cover material 4502, mechanical strength of the ID chip can be enhanced. In specific, provided that a distance between the second substrate 4500 and the cover material 4502 is d, it is preferable to control the thickness of the adhesives 4501 and 4503 so that a distance between the second substrate 4500 and a center in a direction of the thickness of the integrated circuit satisfies the following formula 1.

$$\frac{1}{2}d - 30 \ \mu m < x < \frac{1}{2}d + 30 \ \mu m \qquad \text{[Formula 1]}$$

Alternatively, it is preferable to control the thickness of the adhesives 4501 and 4503 so that it satisfies the following formula 2.

$$\frac{1}{2}d - 10 \ \mu m < x < \frac{1}{2}d + 10 \ \mu m \qquad \text{[Formula 2]}$$

Although an example of using the cover material 4502 is illustrated in FIG. 27(B), the present invention is not limited to this constitution. For example, the processes may be finished up to that illustrated in FIG. 27(A).

Although this embodiment describes the method for separating the substrate from the integrated circuit by providing the peeling layer between the first substrate 4000 having a high heat resistance property and the integrated circuit through etching, a method for manufacturing the ID chip of the present invention is not limited to this structure. For example, a metal oxide film may be provided between the integrated circuit and the substrate having a high heat resistance property, and the metal oxide film may be weakened by crystallization so that the integrated circuit is peeled off. Alternatively, the peeling layer formed of an amorphous semiconductor film including hydrogen may be provided between the integrated circuit and the substrate having the high heat resistance property, and the substrate and the integrated circuit may be separated by removing the peeling layer by the laser irradiation. Further, alternatively, the integrated circuit may be peeled off from the substrate by mechanically removing the substrate having the high heat resistance property with the integrated circuit formed thereover or by etching by using solution or gas.

In the case of using an organic resin for the adhesive 4501 which is in contact with the base film 4002 in order to obtain the flexibility of the semiconductor device, the diffusion of an alkali metal such as Na or an alkaline-earth metal from the organic resin into the semiconductor film can be prevented by using a silicon nitride film or a silicon nitride film containing oxygen as the base film 4002.

In the case where a surface of the object is curved and thereby the second substrate 4500 of the ID chip stuck to the curved surface is curved so as to have a curved surface along a generating line of a conical surface, a columnar surface and the like, it is preferable to make a direction of the generating line and a moving direction of carriers of the TFTs 4011 to 4013 be the same. According to the aforementioned structure, it can be suppressed that the properties of the TFTs 4011 to 4013 are affected when the second substrate 4500 is curved.

Moreover, by setting a ratio of an area which is occupied by an island-shaped semiconductor film in the integrated circuit to be 1 to 30%, it can further be suppressed that the properties of the TFTs 4011 to 4013 are affected when the second substrate 4500 is curved.

Although this embodiment describes an example for forming the antenna over the same substrate as the integrated circuit, the present invention is not limited to this structure. The antenna and the integrated circuit which are formed over different substrates may be stuck together afterward so that they are connected electrically.

The frequency of the radio waves usually applied in the ID chip is 13.56 MHz or 2.45 GHz, and it is very important to form the ID chip so that the electric wave with these frequencies can be detected in order to enhance the versatility.

As compared with an ID chip formed using a semiconductor substrate, the radio waves are hardly blocked in the ID chip of the embodiment so that the ID chip of the embodiment has an advantage of preventing attenuation of signals due to block of the radio waves. Since the semiconductor substrate is not used, manufacturing cost of the ID chip can be drastically reduced. For instance, the case of using a silicon substrate with 12 inches in diameter and the case of using a glass substrate with a dimension of 730×920 mm$^2$ will be compared as follows. The dimension of the silicon substrate is about 73,000 mm$^2$ while the dimension of the glass substrate is about 672,000 mm$^2$, and therefore, the dimension of the glass substrate is about 9.2 times as large as that of the silicon substrate. In the glass substrate with the dimension of about 672,000 mm$^2$, approximately 672,000 of ID chips with 1 mm square are produced regardless of the areas where are consumed by dividing the substrate. The production number is about 9.2 times as large as that of the silicon substrate. Since the case of using the glass substrate with 730×920 mm$^2$ requires less number of steps as compared with the case of using the silicon substrate with 12 inches in diameter, investment cost in facilities for mass production of the ID chip can be reduced to one third. According to the invention, the glass substrate can be reused after separating the integrated circuit therefrom. The cost can be reduced significantly as compared with the case of using the silicon substrate even if cost for repairing a cracked glass substrate or cleaning the surface of a glass substrate is taken into consideration. If the glass substrate is not reused and is discarded, since the price of the glass substrate with 730×920 mm$^2$ is about half of the price of the silicon substrate with 12 inches in diameter, the cost of manufacturing ID chips can be drastically reduced.

As a consequence, in the case of using the glass substrate with 730×920 mm$^2$, it is appreciated that the price of an ID chip can be suppressed to about thirtieth as compared with the case using the silicon substrate with 12 inches. The use of the ID chip as premises for a disposable one has been expected, and hence, the ID chip according to the invention that can be formed by reducing manufacturing cost drastically is very useful for the above purpose.

Although this embodiment describes an example in which the peeled-off integrated circuit is attached to the flexible substrate, the present invention is not limited to this constitution. For example, in the case of using a substrate having heat resistant temperature which can withstand heat treatment in a process of manufacturing an integrated circuit like a glass substrate, the integrated circuit is not required to be peeled off.

Moreover, this embodiment can be freely combined with any description of embodiment mode and Embodiments 1 to 5, if necessary.

Embodiment 7

Examples of the electric apparatus to which the present invention can be applied include a video camera or a digital camera, a goggle type display, a navigation system, an audio reproducing device (e.g., a car audio component system), a computer, a game machine, a portable information terminal (e.g., a mobile computer, a cellular phone, a portable game machine, an electronic book, and the like), and an image reproducing device provided with a recording medium (specifically, a device which is capable of reproducing a recording medium such as a Digital Versatile Disc (DVD) and provided with a display of displaying the reproduced image). FIGS. 28(A) to 28(D) and 29(A) to 29(D) illustrate specific examples thereof.

FIG. 28(A) illustrates a light-emitting display device such as a TV receiver, which includes a casing 5001, a display portion 5003, a speaker portion 5004, and the like. The present invention can be applied to the display portion 5003, a control circuit portion, and the like. A polarizing plate or a circularly polarizing plate may be provided in the pixel portion in order to enhance the contrast. For example, a ¼ λ plate, a ½ λ plate, and a polarizing plate may be sequentially provided in the sealing substrate. Further, an anti-reflective film may be provided over the polarizing plate. According to the present invention, high costs and yield down can be suppressed. In addition, a distribution channel, and the like can be clarified when an ID chip manufactured in Embodiment 6 is attached to the light-emitting display device.

FIG. 28(B) illustrates a liquid crystal display or an OLED display, which includes a casing 5101, a support 5102, a display portion 5103, and the like. The present invention can be applied to the display portion 5103, a control circuit portion, and the like. According to the present invention, high costs and yield down can be suppressed. In addition, a distribution channel, and the like can be clarified when an ID chip manufactured in Embodiment 6 is attached to the light-emitting display device.

FIG. 28(C) illustrates a cellular phone, which includes a main body 5201, a casing 5202, a display portion 5203, an audio input portion 5204, an audio output portion 5205, an operation key 5206, an antenna 5208, and the like. The present invention can be applied to the display portion 5203, a control circuit portion, and the like. According to the present invention, high costs and yield down can be suppressed. In addition, a distribution channel, and the like can be clarified when an ID chip manufactured in Embodiment 6 is attached to the light-emitting display device.

FIG. 28(D) illustrates a laptop computer, which includes a main body 5301, a casing 5302, a display portion 5303, a keyboard 5304, an external connection port 5305, a pointing mouse 5306, and the like. The present invention can be applied to the display portion 5303, a control circuit portion, and the like. According to the present invention, high costs and yield down can be suppressed. In addition, a distribution channel, and the like can be clarified when an ID chip manufactured in Embodiment 6 is attached to the light-emitting display device.

FIG. 29 (A) illustrates a mobile computer, which includes a main body 6001, a display portion 6002, a switch 6003, operation keys 6004, an infrared port 6005, and the like. The present invention can be applied to the display portion 6002, a control circuit portion, and the like. According to the present invention, high costs and yield down can be suppressed. In addition, a distribution channel, and the like can be clarified when an ID chip manufactured in Embodiment 6 is attached to the light-emitting display device.

FIG. 29(B) illustrates a portable game machine, which includes a casing 6101, a display portion 6102, speaker portions 6103, operation keys 6104, a recording medium insert portion 6105, and the like. The present invention can be applied to the display portion 6102, a control circuit portion, and the like. According to the present invention, high costs and yield down can be suppressed. In addition, a distribution channel, and the like can be clarified when an ID chip manufactured in Embodiment 6 is attached to the light-emitting display device.

FIG. 29(C) illustrates a portable image reproducing device equipped with a recording medium (specifically, a DVD reproducing device), which includes a main body 6201, a casing 6202, a display portion A 6203, a display portion B 6204, a recording medium (such as a DVD) reading portion 6205, operation keys 6206, speaker portions 6207, and the like. The display portion A 6203 mainly displays image information, and the display portion B 6204 mainly displays textual information. The present invention can be applied to the display portion A 6203, the display portion B 6204, a control circuit portion, and the like. Further, the image reproducing device equipped with a recording medium includes a home video game machine and the like. According to the present invention, high costs and yield down can be suppressed. In addition, a distribution channel, and the like can be clarified when an ID chip manufactured in Embodiment 6 is attached to the light-emitting display device.

FIG. 29(D) illustrates a wireless TV having a portable display. A casing 6302 has a built-in battery and a built-in signal receiver, and a display portion 6303 or a speaker portion 6307 is driven by the battery. The buttery can be charged repeatedly by a battery charger 6300. The battery charger 6300 can transmit and receive an image signal, and transmit the image signal to the signal receiver of the display. The casing 6302 is controlled by operation keys 6306. The device illustrated in FIG. 29(D) can be also referred to as a video-audio bidirectional communication device, since a signal can be transmitted to the battery charger 6300 from the casing 6302 by operating the operation keys 6306. Further, the device can be also referred to as an all-purpose remote-control device, since a signal can be transmitted to the battery charge 6300 from the casing 6302 by operating the operation keys 6306, and communication control for other electric apparatus is possible by making a signal which can be transmitted by the battery charge 6300 received by other electric apparatus. The present invention can be applied to the display portion 6303, a control circuit portion, and the like. According to the present invention, high costs and yield down can be suppressed. In addition, a distribution channel, and the like can be clarified when an ID chip manufactured in Embodiment 6 is attached to the light-emitting display device.

A plastic substrate having a heat resistance property in addition to a glass substrate can be used for a display device used for these electric apparatus depending on its size, intensity, or intended use. Accordingly, weight reduction can be further achieved.

Further, an example described in this embodiment is just one example, and the invention is not limited to these uses.

This embodiment can be freely combined with any description of embodiment Mode and Embodiments 1 to 6.

According to the present invention, a gas at high temperature is blown locally so as to overlap at a laser spot on a semiconductor film. Accordingly, an energy density required in laser crystallization can be decreased, and a length of a beam spot of a linear beam can be extended. Therefore, time of a manufacturing process can be shortened and high costs and yield down can be suppressed.

The invention claimed is:

1. A laser processing unit comprising:
    a laser oscillator for radiating a laser light;
    a lens for processing the radiated laser light into linear laser light; and
    a nozzle type heater for heating and blowing a gas,
    wherein the nozzle type heater blows the heated gas to a surface irradiated by the linear laser light.

2. A laser processing method, using a laser processing unit including a laser oscillator, a lens, and a nozzle type heater, comprising the steps of:
    radiating a laser light from the laser oscillator;
    processing the radiated laser light into linear laser light by the lens;
    heating a gas using the nozzle type heater; and
    blowing the heated gas from the nozzle type heater to a surface irradiated by the linear laser light.

3. A laser processing method according to claim 2, wherein the laser light is a continuous wave laser light.

4. A laser processing method according to claim 2, wherein the laser light is a pulsed oscillation laser light having a repetition frequency of 10 MHz or more.

5. A laser processing method according to claim 2, wherein the laser light is pulsed oscillation laser light having a repetition frequency of 80 MHz or more.

6. A laser processing method according to claim 2, wherein the heated gas is heated to a temperature in a range from 300° C. to 1500° C.

7. A laser processing method according to claim 2, wherein the gas is an inert gas such as nitrogen or argon, or air.

8. A laser processing method according to claim 2, wherein the gas includes oxygen.

9. A method for manufacturing a semiconductor device comprising the steps of:
    forming a semiconductor film over a substrate; and
    blowing a heated gas from a nozzle type heater to the semiconductor film while irradiating the semiconductor film with a linear laser light,
    wherein the linear laser light is obtained by radiating a laser light from a laser oscillator and processing the radiated laser light into the linear laser light using a lens,
    wherein the heated gas is obtained by heating a gas using the nozzle type heater, and
    wherein the semiconductor device is formed by using the semiconductor film to which the heated gas is blown while irradiating with the linear laser light.

10. A method for manufacturing a semiconductor device according to claim 9, wherein the laser light is a continuous wave laser light.

11. A method for manufacturing a semiconductor device according to claim 9, wherein the laser light is pulsed oscillation laser light having a repetition frequency of 10 MHz or more.

12. A method for manufacturing a semiconductor device according to claim 9, wherein the laser light is pulsed oscillation laser light having a repetition frequency of 80 MHz or more.

13. A method for manufacturing a semiconductor device according to claim 9, wherein the heated gas is heated to a temperature in a range from 300° C. to 1500° C.

14. A method for manufacturing a semiconductor device according to claim 9, wherein the gas is an inert gas such as nitrogen or argon, or air.

15. A method for manufacturing a semiconductor device according to claim 9, wherein the gas includes oxygen.

* * * * *

UNITED STATES PATENT AND TRADEMARK OFFICE
CERTIFICATE OF CORRECTION

PATENT NO.        : 7,459,406 B2
APPLICATION NO.   : 11/212927
DATED             : December 2, 2008
INVENTOR(S)       : Koichiro Tanaka and Yoshiaki Yamamoto It is certified that error appears in the above-identified patent and that said Letters Patent is hereby corrected as shown below:

On the Cover Page, item [30] in the Foreign Application Priority Data, delete "Sep. 10, 2004" and replace with -- Sep. 1, 2004 --.

Signed and Sealed this

Fourteenth Day of April, 2009

JOHN DOLL
*Acting Director of the United States Patent and Trademark Office*